(12) United States Patent
Sung et al.

(10) Patent No.: US 11,980,050 B2
(45) Date of Patent: May 7, 2024

(54) DISPLAY DEVICE

(71) Applicant: SAMSUNG DISPLAY CO., LTD., Yongin-si (KR)

(72) Inventors: Wooyong Sung, Yongin-si (KR); Wonwoo Choi, Yongin-si (KR); Sooyoun Kim, Yongin-si (KR); Junghan Seo, Yongin-si (KR); Seoyeon Lee, Yongin-si (KR); Hyoungsub Lee, Yongin-si (KR); Moonwon Chang, Yongin-si (KR); Seunggun Chae, Yongin-si (KR); Seungyong Song, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/935,570

(22) Filed: Sep. 26, 2022

(65) Prior Publication Data
US 2023/0014088 A1    Jan. 19, 2023

Related U.S. Application Data

(63) Continuation of application No. 17/130,762, filed on Dec. 22, 2020, now Pat. No. 11,456,440, which is a
(Continued)

(30) Foreign Application Priority Data

Aug. 30, 2018   (KR) .......................... 10-2018-0102722
Sep. 19, 2018   (KR) .......................... 10-2018-0112383

(51) Int. Cl.
*H10K 50/844*   (2023.01)
*G06F 3/041*    (2006.01)
(Continued)

(52) U.S. Cl.
CPC ......... *H10K 50/844* (2023.02); *G06F 3/0412* (2013.01); *G06F 3/0443* (2019.05);
(Continued)

(58) Field of Classification Search
CPC .... H10K 50/844; H10K 50/84; H10K 59/122; H10K 59/124; H10K 77/111;
(Continued)

(56) References Cited

U.S. PATENT DOCUMENTS 8,164,252 B2    4/2012   Lee et al.
9,449,553 B2    9/2016   Kwak et al.
(Continued)

FOREIGN PATENT DOCUMENTS

CN    107085475 A    8/2017
CN    107275363 A    10/2017
(Continued)

*Primary Examiner* — Kenneth B Lee, Jr.
(74) *Attorney, Agent, or Firm* — F. CHAU & ASSOCIATES, LLC

(57) ABSTRACT

A display device includes: a substrate that includes an opening and a display area that surrounds the opening; a plurality of grooves formed in the substrate between the opening and the display area; a display element layer on the substrate and that includes a plurality of display elements in the display area; a thin-film encapsulation layer disposed on the display element layer, the thin-film encapsulation layer including a first inorganic encapsulation layer, an organic encapsulation layer, and a second inorganic encapsulation layer which are sequentially stacked; a planarization layer disposed over the plurality of grooves and that includes an organic insulating material, wherein the planarization layer is disposed over the second inorganic encapsulation layer, and the organic encapsulation layer is disposed below the second inorganic encapsulation layer.

25 Claims, 50 Drawing Sheets

US 11,980,050 B2
Page 2

Related U.S. Application Data continuation of application No. 16/717,723, filed on Dec. 17, 2019, now Pat. No. 10,873,053, which is a continuation of application No. 16/458,319, filed on Jul. 1, 2019, now Pat. No. 10,541,380.

(51) Int. Cl.
| | |
|---|---|
| *G06F 3/044* | (2006.01) |
| *H01L 21/762* | (2006.01) |
| *H10K 59/122* | (2023.01) |
| *H10K 59/124* | (2023.01) |
| *H10K 59/40* | (2023.01) |
| *H10K 77/10* | (2023.01) |
| *H10K 50/84* | (2023.01) |
| *H10K 102/00* | (2023.01) |

(52) U.S. Cl.
CPC ..... *H01L 21/76205* (2013.01); *H10K 59/122* (2023.02); *H10K 59/124* (2023.02); *H10K 59/40* (2023.02); *H10K 77/111* (2023.02); *H10K 50/84* (2023.02); *H10K 2102/311* (2023.02)

(58) Field of Classification Search
CPC ............. H10K 2102/311; G06F 3/0443; G06F 3/0412; H01L 21/762
See application file for complete search history.

(56) References Cited

U.S. PATENT DOCUMENTS

| | | | |
|---|---|---|---|
| 9,997,738 | B2 | 6/2018 | Choi et al. |
| 10,108,149 | B2 | 10/2018 | Kang et al. |
| 10,128,461 | B2 | 11/2018 | Kang et al. |
| 10,541,380 | B1 | 1/2020 | Sung et al. |
| 10,873,053 | B2 | 12/2020 | Sung et al. |
| 11,456,440 | B2 * | 9/2022 | Sung ...................... G06F 3/0412 |
| 2005/0037550 | A1 | 2/2005 | Kang et al. |
| 2016/0044103 | A1 | 2/2016 | Seo et al. |
| 2016/0218151 | A1 * | 7/2016 | Kwon ...................... G06F 1/16 |
| 2017/0148856 | A1 | 5/2017 | Choi et al. |
| 2017/0150618 | A1 | 5/2017 | Choi et al. |
| 2017/0162111 | A1 | 6/2017 | Kang et al. |
| 2017/0162637 | A1 | 6/2017 | Choi et al. |
| 2017/0237037 | A1 | 8/2017 | Choi et al. |
| 2017/0288004 | A1 | 10/2017 | Kim et al. |
| 2018/0033830 | A1 | 2/2018 | Kim et al. |
| 2018/0138450 | A1 | 5/2018 | Park et al. |
| 2018/0151834 | A1 | 5/2018 | Kanaya |
| 2018/0183015 | A1 | 6/2018 | Yun et al. |
| 2019/0245159 | A1 | 8/2019 | Kim et al. |
| 2021/0111374 | A1 | 4/2021 | Sung et al. |

FOREIGN PATENT DOCUMENTS

| | | |
|---|---|---|
| CN | 108074959 A | 5/2018 |
| EP | 3454389 | 3/2019 |
| EP | 3565004 | 11/2019 |
| EP | 3588571 | 1/2020 |
| JP | 4678319 | 2/2011 |
| JP | 2013-134813 | 7/2013 |
| KR | 2003-0031398 | 4/2003 |
| KR | 10-0761077 | 9/2007 |
| KR | 10-2010-0007266 | 1/2010 |
| KR | 10-2016-0016360 | 2/2016 |
| KR | 10-2016-0076688 | 7/2016 |
| KR | 10-2016-0147116 | 12/2016 |
| KR | 10-2017-0019553 | 2/2017 |
| KR | 10-2017-0059527 | 5/2017 |
| KR | 10-2017-0059537 | 5/2017 |
| KR | 10-2017-0059864 | 5/2017 |
| KR | 10-2017-0065059 | 6/2017 |
| KR | 10-2017-0066767 | 6/2017 |
| KR | 10-2017-0095444 | 8/2017 |
| KR | 10-2017-0115177 | 10/2017 |
| KR | 10-2018-0013369 | 2/2018 |
| KR | 10-2018-0014398 | 2/2018 |
| KR | 10-2018-0047607 | 5/2018 |

* cited by examiner

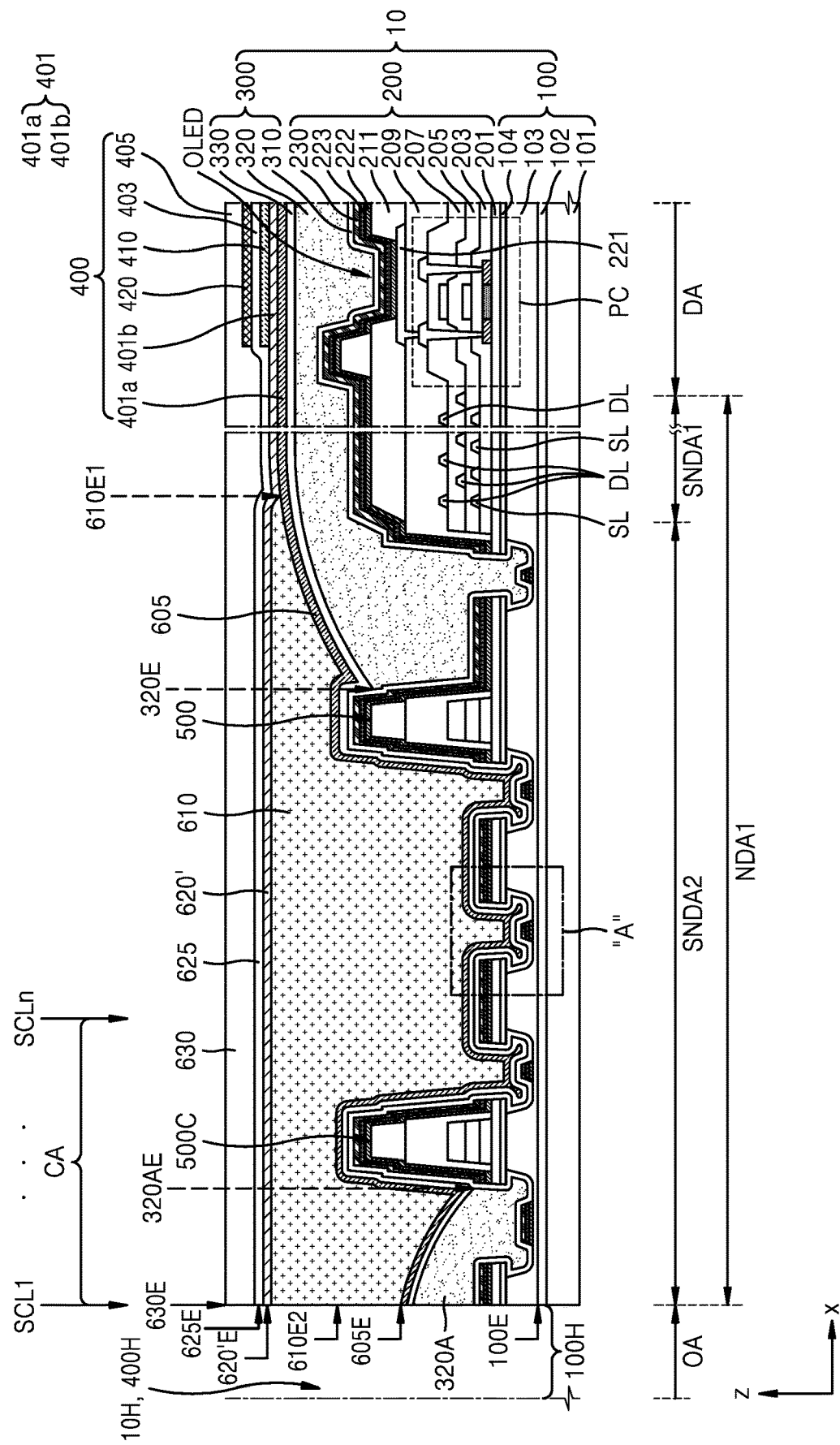

DISPLAY DEVICE

CROSS-REFERENCE TO RELATED APPLICATIONS

This application is a continuation of U.S. application Ser. No. 17/130,762, filed on Dec. 22, 2020 in the U.S. Patent and Trademark Office, which is a continuation of U.S. application Ser. No. 16/717,723, filed on Dec. 17, 2019 in the U.S. Patent and Trademark Office, which is a continuation of U.S. application Ser. No. 16/458,319, filed on Jul. 1, 2019 in the U.S. Patent and Trademark Office, which claims priority under 35 U.S.C. § 119 from, and the benefit of, Korean Patent Application No. 10-2018-0102722, filed on Aug. 30, 2018 in the Korean Intellectual Property Office, and Korean Patent Application No. 10-2018-0112383 filed on Sep. 19, 2018 in the Korean Intellectual Property Office, the contents of all of which are herein incorporated by reference in their entireties.

BACKGROUND

1. Technical Field

One or more embodiments are directed to a display device that includes grooves.

2. Discussion of the Related Art

Recently, the purposes of display devices have diversified. In addition, as display devices have become thinner and more lightweight, their range of use has gradually been extended.

As an area occupied by a display area of a display device increases, functions are being added that can be combined or associated with the display device. As a way of adding various functions while increasing the display area, an opening is provided in the display area of a display device.

SUMMARY

According to one or more embodiments, a display device includes: a substrate that includes an opening and a display area that surrounds the opening; a plurality of grooves formed on the substrate between the opening and the display area; a display element layer on the substrate and that includes plurality of display elements in the display area; a thin-film encapsulation layer disposed on the display element layer, the thin-film encapsulation layer including a first inorganic encapsulation layer, an organic encapsulation layer, and a second inorganic encapsulation layer which are sequentially stacked; a planarization layer disposed over the plurality of grooves and that includes an organic insulating material, wherein the planarization layer is disposed over the second inorganic encapsulation layer, and the organic encapsulation layer is disposed below the second inorganic encapsulation layer.

The display element layer may include at least one organic material layer, and the at least one organic material layer may be disconnected by the groove.

The at least one organic material layer may include at least one of a hole transport layer, a hole injection layer, an electron injection layer, or an electron transport layer.

The display element layer may include pixel electrodes that respectively correspond to the plurality of display elements, emission layers disposed on the pixel electrodes, and an opposite electrode that covers the display area, the opposite electrode being disconnected by the groove.

The substrate may include a base layer and an inorganic insulating layer, the base layer may include a polymer resin, and each of the plurality of grooves may include: a hole formed in the inorganic insulating layer; and a hole and a recess each formed in the base layer.

The display device may further include: a first barrier layer disposed under the planarization layer; and a second barrier layer disposed on the planarization layer.

The planarization layer may be disposed between the opening and the display area, and the first barrier layer and the second barrier layer may make contact with each other around a first edge of the planarization layer, the first edge of the planarization layer being adjacent to the display area.

The first barrier layer may be in direct contact with the second inorganic encapsulation layer.

The first edge of the planarization layer may be located on the same vertical line as an edge of the substrate, wherein the first edge of the planarization layer faces the opening, and the edge of the substrate bounds the opening.

The display device may further include: an input sensing layer that includes a conductive layer and insulating layers respectively disposed on and under the conductive layer, wherein the first barrier layer and the second barrier layer may be respectively integrally formed with one of the insulating layers of the input sensing layer.

According to one or more embodiments, a display device includes: a substrate that includes an opening and a display area adjacent to the opening, the substrate including a plurality of grooves formed between the opening and the display area; a display element layer disposed on the substrate and that includes a plurality of display elements in the display area, the display element layer including at least one organic material layer, wherein the at least one organic material layer is disconnected by the plurality of grooves; a thin-film encapsulation layer disposed on the display element layer, the thin-film encapsulation layer including at least one inorganic encapsulation layer and an organic encapsulation layer; and a planarization layer that includes an organic insulating material, wherein the planarization layer is disposed between the opening and the display area.

The substrate may include: a first base layer that includes a polymer resin; a first inorganic insulating layer disposed on the first base layer; a second base layer disposed on the first inorganic insulating layer and that includes a polymer resin; and a second inorganic insulating layer disposed on the second base layer, wherein each of the plurality of grooves may include a first hole formed in the second inorganic insulating layer and a second hole or a recess each formed in the second base layer.

A lateral surface of the second inorganic insulating layer may include a tip that protrudes further toward a center of the groove than a lateral surface of the second base layer, wherein the lateral surface of the second inorganic insulating layer bounds the first hole, and the lateral surface of the second base layer bounds the second hole or the recess.

At least one inorganic encapsulation layer may include a first inorganic encapsulation layer disposed between the organic encapsulation layer and the planarization layer.

A portion of the planarization layer may overlap a portion of the organic encapsulation layer.

The at least one inorganic encapsulation layer may further include a second inorganic encapsulation layer disposed between the display element layer and the organic encapsulation layer, where the second inorganic encapsulation layer continuously covers an inner surface of the groove.

The display device may further include a first inorganic barrier layer disposed on the planarization layer.

The display device may further include a second inorganic barrier layer disposed under the planarization layer, wherein the second inorganic barrier layer may make contact with the first inorganic barrier layer around a first edge of the planarization layer, the first edge being adjacent to the display area.

The display device may further include an input sensing layer that includes a conductive layer and insulating layers respectively disposed on and under the conductive layer, wherein each of the first inorganic barrier layer and the second inorganic barrier layer is integrally formed with one of the insulating layers of the input sensing layer.

According to one or more embodiments, a display device includes: a substrate that includes an opening and a display area in which a plurality of pixels are disposed, the opening being formed between the plurality of pixels; a display element layer that includes a plurality of display elements that respectively correspond to the plurality of pixels, the display element layer including at least one organic material layer; a thin-film encapsulation layer disposed on the display element layer; and a plurality of grooves formed in the substrate between the opening and the display area and that disconnect the at least one organic material layer.

The plurality of grooves may be formed in a polymer resin layer and an inorganic insulating layer, and each of the plurality of grooves may include: a first hole formed in the inorganic insulating layer; and a second hole or a recess, each formed in the polymer resin layer.

The substrate may have a multi-layered structure that includes the polymer resin layer and the inorganic insulating layer.

A lateral surface of the inorganic insulating layer may include a tip that protrudes further toward a center of the groove than a lateral surface of the polymer resin layer, wherein the lateral surface of the inorganic insulating layer bounds the first hole, and the lateral surface of the polymer resin layer bounds the second hole or the recess.

The display device may further include a planarization layer disposed between the opening and the display area.

The planarization layer may include an organic insulating material, and the thin-film encapsulation layer may include: an organic encapsulation layer; and a first inorganic encapsulation layer disposed between the organic encapsulation layer and the planarization layer.

The thin-film encapsulation layer may further include a second inorganic encapsulation layer, and the first inorganic encapsulation layer and the second inorganic encapsulation layer may make contact with each other between the opening and the display area, and a contact area of the first inorganic encapsulation layer and the second inorganic encapsulation layer may overlap the planarization layer.

The display device may further include: a first inorganic barrier layer disposed under the planarization layer; and a second inorganic barrier layer disposed on the planarization layer.

The first inorganic barrier layer and the second inorganic barrier layer may make contact with each other around a first edge of the planarization layer, the first edge of the planarization layer being adjacent to the display area.

The display device may further include: an input sensing layer that includes a conductive layer and insulating layers respectively disposed on and under the conductive layer, wherein each of the first inorganic barrier layer and the second inorganic barrier layer may be integrally formed with one of the insulating layers of the input sensing layer.

The planarization layer may be disposed between the opening and the display area.

BRIEF DESCRIPTION OF THE DRAWINGS

FIG. 49A is a cross-sectional view of a display panel according to an embodiment.

DETAILED DESCRIPTION

Figure 1:
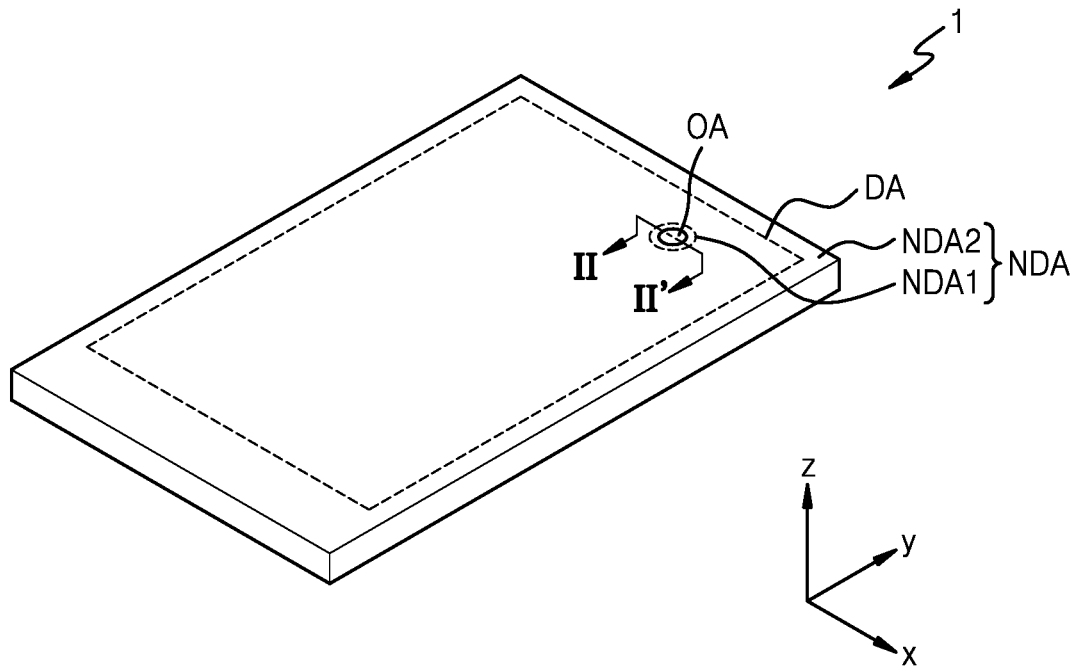
FIG. 1 is a perspective view of a display device according to an embodiment.

As the disclosure allows for various changes and numerous embodiments, exemplary embodiments will be illustrated in the drawings and described in detail in the written description. This disclosure may, however, be embodied in many different forms and should not be construed as limited to the exemplary embodiments set forth herein.

Hereinafter, the disclosure will be described more fully with reference to the accompanying drawings, in which exemplary embodiments of the disclosure are shown. When description is made with reference to the drawings, like reference numerals in the drawings may denote like or corresponding elements, and repeated description thereof will be omitted.

It will be understood that when a layer, region, or component is referred to as being "formed on" another layer, region, or component, it can be directly or indirectly formed on the other layer, region, or component.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween.

Throughout the disclosure, the expression "at least one of a, b or c" indicates only a, only b, only c, both a and b, both a and c, both b and c, all of a, b, and c, or variations thereof.

FIG. 1 is a perspective view of a display device 1 according to an embodiment.

Referring to FIG. 1, according to an embodiment, the display device includes a first area OA, a second area DA, and a third area NDA. The second area DA is a display area DA that emits light and the third area NDA is a non-display area that does not emit light. Hereinafter, for convenience of description, the second area DA will be described as the display area DA, and the third area NDA will be described as the non-display area NDA. The non-display area NDA is adjacent to the display area DA. The display device 1 displays an image using light emitted from a plurality of pixels arranged in the display area DA thereof.

According to an embodiment, the first area OA of the display device 1 is at least partially surrounded by the display area DA. FIG. 1 illustrates that the first area OA is entirely surrounded by the display area DA. A non-display area NDA includes a first non-display area NDA1 that is between the first area OA and the display area DA, and a second non-display area NDA2 that surrounds the display area DA. The first non-display area NDA1 may entirely surround the first area OA, the display area DA may entirely surround the first non-display area NDA1, and the second non-display area NDA2 may entirely surround the display area DA.

Although an organic light-emitting display device is exemplarily described below as the display device 1 according to an embodiment, embodiments are not limited thereto. In other embodiments, a display device may be, for example, an inorganic light-emitting display or a quantum dot light-emitting display.

Figure 2A:
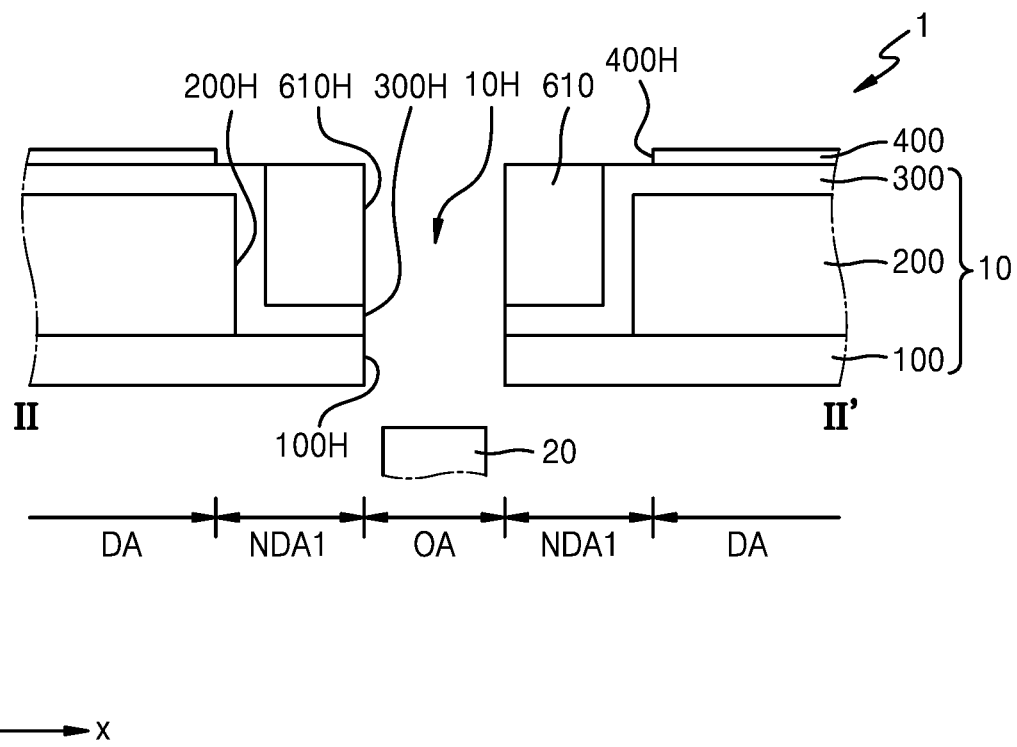
FIGS. 2A to 2C are cross-sectional views of a display device according to an embodiment.
Figure 2B:
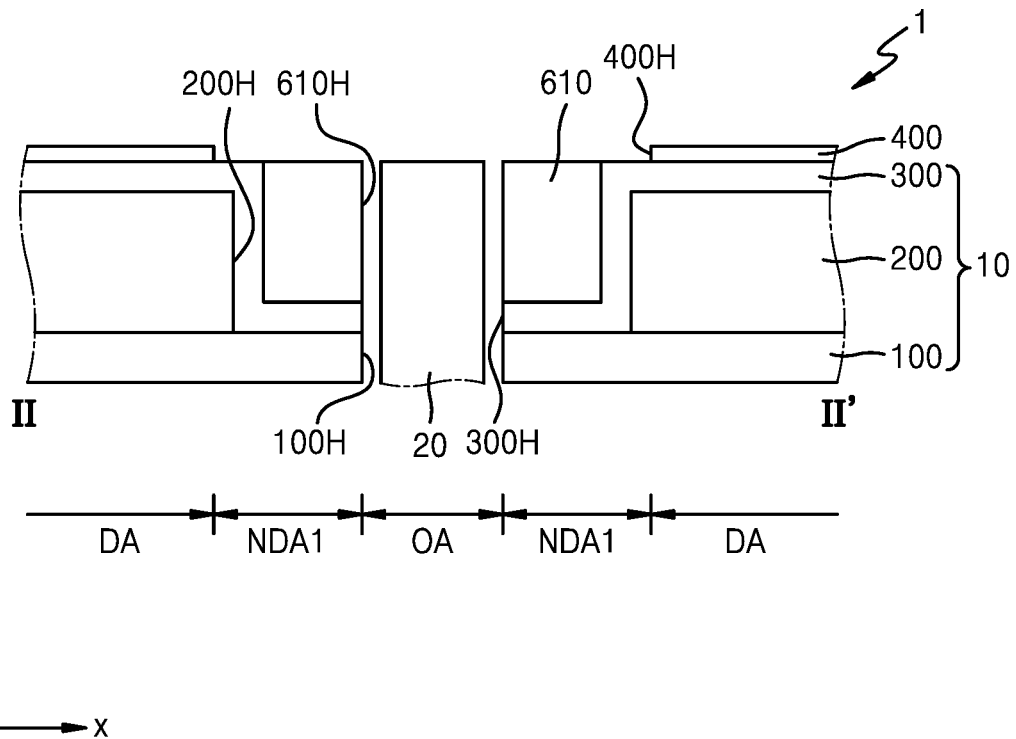
Figure 2C:
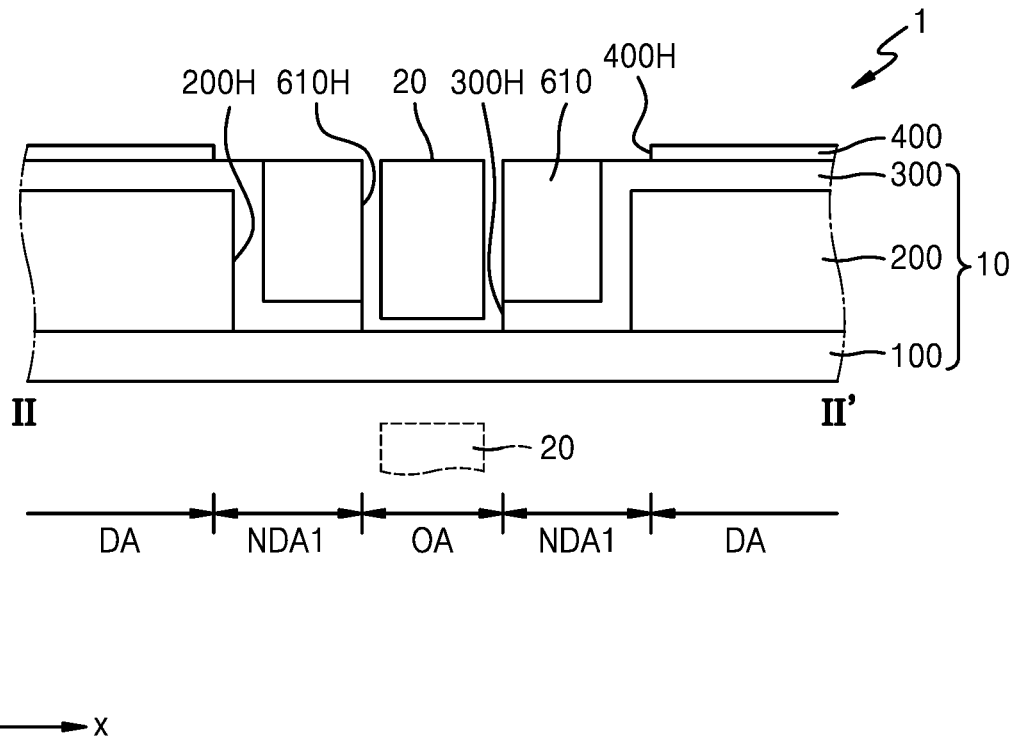

FIGS. 2A to 2C are cross-sectional views of a display device according to an embodiment and correspond to a cross-section of the display device taken along line II-II of FIG. 1.

Referring to FIG. 2A, according to an embodiment, the display device 1 include a display panel 10 and a component 20 that is located in the first area OA of the display panel 10.

According to an embodiment, the display panel 10 includes a substrate 100, a display element layer 200 that includes display elements and that is disposed on the substrate 100, a thin-film encapsulation layer 300 that covers the display element layer 200, and an input sensing layer 400 on the thin-film encapsulation layer 300 that senses a touch input. In addition, various other elements may be further disposed on the input sensing layer 400, such as a reflection prevention member that includes a polarizer, a retarder, a color filter and a black matrix, or a transparent window.

According to an embodiment, the substrate 100 includes a polymer resin. The polymer resin substrate 100 is more flexible than a glass substrate. The polymer resin may be a transparent polymer resin. In addition to the polymer resin, the substrate 100 may further include a single inorganic layer or multiple inorganic layers that include SiNx and/or SiOx as a barrier layer that prevents penetration of external foreign substances.

According to an embodiment, the display element layer 200 includes a display element disposed in the display area DA. For example, the display element includes an organic light-emitting diode. In addition, the display element layer 200 includes a thin film transistor, a storage capacitor, and wirings connected with the display element.

According to an embodiment, the thin-film encapsulation layer 300 prevents external moisture or contaminants from penetrating into the display element layer 200 by covering the display element layer 200. The thin-film encapsulation layer 300 includes at least one inorganic encapsulation layer and at least one organic encapsulation layer.

According to an embodiment, the thin-film encapsulation layer 300 covers display elements in the display area DA and extends into the non-display area NDA. In this regard, FIG. 2A illustrates that the thin-film encapsulation layer 300 extends into the first non-display area NDA1.

According to an embodiment, the input sensing layer 400 is disposed in the display area DA. The input sensing layer 400 can obtain an external input, such as coordinate information that corresponds to a touch event. The input sensing layer 400 includes sensing electrodes or touch electrodes, and trace lines connected with the sensing electrodes.

According to an embodiment, a process of forming the input sensing layer 400 may be successively performed after a process of forming a planarization layer 610 described below, or may be successively performed after a process of forming the thin-film encapsulation layer 300. Therefore, no adhesive member need be interposed between the input sensing layer 400 and the thin-film encapsulation layer 300 or between the input sensing layer 400 and the planarization layer 610.

According to an embodiment, the planarization layer 610 is disposed in the first non-display area NDA1. The planarization layer 610 includes an organic insulating material. The planarization layer 610 may include a photoresist, such as a negative or positive photoresist, or the same material as an organic encapsulation layer of the thin-film encapsulation layer 300, or the same material as one of insulating layers of the input sensing layer described below, or include various other types of organic insulating materials.

According to an embodiment, as shown in FIG. 2A, the display panel 10 includes an opening 10H that passes or penetrates from a top surface to a bottom surface of the display panel 10. The opening 10H may corresponds to the first area OA. The substrate 100, the display element layer 200, the thin-film encapsulation layer 300, the input sensing layer 400, and the planarization layer 610 respectively include first to fifth openings 100H, 200H, 300H, 400H, and 610H that correspond to the first area OA. The first opening 100H passes or penetrates from a top surface to a bottom surface of the substrate 100, the second opening 200H passes or penetrates from a lowermost layer to an uppermost layer of the display element layer 200, and the third opening 300H passes or penetrates the thin-film encapsulation layer 300. The fourth opening 400H passes or penetrates from a lowermost layer to an uppermost layer of the input sensing layer 400, and the fifth opening 610H passes or penetrates from a top surface to a bottom surface of the planarization layer 610. The first area OA may be understood as a opening area in which at least one opening, such as the first, second, third, fourth, fifth opening 100H, 200H, 300H, 400H, 610H, or the opening 10H, is located. Hereinafter, for convenience of description, the first area OA will be described as a opening area OA.

According to an embodiment, the opening area OA is a location in which a component 20 is positioned. The component 20 is positioned below the display panel 10 as shown in FIG. 2A. Alternatively, the component 20 may be disposed inside the opening 10H such that the component 20 overlaps lateral surfaces of the opening 10H of the display panel 10 as shown in FIG. 2B.

According to an embodiment, the component 20 includes an electronic element. For example, the component 20 may be an electronic element that uses light or sound. The electronic element can detect or produce light or sound. For example, an electronic element is a sensor such as an infrared sensor that generates and receives infrared light, a camera that receives light and captures an image, a sensor that outputs and senses light or sound to measure a distance or recognize a fingerprint, a small lamp that outputs light, a microphone, or a speaker that outputs sound. An electronic element that uses light can use various wavelength bands, such as visible light, infrared light, or ultraviolet light. In an embodiment, the opening area OA may be a transmission area through which light or sound, which are output from or received by the component 20, can propagate or pass.

In an embodiment, when the display panel 10 is part of a smart watch or an instrument panel for an automobile, the component 20 may be a member that includes a clock hand or an instrument needle that indicates predetermined information, such as vehicle's velocity, etc. The component 20 may be disposed at a location corresponding to the opening 10H of the display panel 10 as shown in FIG. 2A or 2B, and may include element(s) related to a function of the display panel 10 or an element such as an accessory that improves an appearance of the display panel 10.

According to an embodiment, as shown in FIGS. 2A and 2B, the substrate 100 includes the first opening 100H that corresponds to the opening area OA. In other embodiments, as shown in FIG. 2C, the substrate 100 does not include the first opening 100H. As shown by a dotted line, the component 20 may be disposed below the display panel 10, or as shown by a solid line, the component 20 may be disposed inside the opening 10H of the display panel 10. The component 20 disposed below the display panel 10 may be an electronic element that uses light. In this case, light transmittance of the opening area OA of the display panel 10 is at least about 50%, or at least about 70%, at least about 75%, at least about 80%, at least about 85%, or at least about 90%.

According to an embodiment, as described with reference to FIGS. 2A to 2C, the substrate 100 may or might not include the first opening 100H. When the substrate 100 includes the first opening 100H, the substrate 100 can be variously used without a limit with regard to the type and location of the component 20. Hereinafter, for convenience of description, although a display panel is described that includes the substrate 100 that includes the first opening 100H, features described below can be incorporated into a display panel shown in FIG. 2C.

Figure 3:
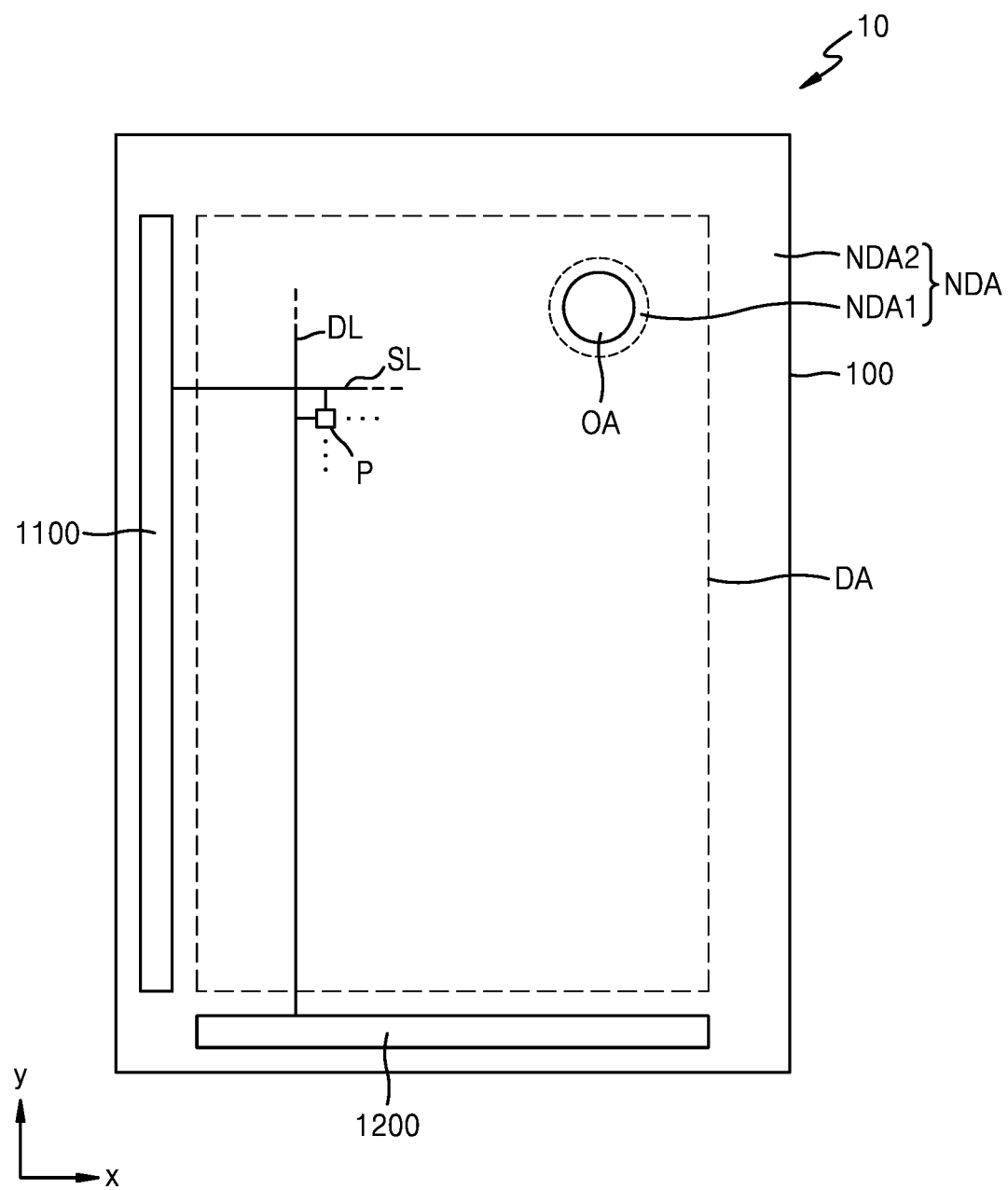
FIG. 3 is a plan view of a display panel according to an embodiment.
Figure 4:
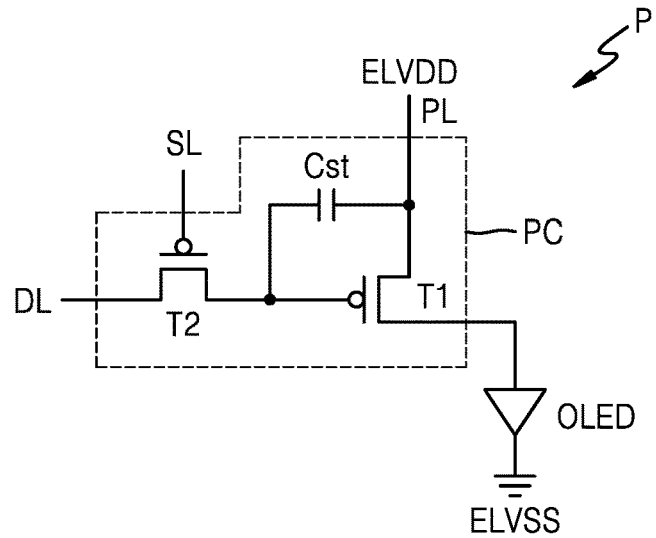
FIG. 4 is an equivalent circuit diagram of one pixel of a display panel.

FIG. 3 is a plan view of the display panel 10 according to an embodiment, and FIG. 4 is an equivalent circuit diagram of one of pixels of the display panel 10.

Referring to FIG. 3, according to an embodiment, the display panel 10 includes the display area DA, the first non-display area NDA1 and the second non-display area NDA2. FIG. 3 illustrates the substrate 100 of the display panel 10. For example, the substrate 100 includes the opening area OA, the display area DA, and the first and second non-display areas NDA1 and NDA2.

According to an embodiment, the display panel 10 includes a plurality of pixels P arranged in the display area DA. Each of the pixels P includes an organic light-emitting diodes OLED. Each pixel P can emit, for example, red, green, blue or white light through the organic light-emitting diode OLED.

Referring to FIG. 4, according to an embodiment, each pixel P includes a pixel circuit PC and an organic light-emitting diode OLED as a display element connected to the pixel circuit PC. The pixel circuit PC includes a first thin film transistor T1, a second thin film transistor T2, and a storage capacitor Cst.

According to an embodiment, the second thin film transistor T2 is a switching thin film transistor. The second thin film transistor T2 is connected to a scan line SL and a data line DL, and transmits a data voltage received from the data line DL to the first thin film transistor T1 according to a switching voltage received from the scan line SL. The storage capacitor Cst is connected to the second thin film transistor T2 and a driving voltage line PL, and stores a voltage that corresponds to a difference between a voltage received from the second thin film transistor T2 and a first power voltage ELVDD received through the driving voltage line PL.

According to an embodiment, the first thin film transistor T1 is a driving thin film transistor. The first thin film transistor T1 is connected to the driving voltage line PL and the storage capacitor Cst, and controls a driving current flowing through the organic light-emitting diode OLED from the driving voltage line PL based on a voltage stored in the storage capacitor Cst. The organic light-emitting diode OLED emits light having a predetermined brightness using the driving current. An opposite electrode, such as a cathode, of the organic light-emitting diode OLED receives a second power voltage ELVSS.

According to an embodiment, although FIG. 4 illustrates a pixel circuit PC that includes two thin film transistors and one storage capacitor, embodiments of the present disclosure are not limited thereto. The number of thin film transistors and storage capacitors may vary depending on a design of the pixel circuit PC.

Referring to FIG. 3 again, according to an embodiment, the first non-display area NDA1 surrounds the opening area OA. The first non-display area NDA1 is an area in which no display element, such as an organic light-emitting diode OLED, is disposed. Signal lines that transmit signals to the pixels P around the opening area OA may extend across the first non-display area NDA1, or groove(s) described below may be formed in the first non-display area NDA1. A scan driver 1100 that provides a scan signal to each pixel P, a data driver 1200 that provides a data signal to each pixel P, and a main power wiring (that provides first and second power voltages are disposed in the second non-display area NDA2. Alternatively, the data driver 1200 can be disposed on a flexible printed circuit board (FPCB) connected to a pad provided on one side of the display panel 10.

Figure 5:
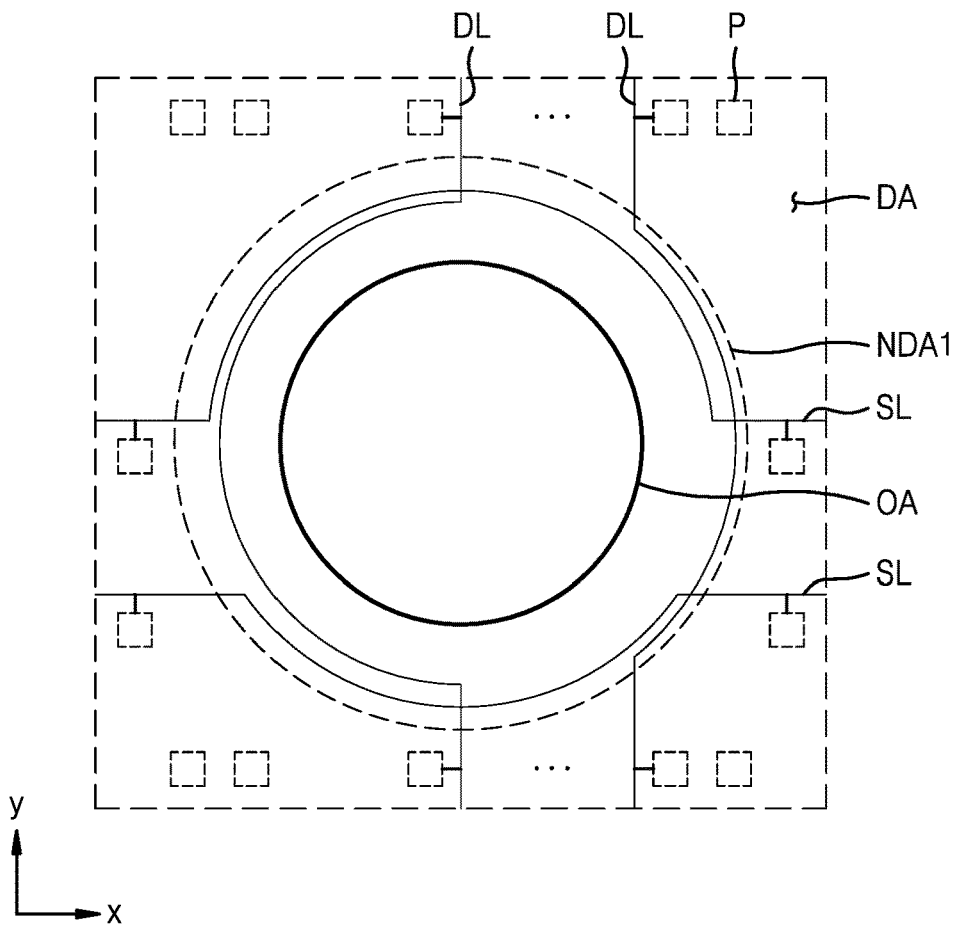
FIG. 5 is a plan view of a portion of a display panel according to an embodiment.

FIG. 5 is a plan view of a portion of a display panel according to an embodiment and shows signal lines located in the first non-display area NDA1.

Referring to FIG. 5, according to an embodiment, pixels P are disposed in the display area DA around the opening area OA. The first non-display area NDA1 is located between the opening area OA and the display area DA.

According to an embodiment, the pixels P are spaced apart from each other and with respect to the opening area OA. In a plan view, the pixels P are vertically spaced apart from each other and with respect to the opening area OA, and are horizontally spaced apart from each other and with respect to the opening area OA.

According to an embodiment, signal lines adjacent to the opening area OA that transmit signals to the pixels P detour around the opening area OA. Some of the data lines that extend across the display area DA extend in a y-direction to transmit data signals to the pixels P disposed around the opening area OA, and detour along an edge of the opening area OA in the first non-display area NDA1. Some of the scan lines SL that extend across the display area DA extend in an x-direction to transmit scan signals to the pixels P disposed around the opening area OA, and detour along an edge of the opening area OA in the first non-display area NDA1.

Figure 6:
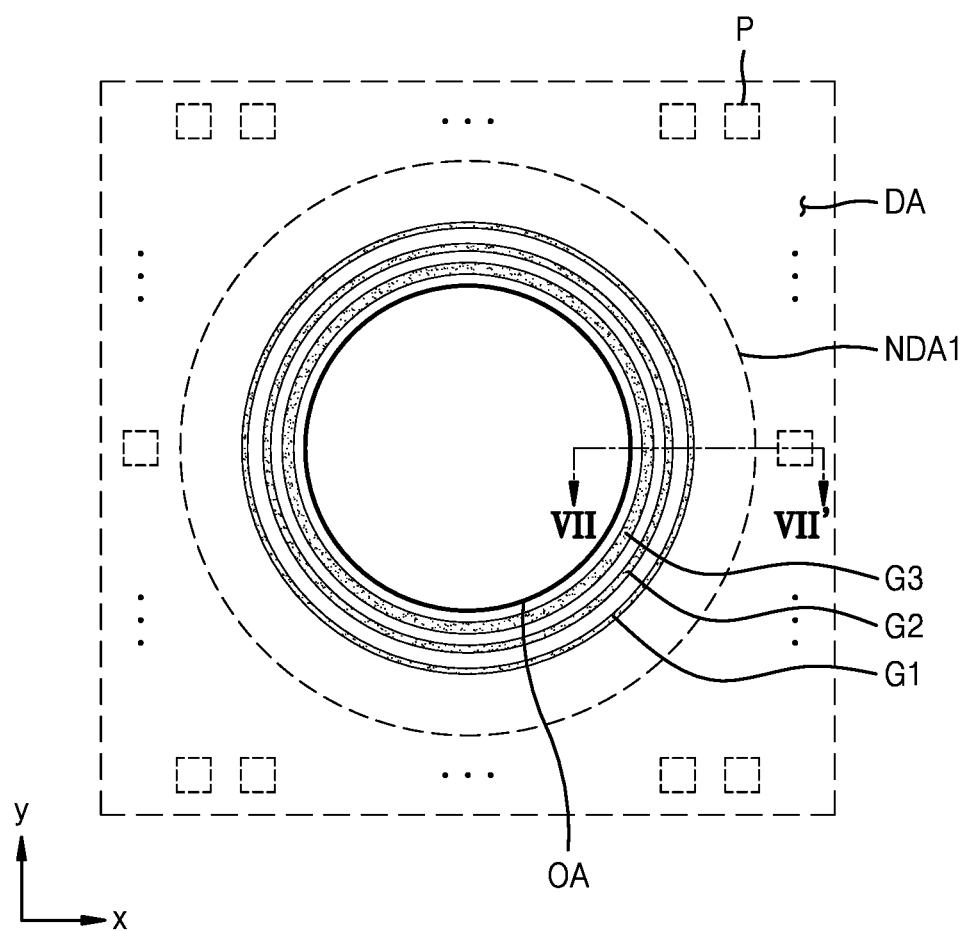
FIG. 6 is a plan view of a portion of a display panel according to an embodiment.

FIG. 6 is a plan view of a portion of a display panel according to an embodiment and shows a groove located in the first non-display area NDA1.

According to an embodiment, at least one groove is formed between the opening area OA and the display area DA. In this regard, FIG. 6 shows that first to third grooves G1, G2 and G3 are formed between the opening area OA and the display area DA. However, embodiments are not limited thereto, and in other embodiments, more than 3 grooves or fewer than 3 grooves may be formed in the first non-display area NDA1.

According to an embodiment, the first to third grooves G1, G2 and G3 are concentric circles that have a ring shape that entirely surround the opening area OA in the first non-display area NDA1. A diameter of each of the first to third grooves G1, G2 and G3 is greater than a diameter of the opening area OA, and the first to third grooves G1, G2 and G3 are spaced apart from each other by predetermined intervals.

According to an embodiment, widths of at least two of the first to third grooves G1, G2 and G3 differ from each other. In this regard, FIG. 6 shows that a width of the third groove G3 is greater than those of the first and second groove G1 and G2. However, embodiments are not limited thereto, and in other embodiment, widths of at least two of the first to third grooves G1, G2 and G3 may be the same. Widths between protruding tips of at least two of the first to third grooves G1, G2 and G3 are the same. The protruding tips of each of the first to third grooves G1, G2, and G3 will be described below.

Referring to FIGS. 5 and 6, according to an embodiment, the first to third grooves G1, G2 and G3 are closer to the opening area OA than the signal lines that detour around the opening area OA.

Figure 7:
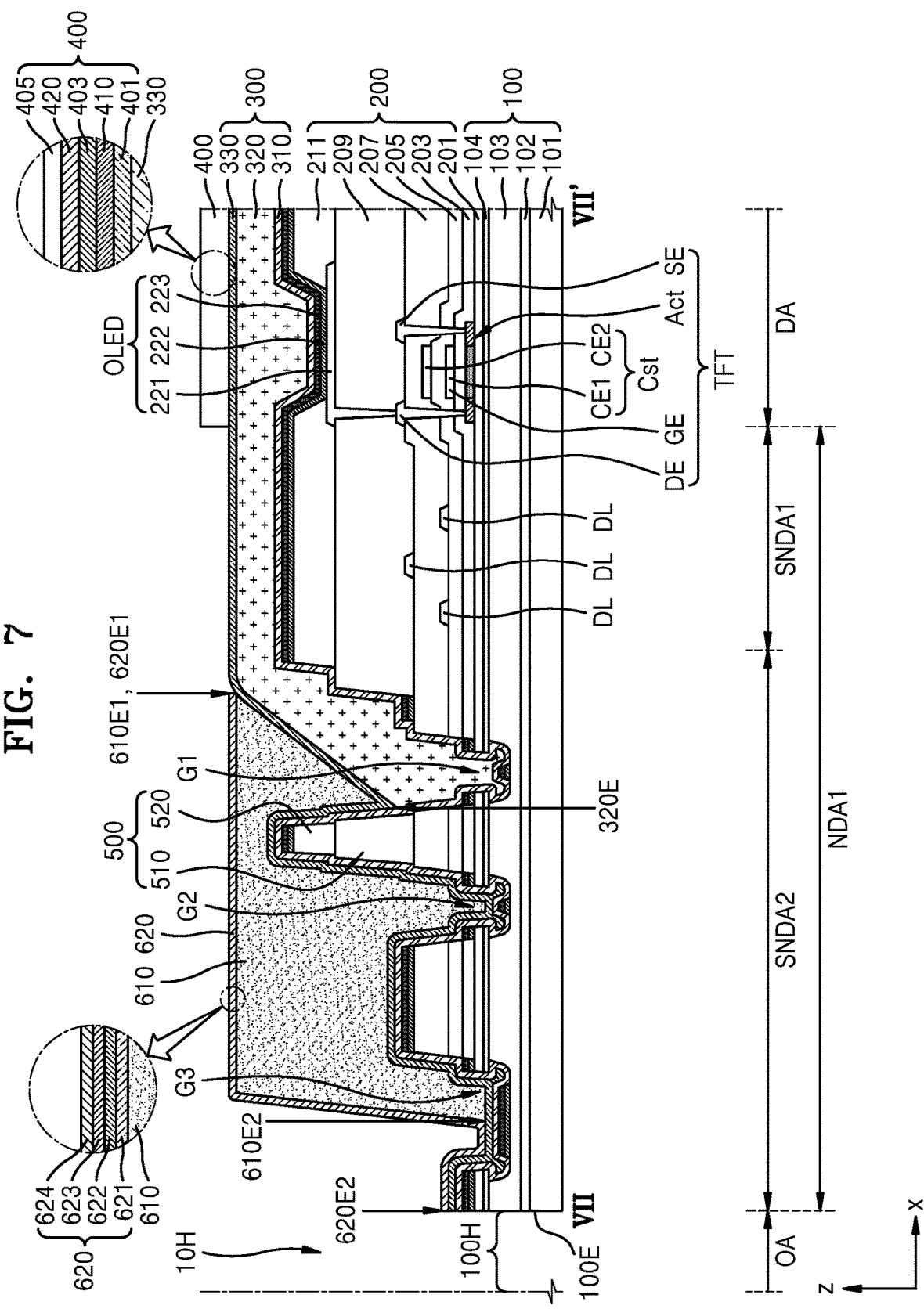
FIG. 7 is a cross-sectional view taken along line VII-VII' of FIG. 6.
Figure 8:
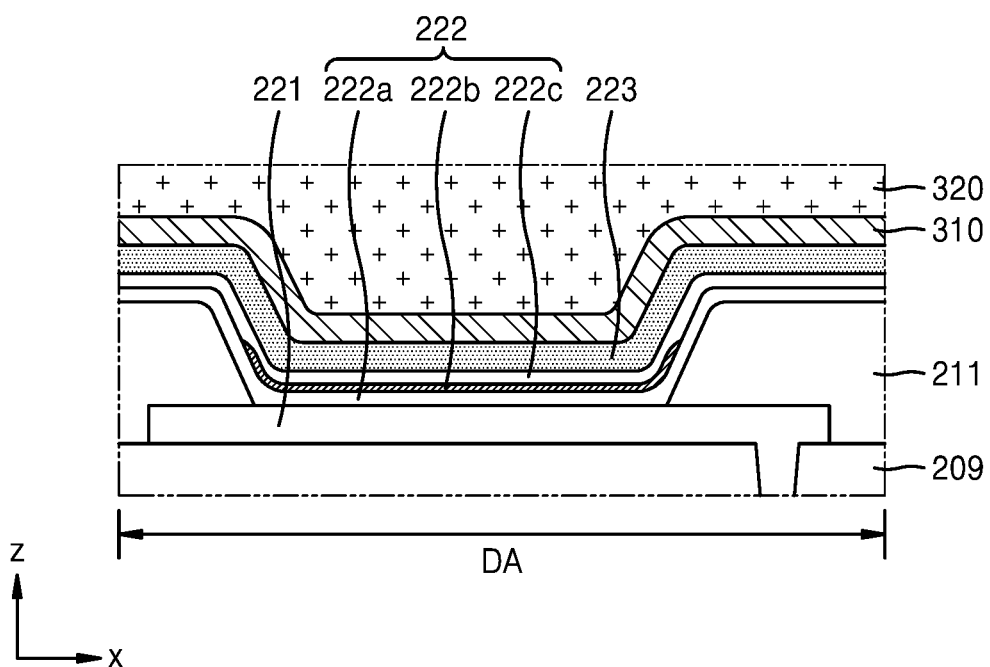
FIG. 8 is an enlarged cross-sectional view of an organic light-emitting diode of FIG. 7.

FIG. 7 is a cross-sectional view of a display panel according to an embodiment and corresponds to a cross-section taken along a line VII-VII', and FIG. 8 is an enlarged cross-sectional view of an organic light-emitting diode of FIG. 7. FIG. 7 shows the opening area OA and the first non-display area NDA1, and the display area DA. FIG. 7 shows that the substrate 100 includes the first opening 100H of the opening area OA. Hereinafter, the opening area OA may refer to the opening 10H of the display panel 10 or the first opening 100H of the substrate 100.

First, the display area DA of FIG. 7 is described.

According to an embodiment, the substrate 100 includes a polymer resin. The substrate 100 includes a base layer that includes a polymer resin, and an inorganic layer. For example, the substrate 100 includes a first base layer 101, a first inorganic layer 102, a second base layer 103, and a second inorganic layer 104.

According to an embodiment, each of the first and second base layers 101 and 103 includes a polymer resin. For example, each of the first and second base layers 101 and 103 includes a polymer resin such as polyethersulfone (PES), polyarylate (PAR), polyetherimide (PEI), polyethylene naphthalate (PEN), polyethylene terephthalate (PET), polyphenylene sulfide (PPS), polyacrylate, polyimide (PI), polycarbonate (PC), or cellulose acetate propionate (CAP). The polymer resin is transparent.

According to an embodiment, each of the first and second inorganic layers 102 and 104 is a barrier layer that prevents penetration of external foreign substances and may be a single layer or include multiple layers that include an inorganic material such as SiNx or SiOx.

According to an embodiment, a buffer layer 201 that prevents impurities from penetrating into a semiconductor layer of a thin film transistor is disposed on the substrate 100. The buffer layer 201 includes an inorganic insulating material such as silicon nitride or silicon oxide. The buffer layer 201 may be a single layer or include multiple layers that include the inorganic insulating material. In an embodiment, the second inorganic layer 104 of the substrate 100 is a partial-layer or sub-layer of a multi-layered buffer layer 201.

According to an embodiment, the pixel circuit PC, which includes the thin film transistor TFT and the storage capacitor Cst, is disposed over the buffer layer 201. The thin film transistor TFT includes a semiconductor layer Act, a gate electrode GE, a source electrode SE, and a drain electrode DE. The thin film transistor TFT shown in FIG. 7 corresponds to the driving thin film transistor described with reference to FIG. 4. In a present embodiment, although FIG. 7 illustrates a top-gate type thin film transistor in which the gate electrode GE is disposed over the semiconductor layer Act with a gate insulating layer 203 therebetween, according to other embodiments, the thin film transistor TFT is a bottom-gate type thin film transistor.

According to an embodiment, the semiconductor layer Act includes polycrystalline silicon. Alternatively, in other embodiments, the semiconductor layer Act may include amorphous silicon or an oxide semiconductor, or an organic semiconductor. The gate electrode GE includes a low-resistance metal. The gate electrode GE includes a conductive material, such as Mo, Al, Cu, or Ti, and may be a single layer or include multiple layers (multiple structure) that includes the above-mentioned materials.

According to an embodiment, a gate insulating layer 203 is disposed between the semiconductor layer Act and the gate electrode GE. The gate insulating layer 203 includes an inorganic insulating material such as silicon oxide, silicon nitride, silicon oxynitride, aluminum oxide, titanium oxide, tantalum oxide, or hafnium oxide. The gate insulating layer 203 may be a single layer or include multiple layers that include the above-mentioned materials.

According to an embodiment, the source electrode SE and the drain electrode DE both include a conductive material. The source electrode SE and the drain electrode DE include a conductive material such as Mo, Al, Cu, or Ti, or a compound thereof. The source electrode SE and the drain electrode DE may be a single layer or include multiple layers that include the above-mentioned materials. In an embodiment, the source electrode SE and the drain electrode DE include multiple layers that include Ti/Al/Ti.

According to an embodiment, the storage capacitor Cst includes a lower electrode CE1 and an upper electrode CE2 that overlap each other with a first interlayer insulating layer 205 therebetween. The storage capacitor Cst overlaps the thin film transistor TFT. In this regard, FIG. 7 shows that the gate electrode GE of the thin film transistor TFT serves as the lower electrode CE1 of the storage capacitor Cst. However, in other embodiments, the storage capacitor does not overlap the thin film transistor TFT. The storage capacitor Cst is covered by a second interlayer insulating layer 207.

According to an embodiment, the first and second interlayer insulating layers 205 and 207 include an inorganic insulating material such as silicon oxide, silicon nitride, silicon oxynitride, aluminum oxide, titanium oxide, tantalum oxide, or hafnium oxide. The first and second interlayer insulating layers 205 and 207 may each be a single layer or include multiple layers that include the above-mentioned materials.

According to an embodiment, the pixel circuit PC, which includes the thin film transistor TFT and the storage capacitor Cst, is covered by an organic insulating layer 209. The organic insulating layer 209 is a planarizing insulating layer. The organic insulating layer includes an organic insulating material that includes a general-purpose polymer such as an imide-based polymer, polymethylmethacrylate (PMMA) or polystyrene (PS), or polymer derivatives that have a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. In an embodiment, the organic insulating layer 209 includes polyimide.

According to an embodiment, the organic light-emitting diode OLED is disposed on the organic insulating layer 209. A pixel electrode 221 of the organic light-emitting diode OLED is disposed on the organic insulating layer 209 and is connected with the pixel circuit PC through a contact hole in the organic insulating layer 209.

According to an embodiment, the pixel electrode 221 includes a conductive oxide such indium tin oxide (ITO), zinc oxide (IZO), zinc oxide (ZnO), indium oxide ($In_2O_3$), indium gallium oxide (IGO), or aluminum zinc oxide (AZO). In other embodiments, the pixel electrode 221 includes a reflective layer that includes Ag, Mg, Al, Pt, Pd, Au, Ni, Nd, Ir, Cr, or a compound thereof. In other embodiments, the pixel electrode 221 further includes a layer that includes ITO, IZO, ZnO, or $In_2O_3$ on or under the reflective layer.

According to an embodiment, a pixel-defining layer 211 includes an opening that exposes a top surface of the pixel electrode 221 and covers an edge of the pixel electrode 221. The pixel-defining layer 211 includes an organic insulating material. However, in other embodiments, the pixel-defining layer 211 may include an inorganic insulating material or may include an organic and an inorganic insulating material.

According to an embodiment, an intermediate layer 222 that includes an emission layer 222b is disposed on the pixel electrode 221 and pixel-defining layer 211. The emission layer 222b includes a polymer or low molecular organic material that emits light of a predetermined color. In an embodiment, as shown in FIG. 8, the intermediate layer 222 includes a first functional layer 222a under the emission layer 222b and a second functional layer 222c over the emission layer 222b.

According to an embodiment, the first functional layer 222a may be a single layer or include multiple layers. For example, when the first functional layer 222a includes a polymer material, the first functional layer 222a is a hole transport layer (HTL), which has a single-layered structure, and includes poly-(3,4)-ethylene-dihydroxy thiophene (PEDOT) or polyaniline (PANI). When the first functional layer 222a includes a low molecular material, the first functional layer 222a includes a hole injection layer (HIL) and an HTL.

According to an embodiment, the second functional layer 222c is optional. For example, when the first functional layer 222a and the emission layer 222b include a polymer material, the second functional layer 222c is provided to improve characteristics of the organic light-emitting diode OLED. The second functional layer 222c may be a single layer or include multiple layers. The second functional layer 222c includes an electron transport layer (ETL) or an electron injection layer (EIL).

According to an embodiment, some of the plurality of layers that constitute the intermediate layer 222, such as the functional layer(s), are disposed on not only the display area DA but also the first non-display area NDA1, and are separated in the first non-display area NDA1 by the first groove G1, the second groove G2 and the third groove G3 described below.

According to an embodiment, an opposite electrode 223 is disposed that faces the pixel electrode 221 with the intermediate layer 222 therebetween. The opposite electrode 223 includes a conductive material that has a low work function. For example, the opposite electrode 223 includes a (semi) transparent layer that includes Ag, Mg, Al, Pt, Pd, Au, Ni, Nd, Ir, Cr, Li, Ca, or an ally thereof. However, in other embodiments, the opposite electrode 223 further includes a layer that includes ITO, IZO, or $In_2O_3$ on the (semi) transparent layer that includes the above-mentioned material.

According to an embodiment, the organic light-emitting diode OLED is covered by the thin-film encapsulation layer 300. The thin-film encapsulation layer 300 includes at least one organic encapsulation layer and at least one inorganic encapsulation layer. FIG. 7 shows that the thin-film encapsulation layer 300 includes first and second inorganic encapsulation layers 310 and 330 and an organic encapsulation layer 320 therebetween. However, in other embodiments, the number of organic encapsulation layers and inorganic encapsulation layers, and a stacked sequence may change.

According to an embodiment, the first and second inorganic encapsulation layers 310 and 330 include one or more inorganic insulating materials such as aluminum oxide, titanium oxide, tantalum oxide, hafnium oxide, zinc oxide, silicon oxide, silicon nitride, or silicon oxynitride, and can be formed by chemical vapor deposition (CVD), etc. The organic encapsulation layer 320 includes a polymer-based material. The polymer-based material includes an acrylic-based resin, an epoxy-based resin, polyimide, or polyethylene.

According to an embodiment, the input sensing layer 400 is disposed on the thin-film encapsulation layer 300. The input sensing layer 400 obtains coordinate information that corresponds to an external input, such as a touch event. Since the input sensing layer 400 is disposed directly formed over the substrate 100, including the thin-film encapsulation layer 300, and thus contacts the thin-film encapsulation layer 300, an additional member such as an adhesive layer that couples the input sensing layer 400 to the thin-film encapsulation layer 300, can be omitted. The input sensing layer 400 includes sensing or touch electrodes and trace lines connected to the sensing electrodes. The input sensing layer 400 includes first and second conductive layers 410 and 420 and first to third insulating layers 401, 403, and 405. At least one of the first or second conductive layers 410 or 420 includes the sensing electrodes. In this regard, a specific structure of the input sensing layer 400 is described below with reference to FIGS. 17 to 20C.

Next, the first non-display area NDA1 of FIG. 7 is described.

Referring to the first non-display area NDA1 of FIG. 7, according to an embodiment, the first non-display area NDA1 includes a first sub-non-display area SNDA1, which is relatively far from the opening area OA, and a second sub-non-display area SNDA2, which is relatively close to the opening area OA.

According to an embodiment, the first sub-non-display area SNDA1 is an area across which signal lines extend. Data lines DL in FIG. 7 correspond to the data lines DL that detour around the opening area OA described with reference to FIG. 5, and the first sub-non-display area SNDA1 is a wiring area across which the signal lines extend. The data lines DL are alternately disposed on different layers with an insulating layer therebetween, or are disposed on the same insulating layer. When neighboring data lines DL are respectively disposed on and under with an insulating layer, such as the second interlayer insulating layer 207, therebetween, a gap or pitch between the adjacent data lines DL can be reduced and a width of the first non-display area NDA1 can be reduced. Although FIG. 7 shows the data lines DL extending through the first sub-non-display area SNDA1, the scan lines SL that detour around the opening area OA described with reference to FIG. 5 also extend through the first sub-non-display area SNDA1.

According to an embodiment, the second sub-non-display area SNDA2 is a groove area in which the grooves are formed. The first to third grooves G1, G2 and G3 are formed in the second sub-non-display area SNDA2. Each of the first to third grooves G1, G2 and G3 has an undercut structure. The first to third grooves G1, G2 and G3 are formed through multiple layers that include an inorganic layer and an organic layer. For example, the first to third grooves G1, G2 and G3 are formed by removing a portion of the substrate 100 that includes a plurality of layers.

According to an embodiment, the first to third grooves G1, G2 and G3 are formed by etching the second base layer 103 and the second inorganic layer 104 thereon. In this regard, FIG. 7 shows that the first to third grooves G1, G2 and G3 are formed by removing a portion of the second base layer 103 and the second inorganic layer 104. Referring to FIG. 7, the buffer layer 201, the gate insulating layer 203, the first and second interlayer insulating layers 205 and 207 over the second inorganic layer 104 are also removed and constitute a portion of each of the first to third grooves G1, G2 and G3.

According to an embodiment, each of the first to third grooves G1, G2 and G3 has an undercut structure. In detail, a width of a portion of the first to third grooves G1, G2 and G3 that at least partially penetrates the second base layer 103 is greater than a width of a portion of the first to third grooves G1, G2 and G3 that penetrates the inorganic insulating layer(s), such as the second inorganic layer 104 or the buffer layer 201. Portions of the intermediate layer 222 and the opposite electrode 223 are separated by the undercut structure of the first to third grooves G1, G2 and G3.

According to an embodiment, the first inorganic encapsulation layer 310 of the thin-film encapsulation layer 300 covers an inner surface of the first to third grooves G1, G2 and G3. The organic encapsulation layer 320 covers the first groove G1 and at least partially fills a portion of the first groove G1. The organic encapsulation layer 320 is formed by coating a monomer over the substrate 100 and hardening the monomer. To control a flow of the monomer and secure a thickness of the monomer, a partition wall 500 is provided between the first groove G1 and the second groove G2. The partition wall 500 has a stacked structure that includes a first sub-wall portion 510 and a second sub-wall portion 520, each of which includes an organic insulating layer. An edge 320E of the organic encapsulation layer 320 is spaced apart from the opening area OA or an edge 100E of the substrate 100 by a predetermined interval. The second inorganic encapsulation layer 330 is disposed on the organic encapsulation layer 320 and covers an inner surface of the second and third grooves G2 and G3. The second inorganic encapsulation layer 330 directly contacts the first inorganic encapsulation layer 310 in the second and third grooves G2 and G3.

According to an embodiment, the planarization layer 610 is disposed in the second sub-non-display area SNDA2 and covers at least one groove. The planarization layer 610 covers the second and third grooves G2 and G3 and at least partially fills at least one of the second or third grooves G2 or G3. As shown in FIG. 7, the planarization layer 610 at least partially fills an interior space of the second groove G2 over the second inorganic encapsulation layer 330. The planarization layer 610 increases a flatness of the display panel around the opening area OA by covering at least an area of the second sub-non-display area SNDA2 that is not covered by the organic encapsulation layer 320.

According to an embodiment, the planarization layer 610 includes an organic insulating material. The planarization layer 610 is spatially separated from the organic encapsulation layer 320 by the second inorganic encapsulation layer 330. For example, when the planarization layer 610 is disposed on the second inorganic encapsulation layer 330, and the organic encapsulation layer 320 is disposed under the second inorganic encapsulation layer 330, the organic encapsulation layer 320 and the planarization layer 610 are spatially separated from each other. The organic encapsulation layer 320 does not directly contact the planarization layer 610. The planarization layer 610 has a thickness of, for example, at least about 5 μm.

According to an embodiment, a portion of the planarization layer 610 overlaps the organic encapsulation layer 320. A first edge 610E1 of the planarization layer 610 extends over the organic encapsulation layer 320 and overlaps the organic encapsulation layer 320. A second edge 610E2 of the planarization layer 610 is spaced apart from the opening area OA or the edge 100E of the substrate 100 by a predetermined interval. Therefore, a second edge 620E2 of a barrier layer 620, which will be described below, directly contacts the second inorganic encapsulation layer 330 in an area adjacent to the opening 10H. The planarization layer 610 can prevent or minimize the occurrence of cracks, floats, and exfoliation in insulating layer(s) and metal or conductive layer(s) in the first non-display area NDA1 during a process of manufacturing the display panel. The planarization layer 610 is covered by the barrier layer 620.

According to an embodiment, the barrier layer 620 is disposed in the first non-display area NDA1 and covers the planarization layer 610. The barrier layer 620 covers a top surface and a lateral surface of the planarization layer 610. As shown in FIG. 7, the first edge 620E1 of the barrier layer 620 is located on the same vertical line as the first edge 610E1 of the planarization layer 610. However, in other embodiments, the first edge 620E1 of the barrier layer 620 extends over a top surface of the second inorganic encapsulation layer 330 beyond an edge of the planarization layer 610 and contacts the second inorganic encapsulation layer 330. The second edge 620E2 of the barrier layer 620 is located on the same vertical line as the edge 100E of the substrate 100.

According to an embodiment, the barrier layer 620 includes an inorganic material, such as an inorganic insulating material or a metal. In an embodiment, the barrier layer 620 includes the same material as an inorganic insulating layer or metal layer included in the input sensing layer 400. For example, the barrier layer 620 includes first to fourth sub-barrier layers 621, 622, 623, and 624. The first and third sub-barrier layers 621 and 623 may respectively include the same materials as the first and second insulating layers 401 and 403 of the input sensing layer 400. In this case, unlike FIG. 7, the first and third sub-barrier layers 621 and 623 are respectively connected, as one body, to the first and second insulating layers 401 and 403 of the input sensing layer 400. The second and fourth sub-barrier layers 622 and 624 respectively include the same materials as the first and second conductive layers 410 and 420 of the input sensing layer 400, but are not connected with the first and second conductive layers 410 and 420 and are spaced apart from each other. Though FIG. 7 shows that the barrier layer 620 includes the first to fourth sub-barrier layers 621, 622, 623, and 624, embodiments of the present disclosure are not limited thereto. The barrier layer 620 may be a single layer or have two or three layers. For example, the barrier layer 620 includes at least one of the first to fourth sub-barrier layers 621, 622, 623, or 624.

Figure 9:
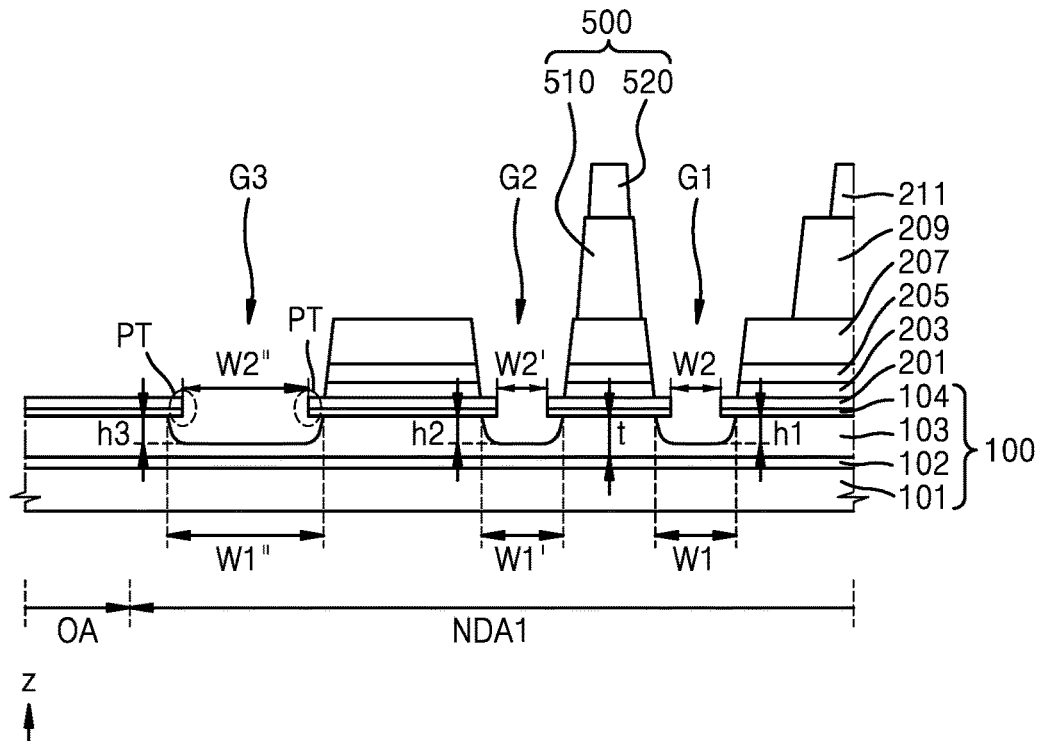
FIGS. 9 to 14 are cross-sectional views that illustrate a process of manufacturing a display panel, according to an embodiment.
Figure 10:
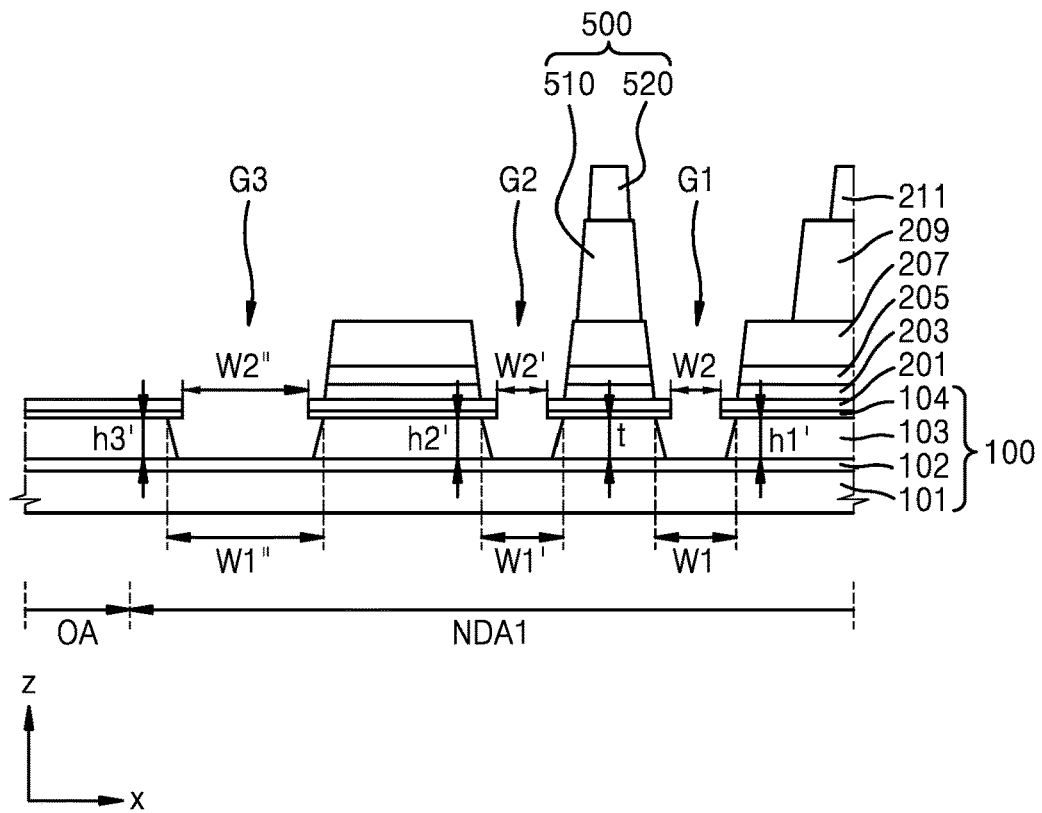
Figure 11:
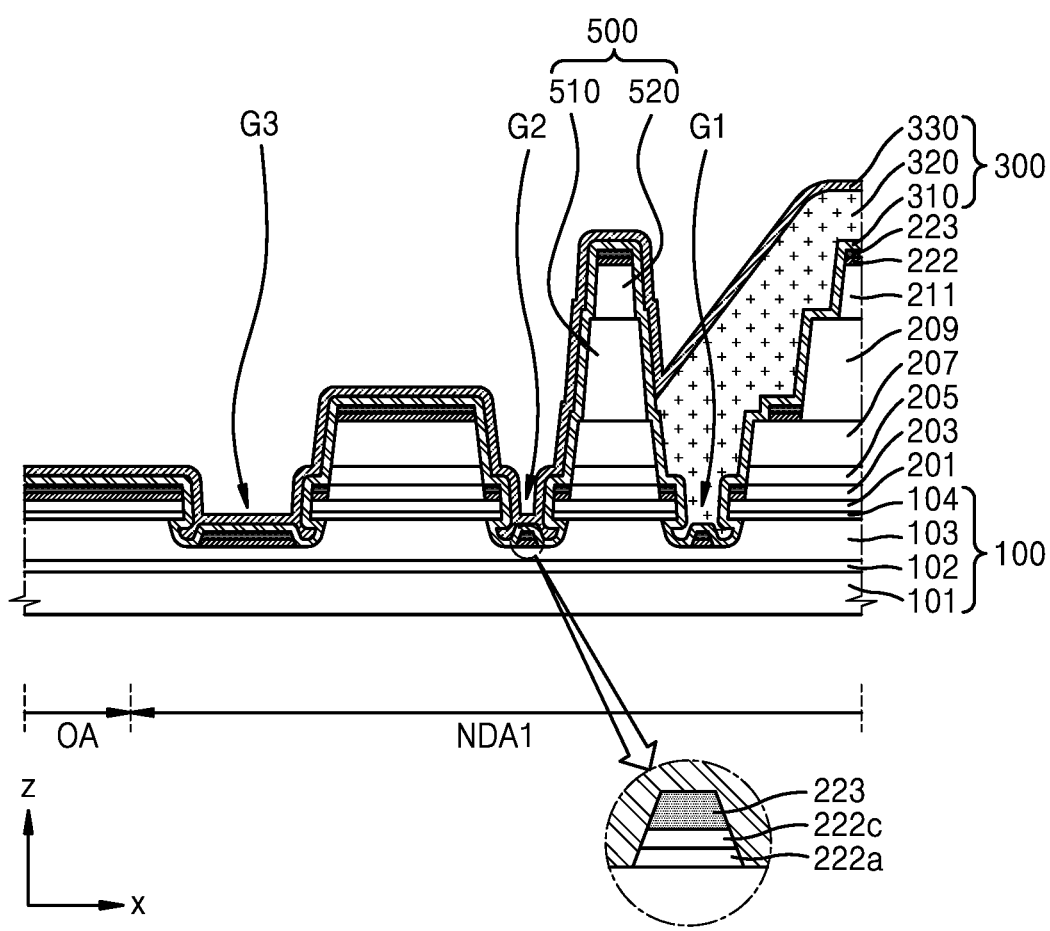
Figure 12:
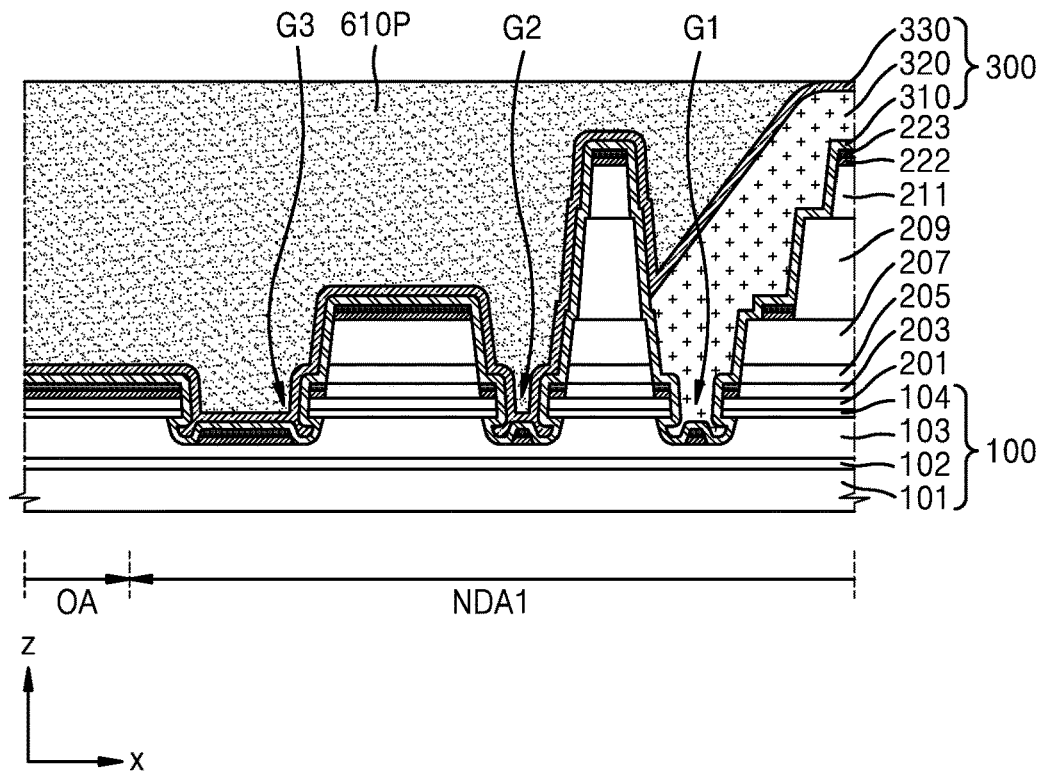
Figure 13:
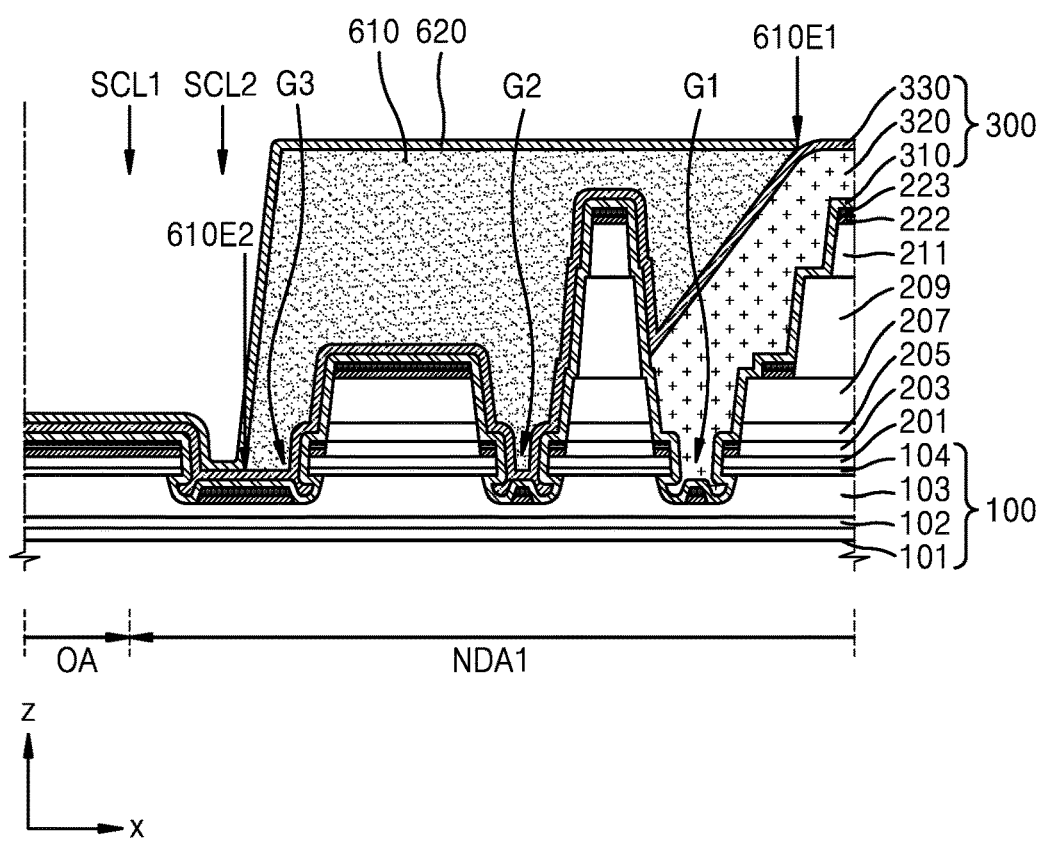
Figure 14:
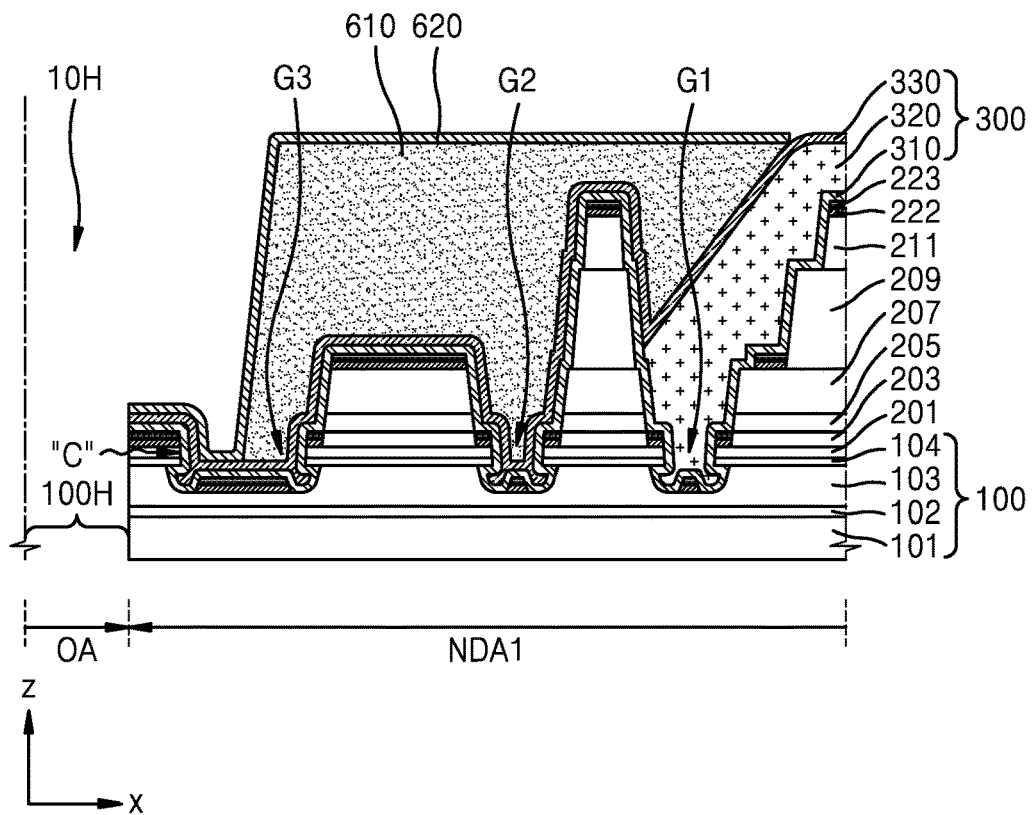

FIGS. 9 to 14 are cross-sectional views illustrating the opening area OA and the first non-display area NDA1 in a process of manufacturing a display panel according to an embodiment. FIG. 9 is a cross-sectional view of the first to third grooves formed in the display panel of FIG. 7, FIG. 10 is a cross-sectional view illustrating the first to third grooves being formed according to another embodiment, FIG. 11 is a cross-sectional view illustrating an intermediate layer to a thin-film encapsulation layer being formed over the display panel of FIG. 9, FIGS. 12 and 13 are cross-sectional views illustrating that the planarization layer 610 and the barrier layer 620 are formed after the process of FIG. 11, and FIG. 14 is a cross-sectional view illustrating a process of manufacturing a display panel according to another embodiment and is a cross-sectional view of a state after a cutting or scribing process according to another embodiment.

Referring to FIG. 9, according to an embodiment, the first to third grooves G1, G2 and G3 are formed by removing a portion of a multi-layered film. The multi-layered film includes at least one of partial layer of the substrate. The multi-layered film has a stacked structure that includes a layer that includes an organic insulating material such as a polymer resin and a layer that includes an inorganic insulating material disposed thereon. For example, the second base layer 103, which includes a polymer resin, and inorganic insulating layer(s) such as the second inorganic layer 104 or the buffer layer 201 on the second base layer 103 correspond to the multi-layered film. Although the second inorganic layer 104 and the buffer layer 201 are respectively denoted by separate names in FIG. 9, the second inorganic layer 104 may be a portion (or sub-layer) of the buffer layer 201, which has multiple layers, or the buffer layer 201 may be a portion (or sub-layer) of the second inorganic layer 104, which has multiple layers.

According to an embodiment, the first to third grooves G1, G2 and G3 are formed by removing a portion of the second base layer 103 and a portion of the inorganic insulating layer(s). In an embodiment, FIG. 9 shows that portions of the second base layer 103 and the second inorganic layer 104 are removed through an etching process. Portions of the buffer layer 201, the gate insulating layer 203, and the first and second interlayer insulating layers 205 and 207 are removed through the etching process. An etching process that removes portions of the second base layer 103, and an etching process that removes the inorganic insulating layer(s) on the second base layer 103 are performed separately. The partition wall 500 is disposed between the first groove G1 and the second groove G2 and includes the first sub-wall portion 510 that includes the same material as the organic insulating layer 209, and the second sub-wall portion 520 that includes the same material as the pixel-defining layer 211.

According to an embodiment, a width W1 of a portion of the first groove G1 that at least partially penetrates the second base layer 103 is greater than a width W2 of the first groove G1 that penetrates the buffer layer 201 and the second inorganic layer 104. Therefore, the first groove G1 has an undercut structure. A lateral side of the buffer layer 201 and the second inorganic layer 104 protrude further toward a center of the first groove G1 than a lateral side of the second base layer 103. Portions of the buffer layer 201 and the second inorganic layer 104 that protrude further toward the center of the first groove G1 in a direction parallel to a top surface of the substrate 100 correspond to a pair of protruded tips PT. A protruded tip PT of each of the first to third grooves G1, G2 and G3 protrudes by about 0.7 μm to about 1.5 μm toward the center of each of the first to third grooves G1, G2 and G3.

According to an embodiment, like the first groove G1, the second and third grooves G2 and G3 have an undercut structure. Widths W1' and W1" of portions of the second and third grooves G2 and G3 that penetrate into the second base layer 103 are greater than widths W2' and W2" of portions of the first groove G1 that penetrate the buffer layer 201 and the second inorganic layer 104. Likewise, lateral sides of the buffer layer 201 and the second inorganic layer 104 of the second and third grooves G2 and G3 protrude further toward the center of the first groove G1 than a lateral side of the second base layer 103. A pair of protruded tips PT of the buffer layer 201 and the second inorganic layer 104 that protrude toward a center of each of the first to third grooves G1, G2 and G3 form an undercut structure.

According to an embodiment, widths of at least two of the first to third grooves G1, G2 and G3 differ from each other. A width of a groove denotes a width between the pair of protruded tips of the groove. For example, a width W2 between protruded tips of the first groove G1 is less than a width W2' between protruded tips of the second groove G2. A width W2' between protruded tips of the second groove G2 is less than a width W2" between protruded tips of the third groove G3. However, embodiments are not limited thereto, and widths between protruded tips of at least two of the first to third grooves G1, G2 and G3 may be the same in other embodiments. In other embodiments, a width of grooves that are further from the opening area OA is less than a width of grooves that are closer to the opening area OA. In other embodiments, widths of the first to third grooves G1, G2 and G3 and the other grooves may be variously selected. For example, widths of the grooves may alternate between being wide and being narrow.

According to an embodiment, FIG. 9 shows that the first to third grooves G1, G2 and G3 include a hole that penetrates an inorganic insulating layer, such as the buffer layer 201 and the second inorganic layer 104, and a recess formed in the second base layer 103. Depths h1, h2, and h3 of recesses respectively formed in the second base layer 103 are less than a thickness t of the second base layer 103. Bottom surfaces of the first to third grooves G1, G2 and G3 correspond to a virtual surface between a top surface and a bottom surface of the second base layer 103.

In other embodiments, as shown in FIG. 10, each of the first to third grooves G1, G2 and G3 includes a hole that penetrates an inorganic insulating layer, such as the buffer layer 201 and the second inorganic layer 104, and a hole that penetrates the second base layer 103. Depths h1', h2', and h3' of holes respectively formed in the second base layer 103 are substantially equal to a thickness t of the second base layer 103. Therefore, bottom surfaces of the first to third grooves G1, G2 and G3 correspond to a bottom surface of the second base layer 103. The depths h1, h2, h3, h1', h2', and h3' of the recesses or holes are at least about 2 μm.

Hereinafter, for convenience of description, the structure shown in FIG. 9 is mainly described, in which bottom surfaces of the first to third grooves G1, G2 and G3 are located between the top surface and the bottom surface of the second base layer 103, however, the second base layer 103 may have the structure described with reference to FIG. 10 in embodiments described below and embodiments derived therefrom.

Referring to FIG. 11, according to an embodiment, the intermediate layer 222 and the opposite electrode 223 are formed over the substrate 100, including the first to third grooves G1, G2 and G3. The intermediate layer 222 and the opposite electrode 223 may be formed through thermal deposition, etc. A portion of the intermediate layer 222, such as the first and second functional layers 222a and 222c, and the opposite electrode 223 can be formed as one body in the display area DA and the first non-display area NDA1. The first and second functional layers 222a and 222c are separated in the first non-display area NDA1 by the undercut structures of the first to third grooves G1, G2 and G3. Likewise, the opposite electrode 223 is also separated in the first non-display area NDA1 by the first to third grooves G1, G2 and G3.

According to an embodiment, unlike the intermediate layer 222 and the opposite electrode 223, the first inorganic encapsulation layer 310 of the thin-film encapsulation layer 300 has good step coverage, and thus the first inorganic encapsulation layer 310 can be continuously formed without separating. As shown in FIG. 11, the first inorganic encapsulation layer 310 entirely covers inner surfaces of the first to third grooves G1, G2 and G3. Lateral surfaces and bottom surfaces of the buffer layer 201 and the second inorganic layer 104, and lateral surfaces and bottom surfaces of the second base layer 103 that constitute the grooves are covered by the first inorganic encapsulation layer 310. The first inorganic encapsulation layer 310 covers the separated first and second functional layers 222a and 222c and opposite electrode 223 placed on the bottom surfaces of the first to third grooves G1, G2 and G3.

According to an embodiment, a layer on the substrate 100 that includes an organic material can serve as a moisture transmission path for foreign substances such as moisture or oxygen. Since the first and second functional layers 222a and 222c, which include an organic material, are separated by the first to third grooves G1, G2 and G3, propagation of moisture in a lateral (x) direction can be prevented and damage of an organic light-emitting diode can be prevented.

According to an embodiment, the first groove G1 is covered by and filled with the organic encapsulation layer 320. During a process of manufacturing the organic encapsulation layer 320, a flow of a monomer is controlled by the partition wall 500 between the first groove G1 and the second groove G2. The organic encapsulation layer 320, which is formed when the monomer hardens, does not extend beyond the partition wall 500 because flow of the monomer has been blocked by the partition wall 500. A thickness of the organic encapsulation layer 320 is controlled by the partition wall 500, and the second and third grooves G2 and G3 are not covered by the organic encapsulation layer 320.

As described above, according to an embodiment, the inner surfaces of the second and third grooves G2 and G3 are covered by the first inorganic encapsulation layer 310. The first and second inorganic encapsulation layers 310 and 330 contact each other in the second and third grooves G2 and G3. The first and second inorganic encapsulation layers 310 and 330 are formed not only in the display area DA and the first non-display area NDA1, but also in the opening area OA.

Referring to FIG. 12, according to an embodiment, a pre-planarization layer 610P is formed on the thin-film encapsulation layer 300. The pre-planarization layer 610P includes an organic material, such as a negative or positive photoresist, or a polymer-based material. The pre-planarization layer 610P covers an area of the first non-display area NDA1 in which the first and second inorganic encapsulation layers 310 and 330 contact each other, and a portion of the pre-planarization layer 610P overlaps the organic encapsulation layer 320 with the second inorganic encapsulation layer 330 therebetween.

Referring to FIG. 13, the planarization layer 610 is formed by patterning the pre-planarization layer 610P. For example, the planarization layer 610 is formed by removing a portion of the pre-planarization layer 610P that corresponds to the opening area OA. The planarization layer 610 covers the second and third grooves G2 and G3. As shown in FIG. 13, the planarization layer 610 fills a portion of the second and third grooves G2 and G3. A location of the second edge 610E2 of the planarization layer 610 may change in a left-right direction from the location shown in FIG. 13 depending on a process of patterning the pre-planarization layer 610P.

After that, according to an embodiment, the barrier layer 620 is formed on the planarization layer 610. The barrier layer 620 is an inorganic layer and includes an inorganic insulating layer or a metal layer. The barrier layer 620 includes at least one of layers provided to the input sensing layer as described above with reference to FIG. 7.

According to an embodiment, the barrier layer 620 covers a top surface and a lateral surface of the planarization layer 610. The barrier layer 620 covers a top surface of the second inorganic encapsulation layer 330 in the opening area OA and in a portion of the first non-display area NDA1. The barrier layer 620 directly contacts the top surface and the lateral surface of the planarization layer 610, and directly contacts a top surface of the second inorganic encapsulation layer 330.

Next, according to an embodiment, when a laser cutting or scribing process is performed along a first line SCL1 that corresponds to the opening area OA, the first opening 100H is formed in the substrate 100 as shown in FIG. 14. If a crack forms in the inorganic insulating layer during a process of cutting or scribing the substrate 100, the crack can propagate along an arrow direction ("C") of FIG. 14. However, the crack does not propagate further toward the display area DA due to the undercut structure of the third groove G3.

Figure 15:
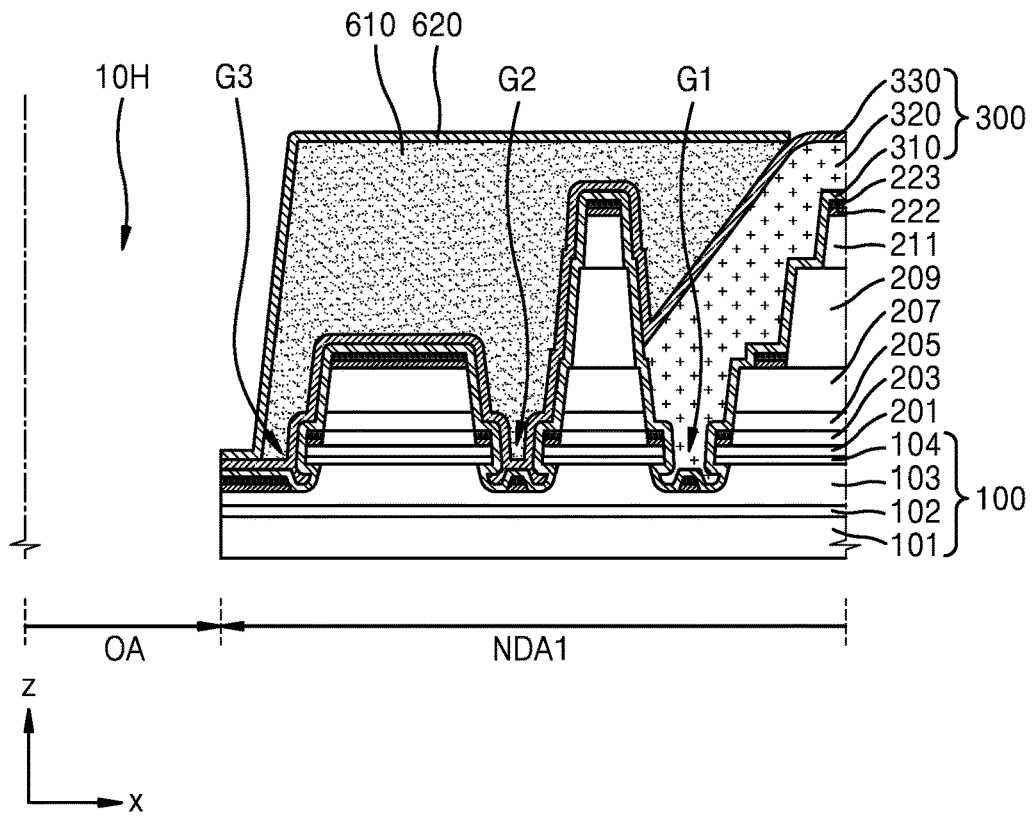
FIG. 15 is a cross-sectional view that illustrates a process of manufacturing a display panel, according to an embodiment.

According to an embodiment, when the cutting or scribing process is performed along the first line SCL1 of FIG. 13, the third groove G3 has an eave structure with protruded tips in a left-right direction in a cross-sectional view as shown in FIG. 14. In another embodiment, when the cutting or scribing process is performed along a second line SCL2, that overlaps the third groove G3, as shown in FIG. 13, the third groove G3 has only a right protruded tip as shown in FIG. 15.

According to an embodiment, although the laser cutting or scribing process has been described as a method of forming the first opening 100H in the substrate 100 according to an embodiment, in other embodiments, other methods such as mechanical polishing can be used.

Figure 16:
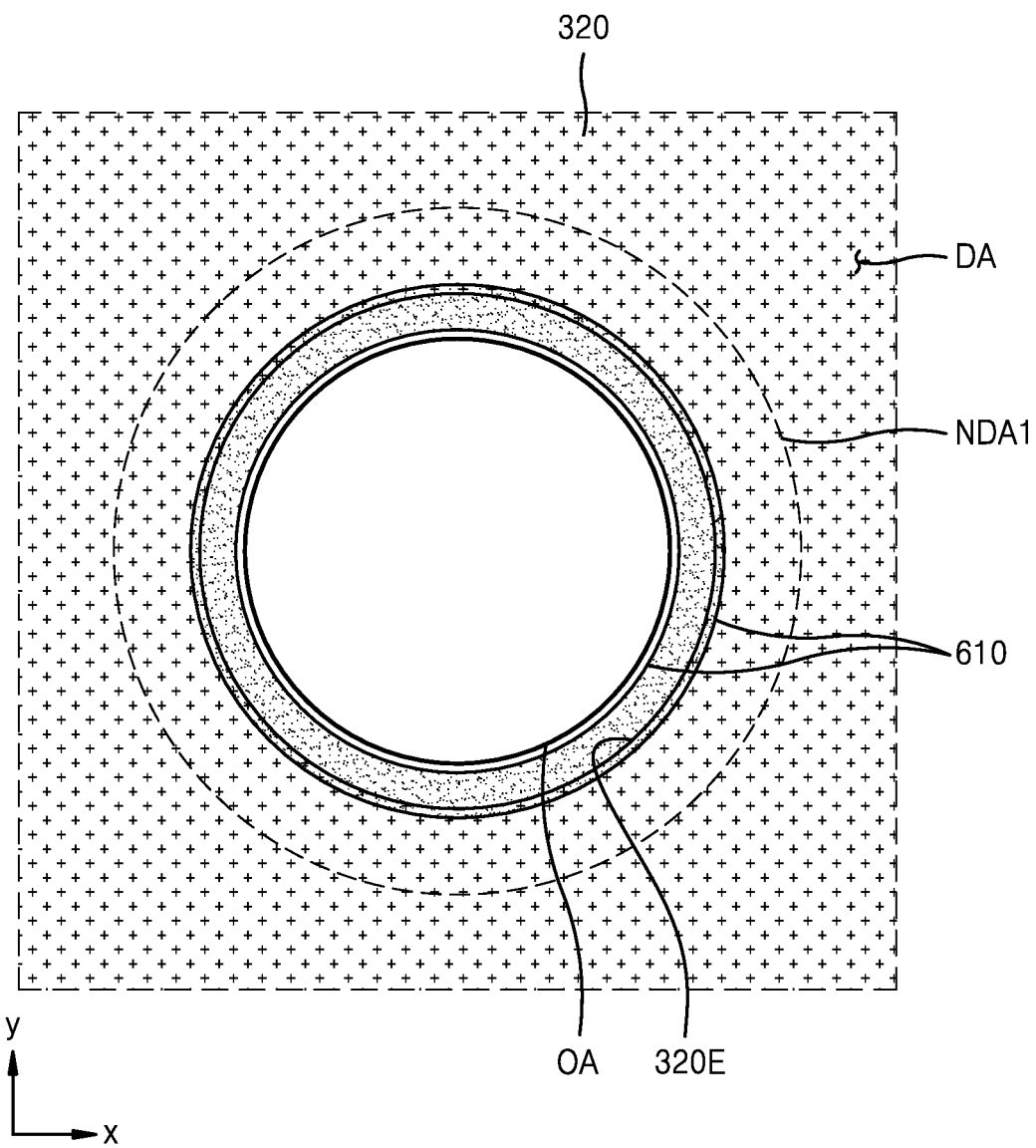
FIG. 16 is a plan view of a display panel according to an embodiment.

According to an embodiment, the structure described with reference to FIGS. 7 to 15 surrounds the opening 10H, that is, the opening area OA. For example, the planarization layer 610 between the opening area OA and the display area DA is a ring-shaped area that surrounding the opening area OA in plan view as shown in FIG. 16. The organic encapsulation layer 320 covers the display area DA and a portion of the first non-display area NDA1, and the edge 320E of the organic encapsulation layer 320 is spaced apart from the opening area OA by a predetermined interval and overlaps the planarization layer 610.

Figure 17:
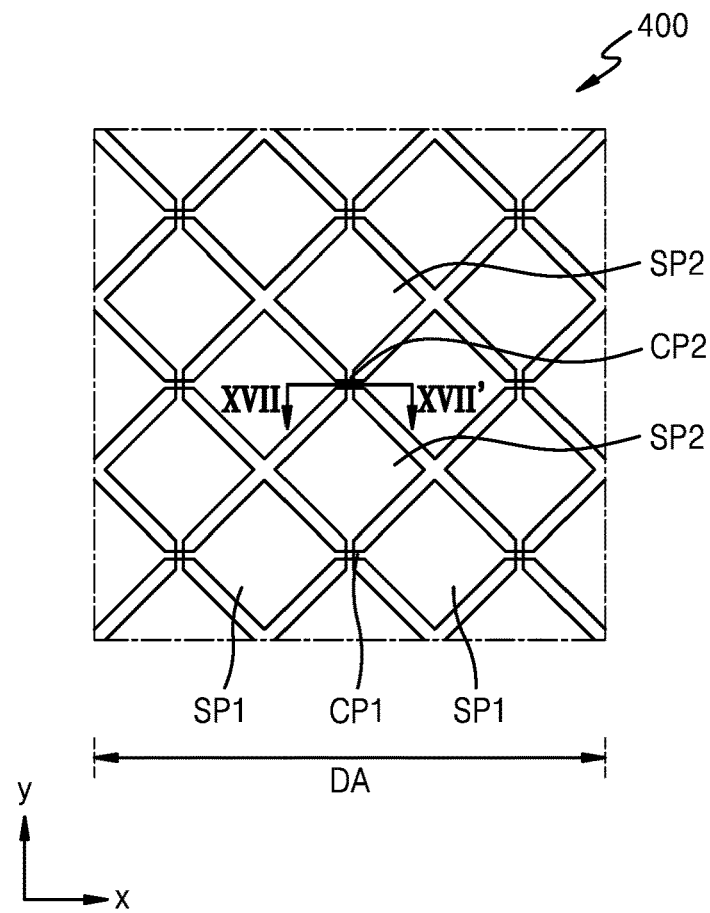
FIG. 17 is a plan view of an input sensing layer according to an embodiment.

FIG. 17 is a plan view of the input sensing layer 400 according to an embodiment.

Referring to FIG. 17, according to an embodiment, the input sensing layer 400 includes first sensing electrodes SP1 and second sensing electrodes SP2 disposed in the display area DA. The first sensing electrodes SP1 are spaced apart in the x-direction, and the second sensing electrodes SP2 are spaced in a y-direction that crosses the x-direction. The first sensing electrodes SP1 perpendicularly cross the second sensing electrodes SP2.

According to an embodiment, the first sensing electrodes SP1 and the second sensing electrodes SP2 are arranged such that corners thereof are adjacent to each other. The first sensing electrodes SP1 are electrically connected to each other through first connection electrodes CP1, and the second sensing electrodes SP2 are electrically connected to each other through second connection electrodes CP2.

Figure 18A:
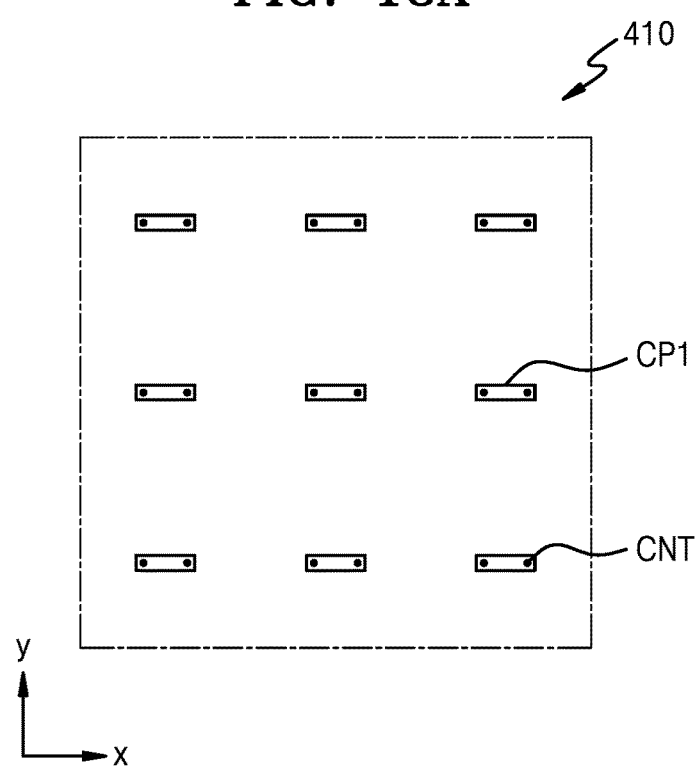
FIGS. 18A and 18B are plan views that respectively illustrate a first conductive layer and a second conductive layer of an input sensing layer according to an embodiment.
Figure 18B:
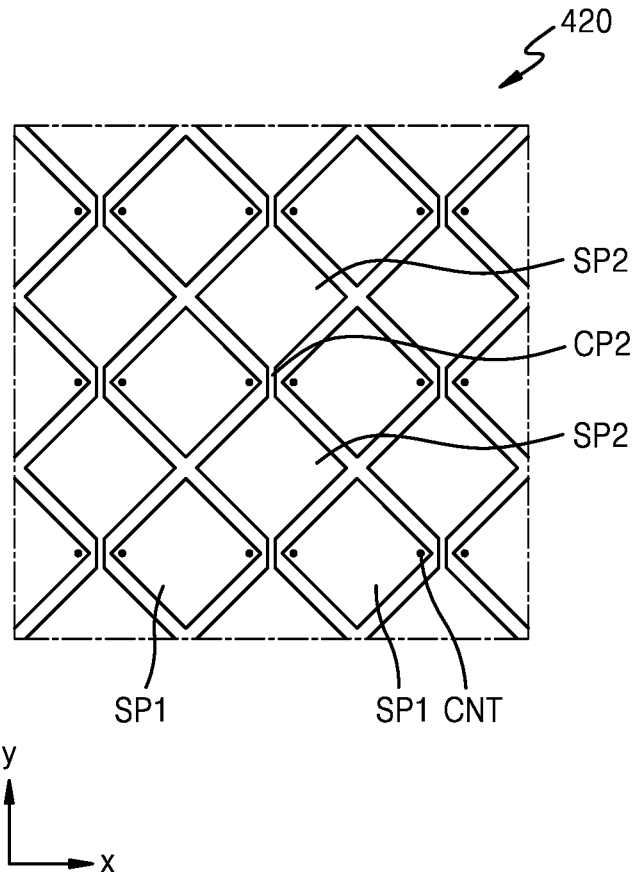
Figure 18C:
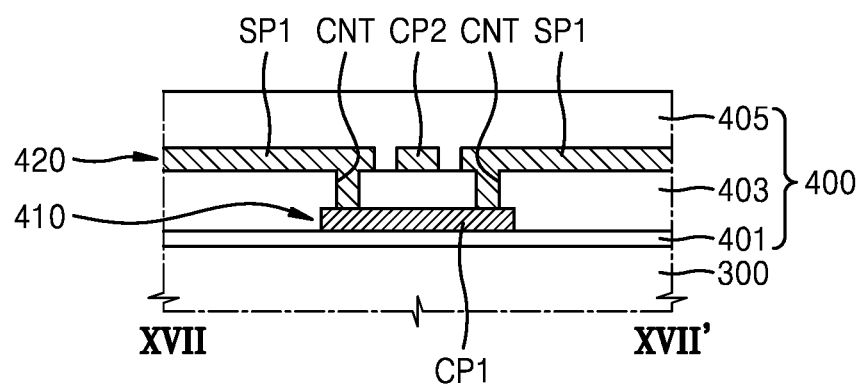
FIG. 18C is a cross-sectional view of an input sensing layer according to an embodiment.

FIGS. 18A and 18B are plan views that respectively illustrate the first conductive layer 410 and the second conductive layer 420 of the input sensing layer 400 according to an embodiment, and FIG. 18C is a cross-sectional view of the input sensing layer 400 according to an embodiment and corresponds to a cross-section taken along line XVII-XVII' of FIG. 17.

Referring to FIGS. 18A and 18B, according to an embodiment, the first sensing electrode SP1 and the second sensing electrode SP2 are located in the same layer. The first conductive layer 410 includes the first connection electrodes CP1, shown in FIG. 18A, and the second conductive layer 420 includes the first sensing electrode SP1, the second sensing electrode SP2, and the second connection electrodes CP2, shown in FIG. 18B.

According to an embodiment, the second sensing electrodes SP2 are connected to each other by the second connection electrodes CP2 located in the same layer. The first sensing electrodes SP1 are spaced apart in the x-direction and connected by the first connection electrodes CP1 located in a different layer.

Referring to FIG. 18C, according to an embodiment, the second insulating layer 403 is interposed between the first conductive layer 410 and the second conductive layer 420. The first sensing electrodes SP1 located in the second conductive layer 420 are connected with the first connection electrode CP1 located in the first conductive layer 410 through contact holes CNT in the second insulating layer 403. The second conductive layer 420 is covered by the third insulating layer 405. The first insulating layer 401 is disposed under the first conductive layer 410. The first and second insulating layers 401 and 403 are inorganic insulating layers that include an inorganic material such as silicon nitride, and the third insulating layer 405 is an organic insulating layer. Though FIG. 18C shows that the first insulating layer 401 is disposed between the thin-film encapsulation layer 300 and the first conductive layer 410, in other embodiments, the first insulating layer 401 may be omitted and the first conductive layer 410 may be disposed directly on the thin-film encapsulation layer 300. In other embodiments, the first and second insulating layers 401 and 403 are organic insulating layers.

Figure 19A:
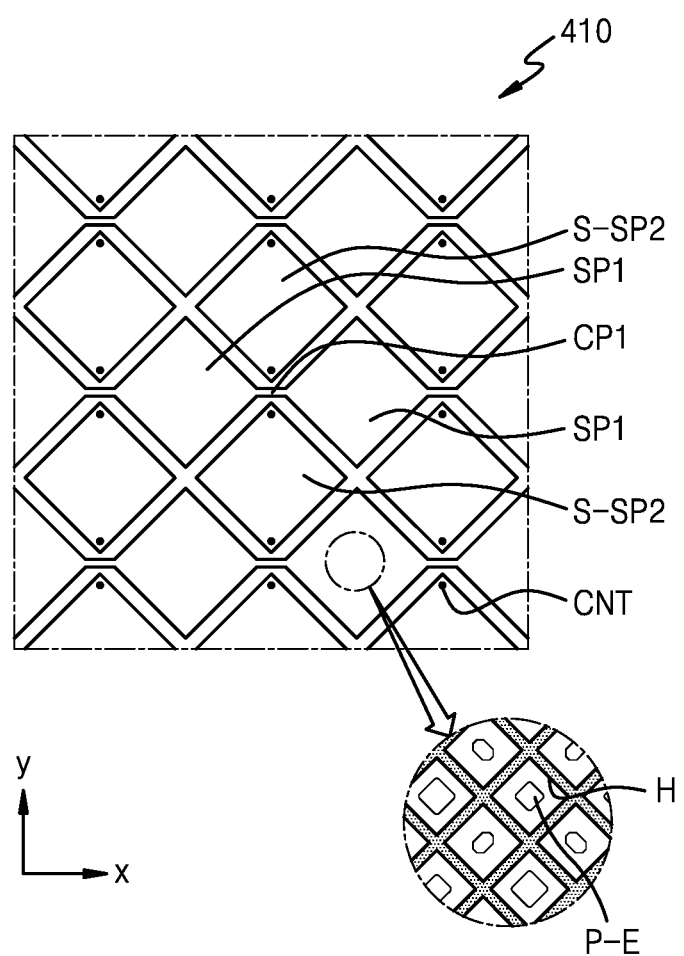
FIGS. 19A and 19B are plan views that respectively illustrate a first conductive layer and a second conductive layer of an input sensing layer according to an embodiment.
Figure 19B:
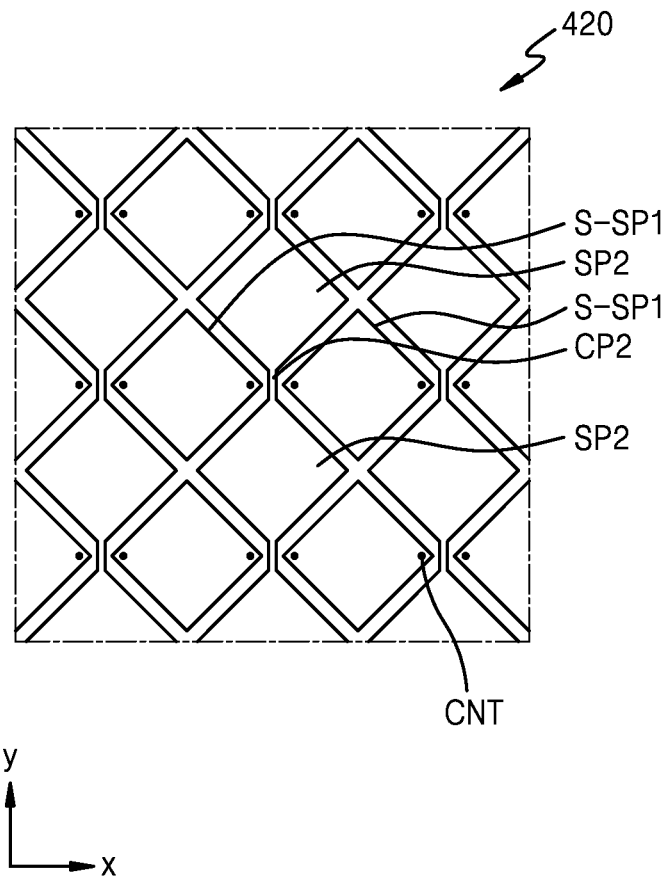
Figure 19C:
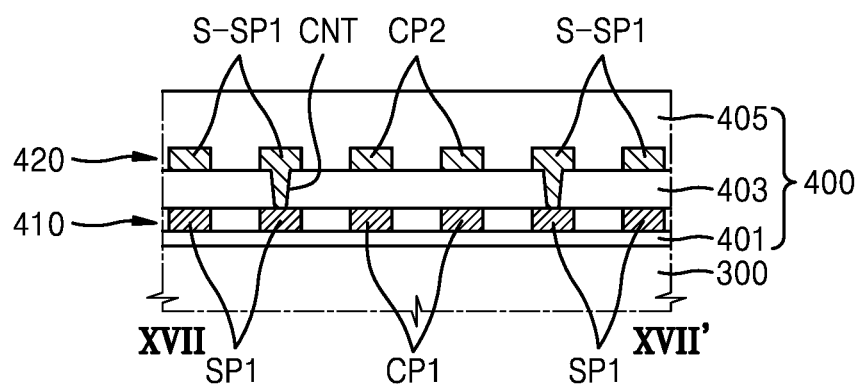
FIG. 19C is a cross-sectional view of an input sensing layer according to an embodiment.

FIGS. 19A and 19B are plan views that respectively illustrate the first conductive layer 410 and the second conductive layer 420 of the input sensing layer 400 according to other embodiments, and FIG. 19C is a cross-sectional view of the input sensing layer 400 according to an embodiment of FIGS. 19A and 19B and corresponds to a cross-section taken along line XVII-XVII' of FIG. 17.

Referring to FIGS. 19A and 19B, according to an embodiment, the first conductive layer 410 includes the first sensing electrodes SP1 and the first connection electrodes CP1 that connect the first sensing electrodes SP1, and the second conductive layer 420 includes the second sensing electrodes SP2 and the second connection electrodes CP2 that connect the second sensing electrodes SP2. The first conductive layer 410 further includes second auxiliary sensing electrodes S-SP2, each connected with the second sensing electrode SP2, and the second conductive layer 420 further include first auxiliary sensing electrodes S-SP1 connected with the first sensing electrode SP1.

Referring to an enlarged view of FIG. 19A, according to an embodiment, each of the first sensing electrodes SP1 includes a plurality of holes H. The holes H overlap an emission area P-E of a pixel P. In addition, the second sensing electrode SP2, the first auxiliary sensing electrode S-SP1, and the second auxiliary sensing electrode S-SP2 also include a plurality of holes, each corresponding to an emission area P-E of a pixel P as shown in the enlarged view of FIG. 19A.

Referring to FIG. 19C, according to an embodiment, the first auxiliary sensing electrode S-SP1 is connected to the first sensing electrode SP1 through contact holes CNT in the second insulating layer 403. Through this structure, a resistance of the first sensing electrode SP1 can be reduced. Likewise, the second sensing electrode SP2 is connected to the second auxiliary sensing electrode S-SP2 through contact holes in the second insulating layer 403. The first and second insulating layers 401 and 403 are inorganic insulating layers, and the first and second conductive layers 410 and 420 may each be a single layer or include multiple layers that include a metal such as aluminum or titanium. The third insulating layer 405 includes an organic insulating material.

Figure 20A:
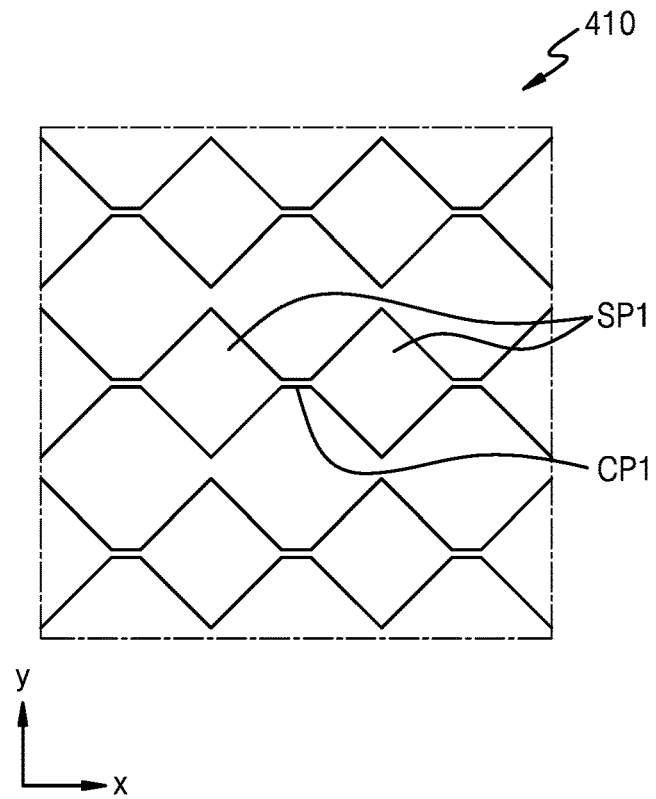
FIGS. 20A and 20B are plan views that respectively illustrate a first conductive layer and a second conductive layer of an input sensing layer according to an embodiment.
Figure 20B:
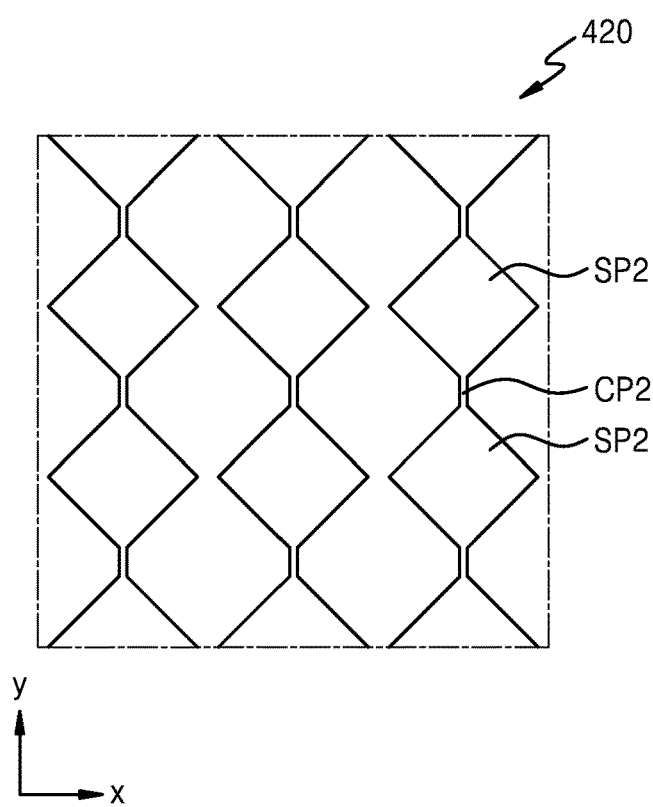
Figure 20C:
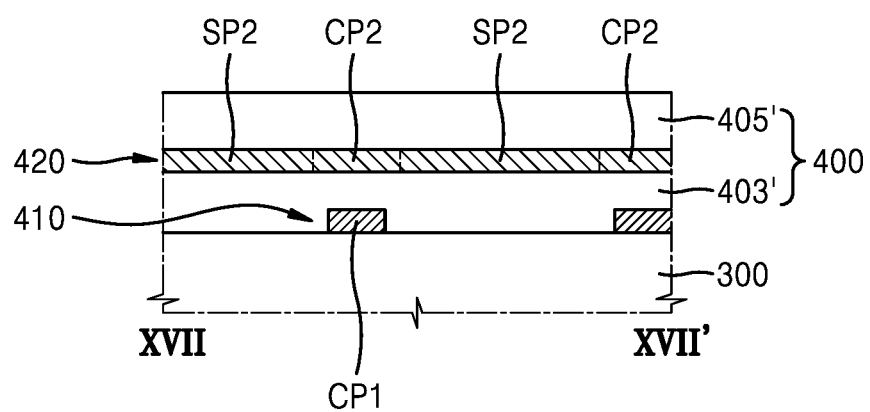
FIG. 20C is a cross-sectional view of an input sensing layer according to an embodiment.

FIGS. 20A and 20B are plan views that respectively illustrate the first conductive layer 410 and the second conductive layer 420 of the input sensing layer 400 according to other embodiments, and FIG. 20C is a cross-sectional view of the input sensing layer 400 according to an embodiment of FIGS. 20A and 20B and corresponds to a cross-section taken along line XVII-XVII' of FIG. 17.

Referring to FIGS. 20A and 20B, according to an embodiment, the first conductive layer 410 includes the first sensing electrodes SP1 and the first connection electrodes CP1 that connect the first sensing electrodes SP1, and the second conductive layer 420 includes the second sensing electrodes SP2 and the second connection electrodes CP2 that connect the second sensing electrodes SP2.

Referring to FIG. 20C, according to an embodiment, a second insulating layer 403' is interposed between the first conductive layer 410 and the second conductive layer 420. The second insulating layer 403' does not include separate contact holes. The first and second sensing electrodes SP1 and SP2 are electrically insulated from each other with the second insulating layer 403' therebetween. The second conductive layer 420 is covered by a third insulating layer 405'. The second insulating layer 403' is an organic insulating layer. In other embodiments, the second insulating layer 403' may be an organic insulating layer or an inorganic insulating layer, or may include both organic and inorganic layers.

Figure 21:
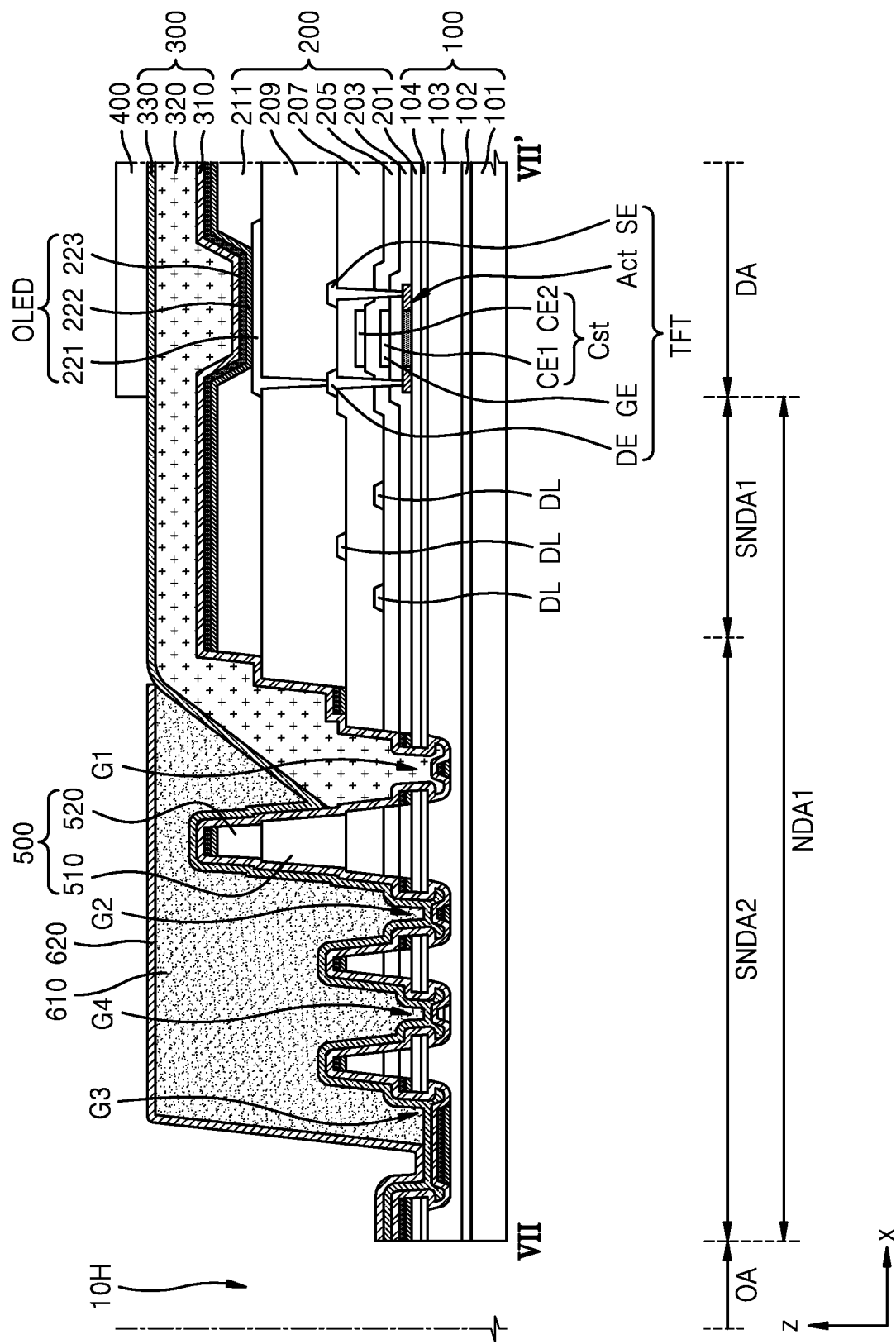
FIG. 21 is a cross-sectional view of a display panel according to an embodiment.

FIG. 21 is a cross-sectional view of a display panel according to another embodiment and corresponds to a cross-section taken along line VII-VII' of FIG. 6. The display panel of FIG. 21 differs from a display panel described with reference to FIG. 7 in that four or more grooves are formed in the first non-display area NDA1. In this regard, although FIG. 21 shows that one fourth groove G4 is located between the second groove G2 and the third groove G3, embodiments are not limited thereto, and one or more fourth grooves G4 may be located between the second groove G2 and the third groove G3. For example, a stacked structure on the fourth groove G4 can be the same as that on the second groove G2.

According to an embodiment, the number of grooves and a structure thereof described with reference to FIG. 21 can be incorporated into not only embodiments described above but also embodiments described below and embodiments derived therefrom.

Figure 22:
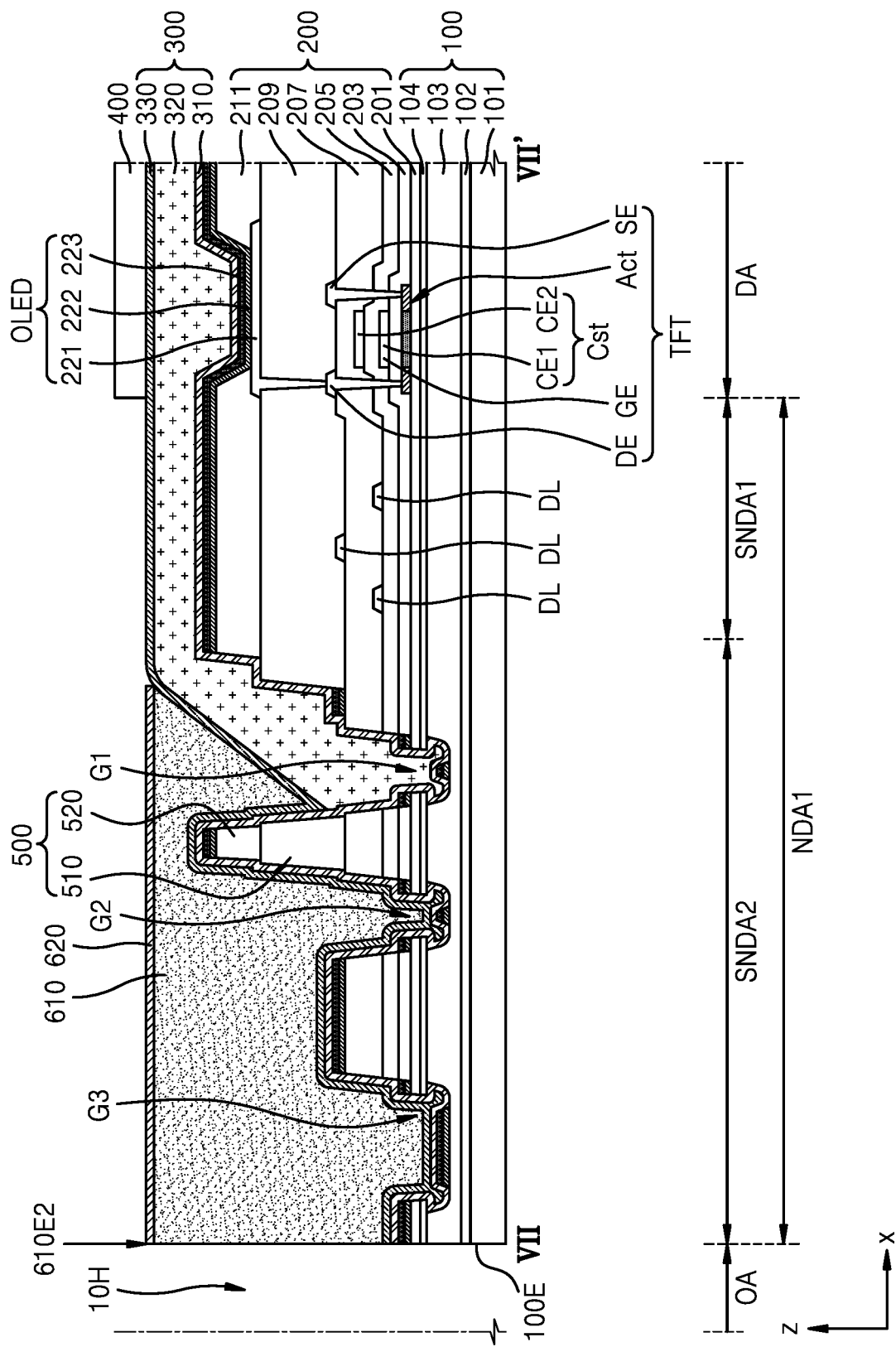
FIG. 22 is a cross-sectional view of a display panel according to an embodiment.

FIG. 22 is a cross-sectional view of a display panel according to other embodiments and corresponds to a cross-section taken along line VII-VII' of FIG. 6. Although a display panel described with reference to FIG. 7 shows a structure in which the second edge 610E2 of the planarization layer 610 is spaced apart from the opening area OA, such as the edge 100E of the substrate 100 by a predetermined interval, a location of the second edge 610E2 of the planarization layer 610 changes as shown in FIG. 22.

Referring to FIG. 22, according to an embodiment, the second edge 610E2 of the planarization layer 610 is located on the same vertical line as the edge 100E of the substrate 100. In other words, a lateral surface of the planarization layer 610 is located on the same vertical line as the edge 100E.

According to an embodiment, when a process of patterning the pre-planarization layer 610P described with reference to FIGS. 9 to 15 is omitted, a lateral surface of the planarization layer 610 is exposed to the opening 10H without being covered by the barrier layer 620 as shown in FIG. 22.

According to an embodiment, since the lateral surface of the planarization layer 610 is exposed to the opening 10H, moisture introduced through the planarization layer 610, which is an organic insulating layer, can propagate in a lateral (x) direction toward the display area DA. However, since the second inorganic encapsulation layer 330 is disposed between the planarization layer 610' and the organic encapsulation layer 320, propagation of moisture toward the display area DA beyond the second inorganic encapsulation layer 330 can be prevented.

The structure of the planarization layer 610 described with reference to FIG. 22 can be incorporated into not only embodiments described above but also embodiments described below and embodiments derived therefrom.

Figure 23:
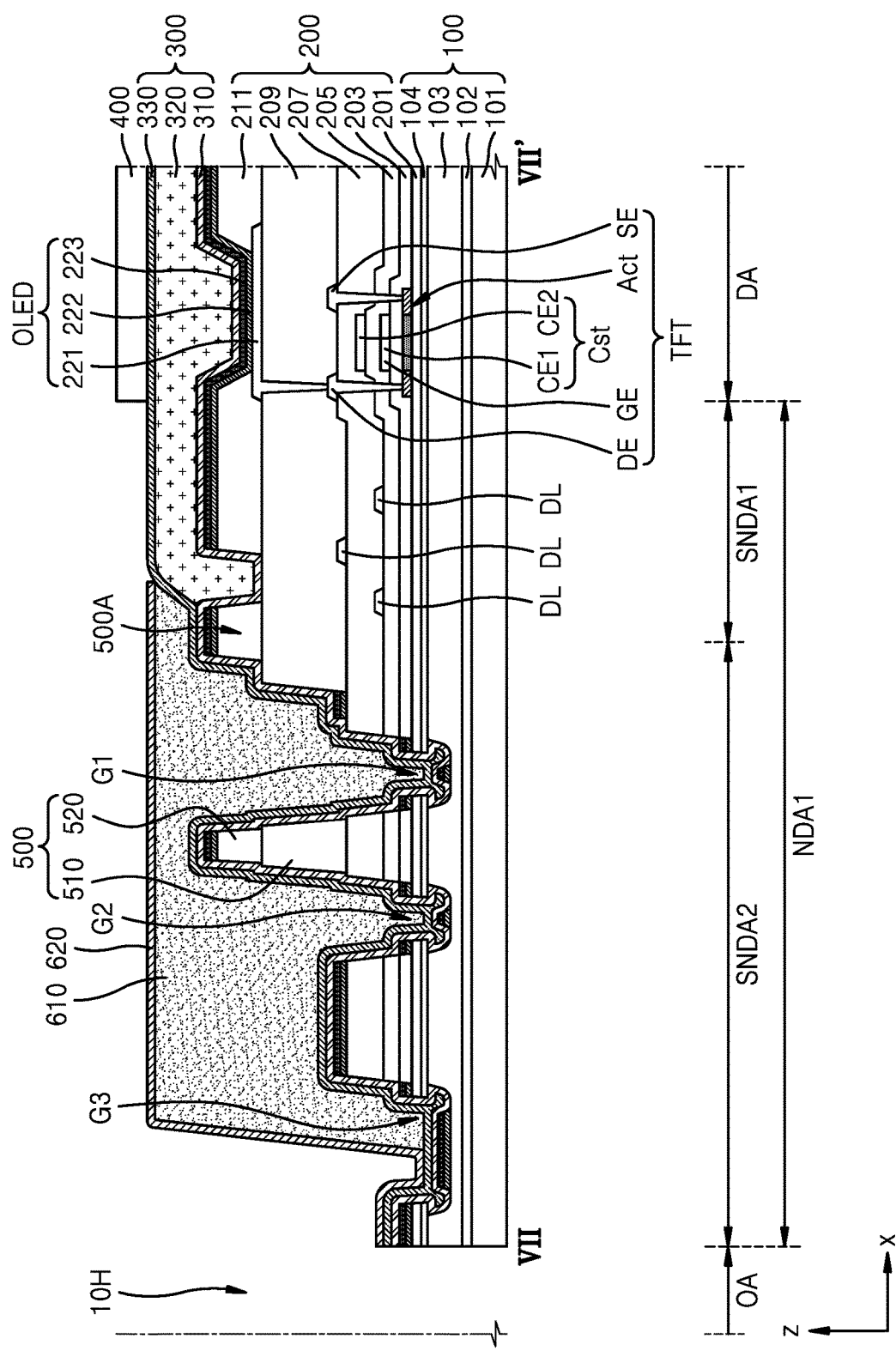
FIG. 23 is a cross-sectional view of a display panel according to an embodiment.

FIG. 23 is a cross-sectional view of a display panel according to other embodiments and corresponds to a cross-section taken along line VII-VII' of FIG. 6.

Referring to FIG. 23, according to an embodiment, a partition wall 500A is further disposed between the first groove G1 and the display area DA. Hereinafter, for ease of description, the partition wall 500 between the first groove G1 and the second groove G2 is referred to as a first partition wall, and the partition wall 500A between the first groove G1 and the display area DA is referred to as a second partition wall 500A.

According to an embodiment, the second partition wall 500A includes an organic insulating material. For example, the second partition wall 500A includes the same material as the pixel-defining layer 211. In an embodiment, the second partition wall 500A overlaps signal lines, such as data lines DL, that detour around the opening area OA.

According to an embodiment, during a process of manufacturing the organic encapsulation layer 320, a flow of a monomer is blocked by the second partition wall 500A. In this case, an edge of the organic encapsulation layer 320 is adjacent to an inner surface of the second partition wall 500A, and the organic encapsulation layer 320 does not cover the first to third grooves G1, G2 and G3. The first and second inorganic encapsulation layers 310 and 330 contact each other in the first to third grooves G1, G2 and G3.

According to an embodiment, the structure of the planarization layer 610 described with reference to FIG. 23 can be incorporated into not only embodiments described above but also embodiments described below and embodiments derived therefrom.

Figure 24:
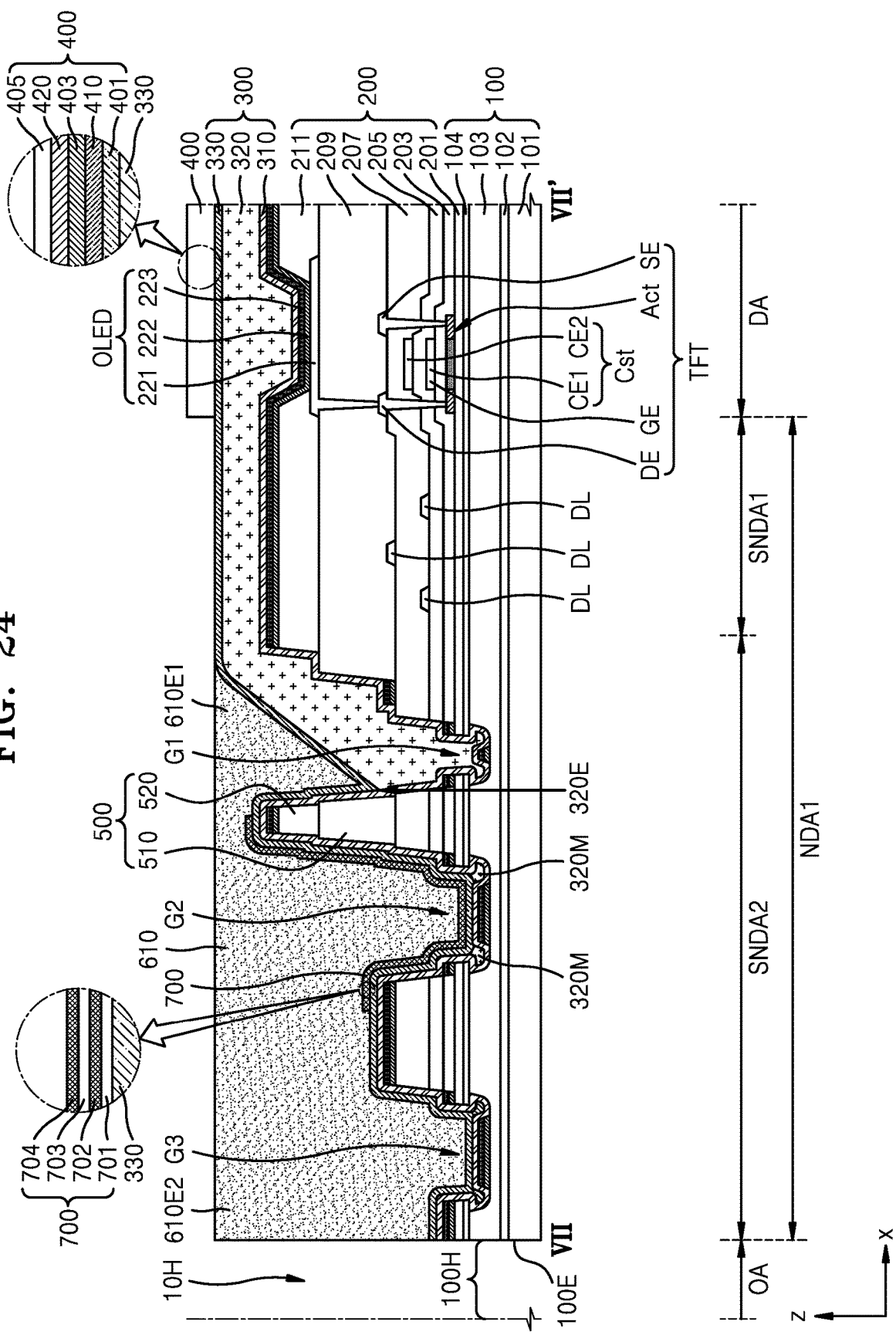
FIG. 24 is a cross-sectional view of a display panel according to an embodiment.

FIG. 24 is a cross-sectional view of a display panel according to other embodiments and corresponds to a cross-section taken along line VII-VII' of FIG. 6. FIG. 24 shows the opening area OA and the first non-display area NDA1 around the opening area OA, and the display area DA. The substrate 100 includes the first opening 100H that corresponds to the opening area OA. Hereinafter, the opening area OA may refer to the opening 10H of the display panel or the first opening 100H of the substrate 100. Since the structure of the display area DA of FIG. 24 is the same as that described with reference to FIG. 7, the first non-display area NDA1 is mainly described below.

According to an embodiment, referring to FIG. 24, the first non-display area NDA1 includes the first sub-non-display area SNDA1, which is relatively far from the opening area OA, and the second sub-non-display area SNDA2, which is relatively close to the opening area OA.

According to an embodiment, the first sub-non-display area SNDA1 is an area across which signal lines extend. Data lines DL of FIG. 24 correspond to the data lines that detour around the opening area OA described with reference to FIG. 5. The data lines DL are alternately disposed with an insulating layer therebetween as shown in FIG. 24. However, embodiments are not limited thereto, and in other embodiments, the data lines DL are disposed on the same insulating layer. When adjacent/neighboring data lines DL are respectively disposed on and under with an insulating layer, such as the second interlayer insulating layer 207, interposed therebetween, a gap between the adjacent data lines DL can be reduced and a width of the first non-display area NDA1 can be reduced. In addition, similar to the data lines DL in the first sub-non-display area SNDA1 of FIG. 24, the scan lines that detour around the opening area OA described with reference to FIG. 5 can also extend through the first sub-non-display area SNDA1.

According to an embodiment, the second sub-non-display area SNDA2 is an area in which the grooves are arranged. The first to third grooves G1, G2 and G3 are formed in the second sub-non-display area SNDA2. Each of the first to third grooves G1, G2 and G3 has an undercut structure. The first to third grooves G1, G2 and G3 are formed in a multi-layered structure that includes an inorganic layer and an organic layer. For example, the first to third grooves G1, G2 and G3 are formed by removing a portion of the substrate 100 that includes a plurality of layers.

According to an embodiment, the first to third grooves G1, G2 and G3 are formed by etching the second base layer 103 of the substrate 100 and the second inorganic layer 104 thereon. In this regard, FIG. 24 shows that the first to third grooves G1, G2 and G3 are formed by removing a portion of the second base layer 103 and a portion of the second inorganic layer 104. In an embodiment, the buffer layer 201, the gate insulating layer 203, and the first and second interlayer insulating layers 205 and 207 on the second inorganic layer 104 are removed to form a portion of the first to third grooves G1, G2, and G3.

According to an embodiment, each of the first to third grooves G1, G2 and G3 has an undercut structure. Each of the first to third grooves G1, G2 and G3 has an undercut structure in which a width of a portion that at least partially penetrates the second base layer 103 is greater than a width of a portion that penetrates the inorganic insulating layer(s), such as the second inorganic layer 104 or the buffer layer 201. Portions of the intermediate layer 222, such as the first and second functional layers 222a and 222c, and the opposite electrode 223 are separated by the undercut structure of the first to third grooves G1, G2 and G3.

According to an embodiment, the first inorganic encapsulation layer 310 of the thin-film encapsulation layer 300 covers the inner surfaces of the first to third grooves G1, G2 and G3. The organic encapsulation layer 320 covers and fills the first groove G1 on the first inorganic encapsulation layer 310. The organic encapsulation layer 320 is formed by coating a monomer over the substrate 100 and then hardening the monomer. To control a flow of the monomer and secure a thickness of the monomer, the partition wall 500 is provided between the first groove G1 and the second groove G2. The partition wall 500 includes an organic insulating material, and, for example, has a stacked structure that includes the first sub-wall portion 510 and the second sub-wall portion 520.

According to an embodiment, the edge 320E of the organic encapsulation layer 320 is spaced apart from the opening area OA or the edge 100E of the substrate 100 by a predetermined interval. In an embodiment, during a process of forming the organic encapsulation layer 320, a material of the organic encapsulation layer 320 is present in the second groove G2. In this regard, FIG. 24 shows that an organic material portion 320M is present in the second groove G2.

According to an embodiment, the second inorganic encapsulation layer 330 is disposed on the organic encapsulation layer 320 and covers inner surfaces of the second and third grooves G2 and G3. The second inorganic encapsulation layer 330 directly contacts the first inorganic encapsulation layer 310 in the second and third grooves G2 and G3.

According to an embodiment, the planarization layer 610 is disposed on a portion of the second inorganic encapsulation layer 330 that corresponds to the second and third grooves G2 and G3. A lower barrier layer 700 is disposed under the planarization layer 610.

According to an embodiment, the planarization layer 610 is disposed in the second sub-non-display area SNDA2 and covers at least one groove. The planarization layer 610 covers the second and third grooves G2 and G3 and at least partially fills at least one of the second or third grooves G2 or G3. As shown in FIG. 24, interior spaces of the second and third grooves G2 and G3 over the second inorganic encapsulation layer 330 are filled with the planarization layer 610. The planarization layer 610 increase a flatness of the display panel around the opening area OA by covering an area of the second sub-non-display area SNDA2 that is not covered by the organic encapsulation layer 320. Therefore, poor coupling, separation, or floating of elements such as a reflection prevention member or a window on the display panel 10 can be prevented when the elements are formed on the display panel 10.

According to an embodiment, the planarization layer 610 includes an organic insulating material. The planarization layer 610 includes a negative or positive photoresist. In other embodiments, the planarization layer 610 includes the same material as the third insulating layer described with reference to FIGS. 18C, 19C, and 20C.

According to an embodiment, the planarization layer 610 is disposed on the thin-film encapsulation layer 300. The planarization layer 610 is spatially separated from the organic encapsulation layer 320 by the second inorganic encapsulation layer 330. For example, when the planarization layer 610 is disposed on the second inorganic encapsulation layer 330, and the organic encapsulation layer 320 is disposed under the second inorganic encapsulation layer 330, the organic encapsulation layer 320 is spatially separated from the planarization layer 610. The organic encapsulation layer 320 does not directly contact the planarization layer 610. The planarization layer 610 has a thickness of at least about 5 μm.

According to an embodiment, a portion of the planarization layer 610 overlaps the organic encapsulation layer 320. The first edge 610E1 of the planarization layer 610 extends over the organic encapsulation layer 320 and overlaps the organic encapsulation layer 320. The second edge 610E2 of the planarization layer 610 faces the opening area OA. The second edge 610E2 is located on the same line as the edge 100E of the substrate 100.

According to an embodiment, the lower barrier layer 700 covers at least one groove. In this regard, FIG. 24 shows that the lower barrier layer 700 covers the second groove G2. When, during a process of manufacturing the display panel, a crack occurs in the inorganic layer, such as the first and second inorganic encapsulation layers 310 and 330 formed around the second groove G2, or the inorganic layer becomes separated, moisture can penetrate through the crack or the separated portion. To prevent the penetration of moisture, the lower barrier layer 700 covers an area in which a crack can occur on the second inorganic encapsulation layer 330, such as the second groove and a vicinity thereof.

According to an embodiment, the lower barrier layer 700 includes an inorganic material. For example, the lower barrier layer 700 includes an inorganic insulating layer or a metal layer, and may be a single layer or include multiple layers. In an embodiment, as shown in FIG. 24, the lower barrier layer 700 includes a plurality of sub-layers, including first to fourth lower layers 701, 702, 703 and 704. The lower barrier layer 700 may include at least one of layers included in the input sensing layer 400 described above with reference to FIGS. 18A to 20C.

For example, according to an embodiment, the first to fourth lower layers 701, 702, 703 and 704 respectively include the same materials as the first insulating layer 401, the first conductive layer 410, the second insulating layer 403, and the second conductive layer 420. The first and third lower layers 701 and 703 are inorganic insulating layers that include an inorganic insulating material such as silicon nitride, and the second and fourth lower layers 702 and 704 are metal layers that include Al, Ti, etc. In an embodiment, the second and fourth lower layers 702 and 704 have multiple layers of Ti/Al/Ti.

According to an embodiment, when the lower barrier layer 700 includes the same material as an inorganic material layer of the input sensing layer 400, the lower barrier layer 700 is formed during the same process as that which forms the inorganic material layer of the input sensing layer 400. Similarly, the planarization layer 610 includes the same material as an inorganic material layer of the input sensing layer 400 and may be formed during the same process as that which forms the inorganic material layer of the input sensing layer 400.

According to an embodiment, although FIG. 24 shows that an edge of the lower barrier layer 700 is spaced apart from the input sensing layer 400 by a predetermined interval, and the edge of the planarization layer 610 is spaced apart from the input sensing layer 400 by another predetermined interval, embodiments of the present disclosure are not limited thereto. The first and third lower layers 701 and 703 of the lower barrier layer 700 can be respectively connected with the first and second insulating layers 401 and 403 of the input sensing layer 400 as one body. As shown in FIG. 24, the second and fourth lower layers 702 and 704 of the lower barrier layer 700 are spaced apart from the first and second conductive layers 410 and 420 of the input sensing layer 400. The planarization layer 610 can be connected with the third insulating layer 405 of the input sensing layer 400 as one body.

According to an embodiment, although FIG. 24 shows that the lower barrier layer 700 includes four layers, embodiments are not limited thereto, and the lower barrier layer 700 may be a single layer or include two, three, five or more layers in other embodiments.

Figure 25:
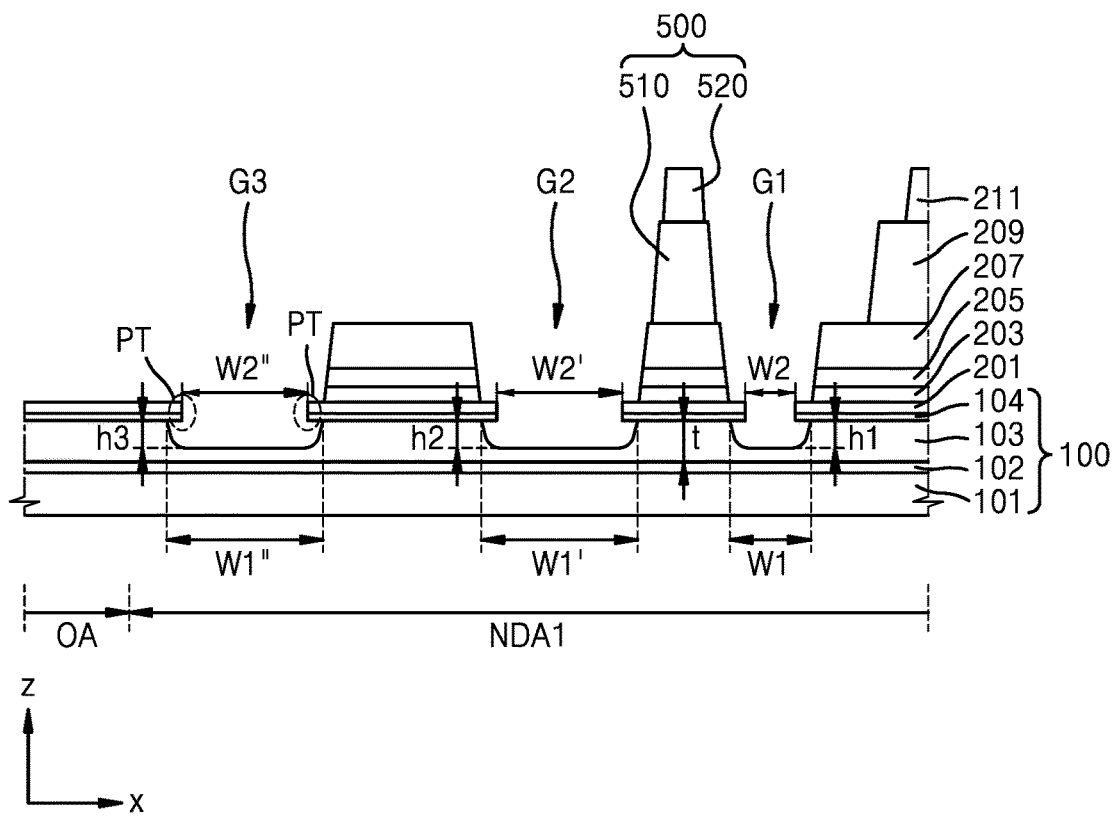
FIG. 25 is a cross-sectional view of an opening area and a first non-display area in a process of manufacturing a display panel, according to an embodiment.
Figure 26:
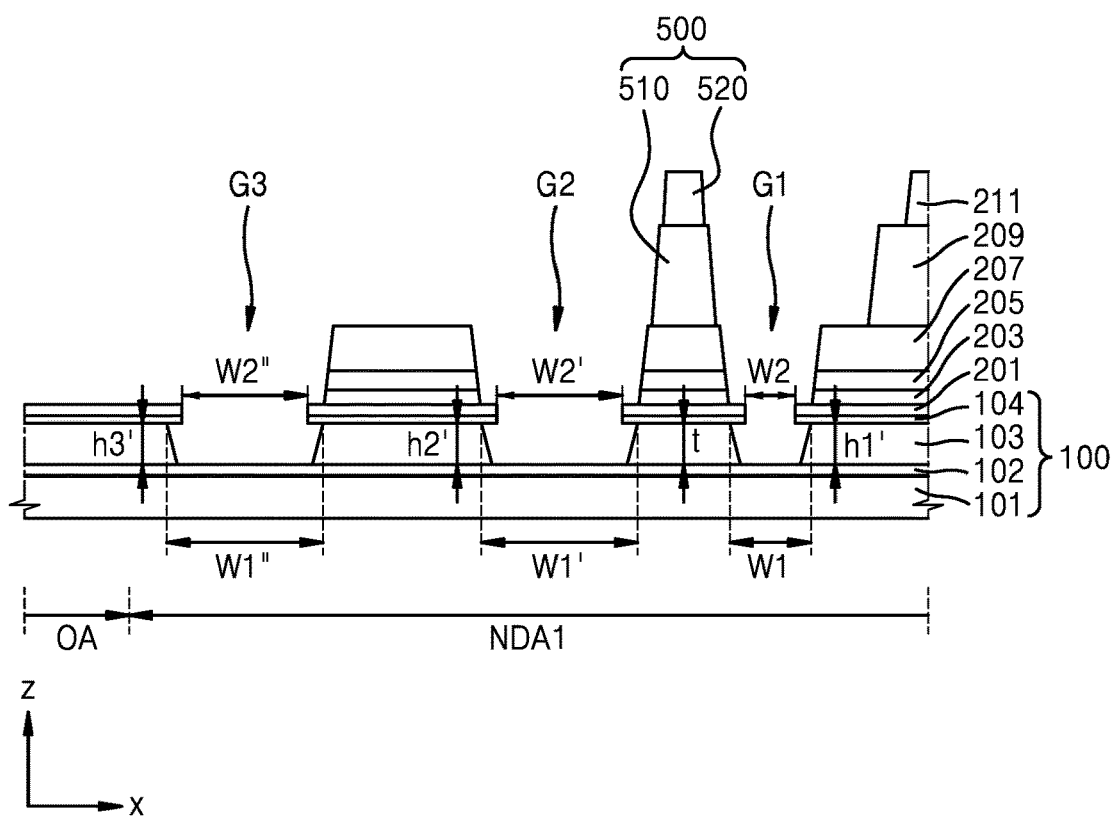
FIG. 26 is a cross-sectional view of a modified embodiment of FIG. 25.
Figure 27:
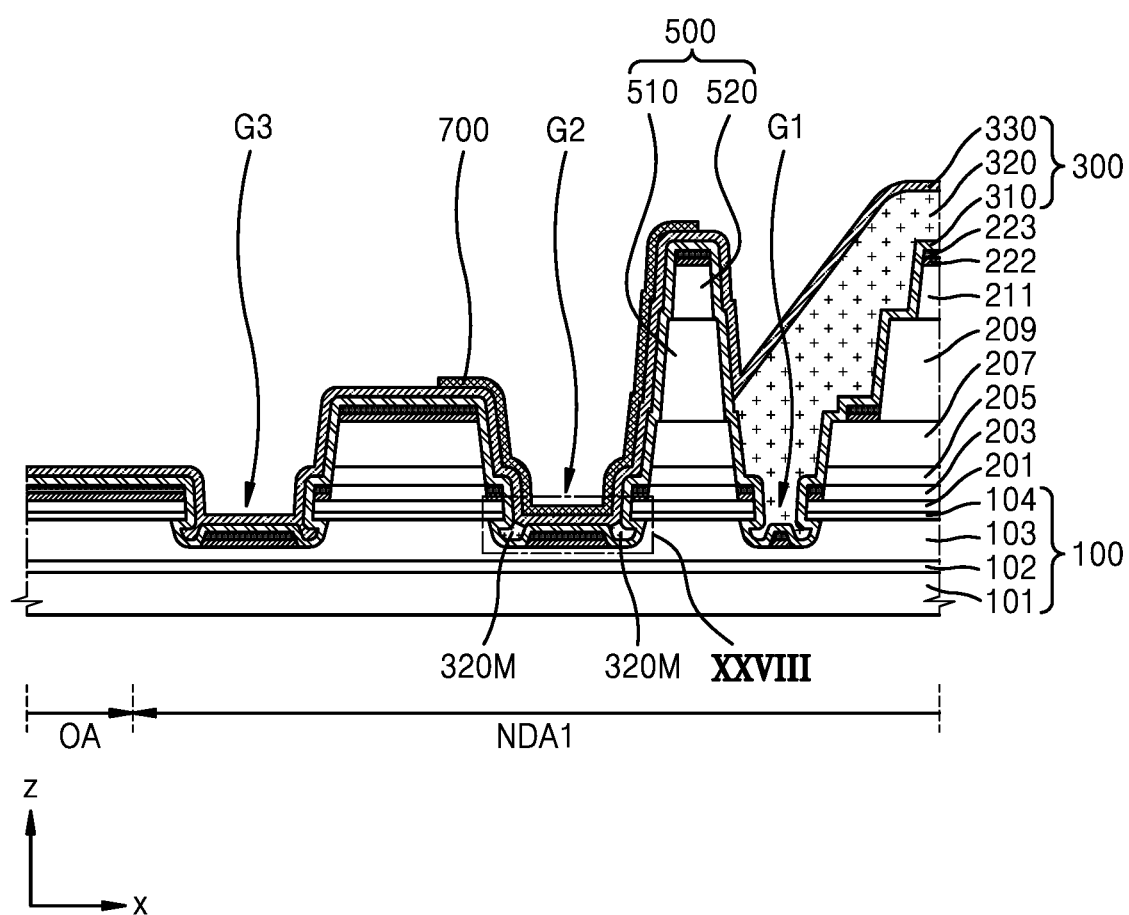
FIG. 27 is a cross-sectional view of an opening area and a first non-display area in a process of manufacturing a display panel, according to an embodiment.
Figure 28:
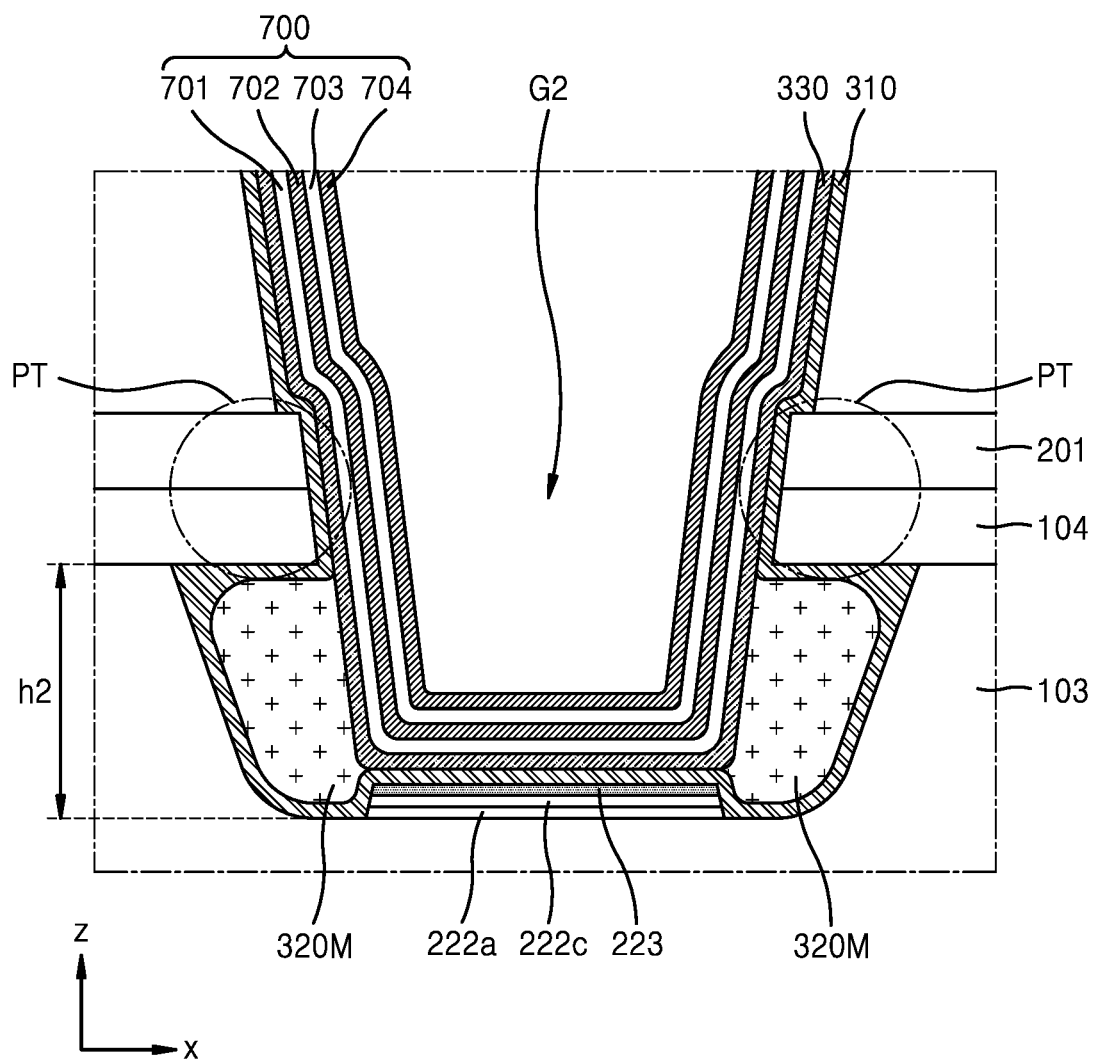
FIG. 28 is an enlarged view of portion XVIII of FIG. 27.
Figure 29:
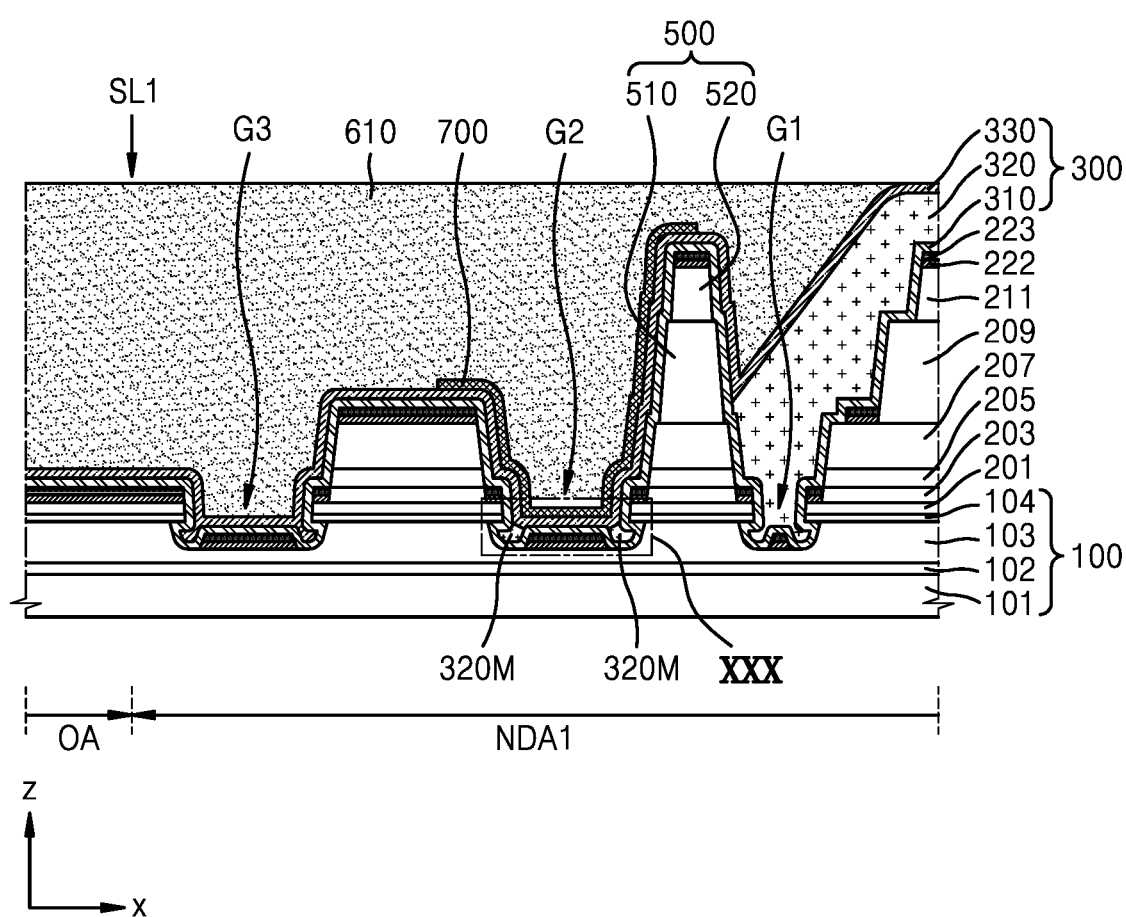
FIG. 29 is a cross-sectional view of an opening area and a first non-display area in a process of manufacturing a display panel, according to an embodiment.
Figure 30:
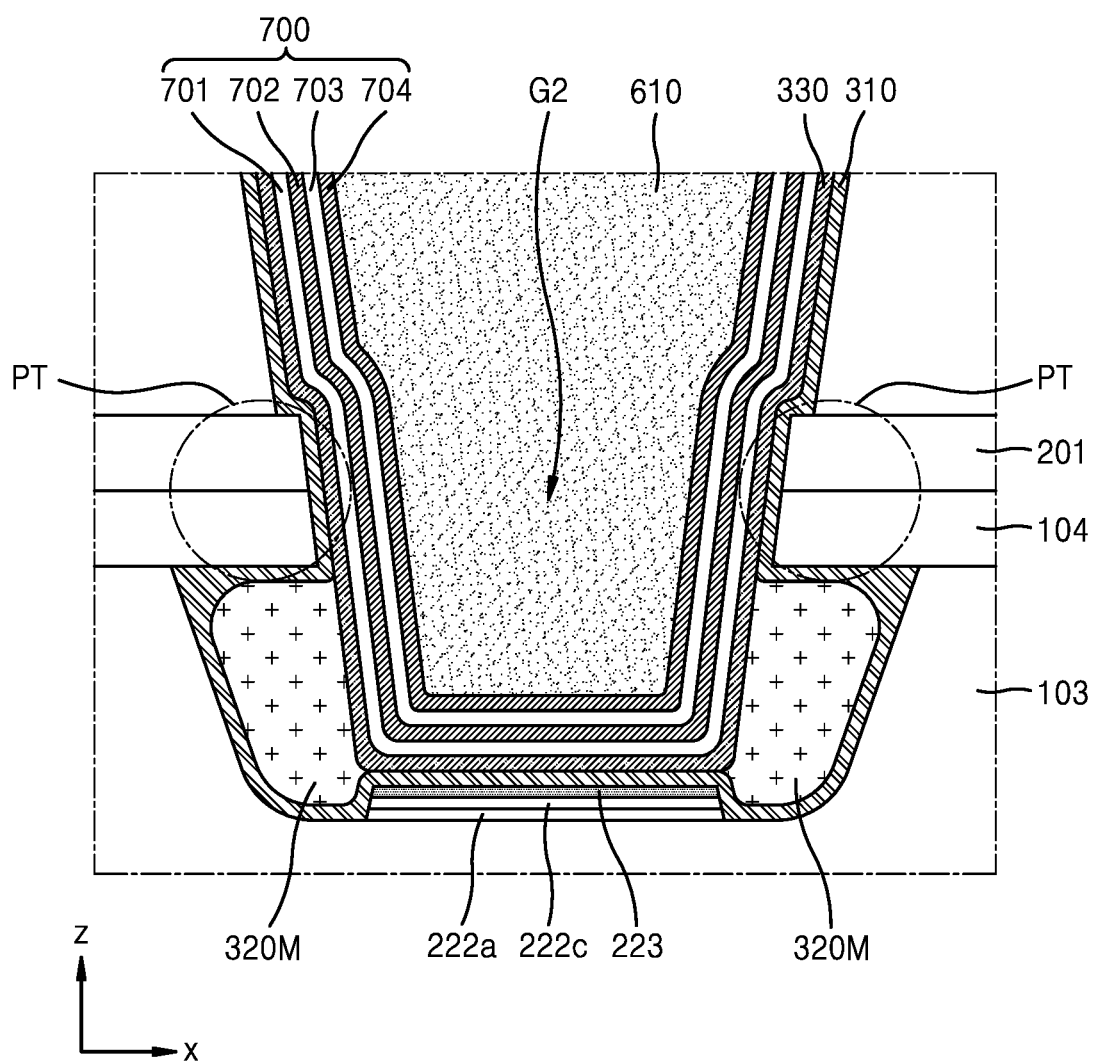
FIG. 30 is an enlarged view of portion XXX of FIG. 29.
Figure 31:
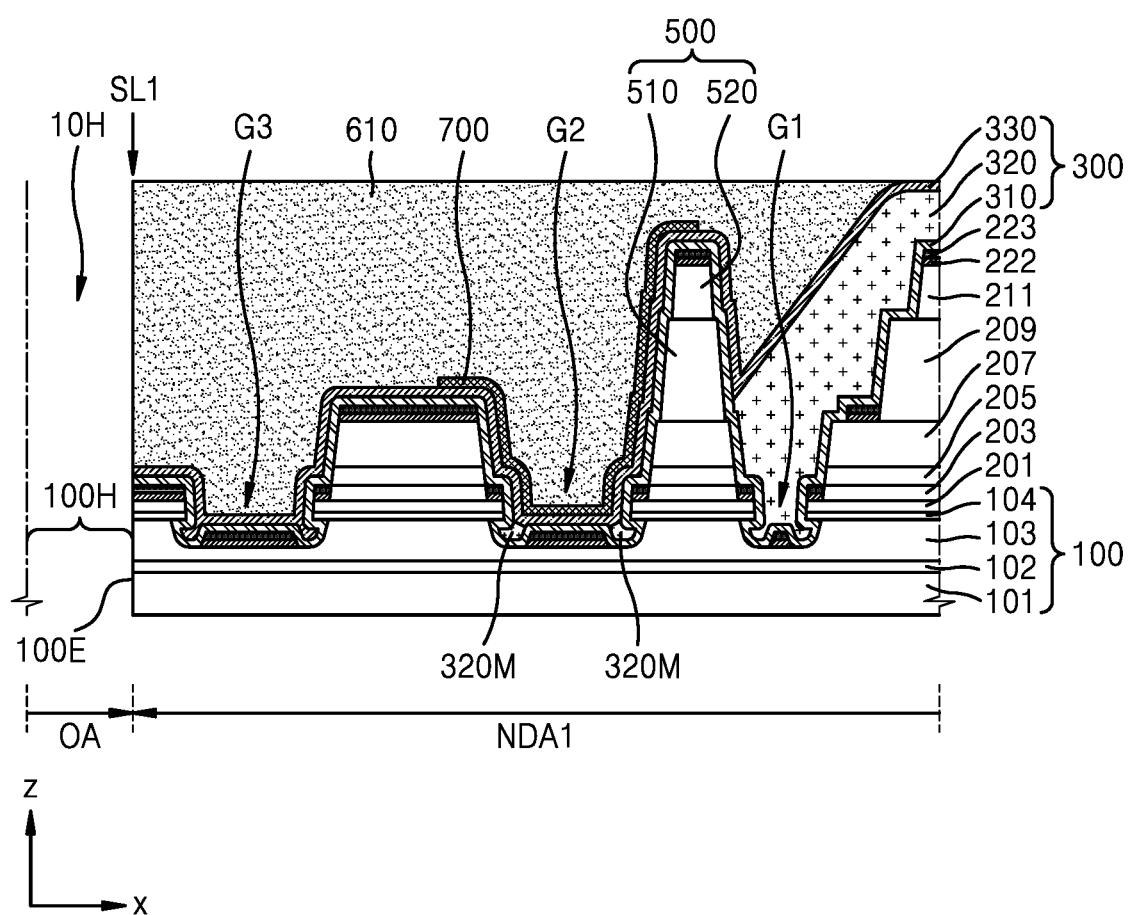
FIG. 31 is a cross-sectional view of an opening area and a first non-display area in a process of manufacturing a display panel, according to an embodiment.

FIGS. 25, 26, 27, 29, and 31 are cross-sectional views of the opening area OA and the first non-display area NDA1 according to a process of manufacturing a display panel in an embodiment. FIG. 28 is an enlarged view of a portion XXVII of FIG. 27, and FIG. 30 is an enlarged view of a portion XXX of FIG. 29. FIG. 25 is a cross-sectional view in which the first to third grooves of the display panel are formed, FIG. 26 is a cross-sectional view in which the first to third grooves of the display panel are formed according to another embodiment, FIG. 27 is a cross-sectional view in which the intermediate layer to the lower barrier layer are formed on the display panel of FIG. 25, FIG. 29 is a cross-sectional view in which the planarization layer is formed, and FIG. 31 is a cross-sectional view of a state after a cutting or scribing process.

Referring to FIG. 25, according to an embodiment, the first to third grooves G1, G2, and G3 are formed by removing a portion of a multi-layered film. The multi-layered film includes at least one a partial layer of the substrate 100. The multi-layered film has a stacked structure that includes an organic insulating material such as a polymer resin and a layer that includes an inorganic insulating material disposed thereon. For example, the multi-layered film includes the second base layer 103 that includes a polymer resin, and inorganic insulating layer(s) such as the second inorganic layer 104 or the buffer layer 201 on the second base layer 103. Although the second inorganic layer 104 and the buffer layer 201 are respectively referred to by different names, such as the inorganic insulating layers between the second base layer 103 and the thin film transistor TFT in FIG. 25, the second inorganic layer 104 may be considered to be a sub-layer of the buffer layer 201, which has a multi-layered structure, or the buffer layer 201 may be considered to be a sub-layer of the second inorganic layer 104, which has a multi-layered structure, depending on an embodiment.

According to an embodiment, the first to third grooves G1, G2 and G3 are formed by removing a portion of the second base layer 103 and a portion of the inorganic insulating layer(s) thereon. FIG. 25 shows that portions of the second base layer 103 and the second inorganic layer 104 are removed through an etching process. Portions of the buffer layer 201, the gate insulating layer 203, and the first and second interlayer insulating layers 205 and 207 are also removed through an etching process. An etching process that removes a portion of the second base layer 103, and an etching process that removes the inorganic insulating layer(s) on the second base layer 103 are performed separately. The partition wall 500 is disposed between the first groove G1 and the second groove G2 and includes the first sub-wall portion 510, which includes the same material as the organic insulating layer 209, and the second sub-wall portion 520, which includes the same material as the pixel-defining layer 211.

According to an embodiment, a width W1 of a portion of the first groove G1 that at least partially penetrates the second base layer 103 in a thickness direction is greater than a width W2 of a portion of the first groove G1 that penetrates the buffer layer 201 or the second inorganic layer 104. Therefore, the first groove G1 has an undercut structure. A lateral surface of the buffer layer 201 or the second inorganic layer 104 protrudes further toward a center of the first groove G1 than a lateral surface of the second base layer 103. The portions of the buffer layer 201 or the second inorganic layer 104 that protrude further toward the center of the first groove G1 in a direction parallel to the top surface of the substrate 100 correspond to a pair of protruded tips PT.

According to an embodiment, like the first groove G1, the second and third grooves G2 and G3 have an undercut/eave structure. Widths W1' and W1" of portions of the second and third grooves G2 and G3 that penetrate into the second base layer 103 are greater than widths W2' and W2" of portions of the second and third grooves G2 and G3 that penetrate the buffer layer 201 or the second inorganic layer 104. Likewise, lateral surfaces of the buffer layer 201 or the second inorganic layer 104 that delimit the second and third grooves G2 and G3 protrude further toward a center of the first groove G1 than a lateral surface of the second base layer 103 and form protruded tips thereof. The protruded tips PT of the buffer layer 201 or the second inorganic layer 104 protrude toward the center of each of the first to third grooves G1, G2, and G3 by about 0.7 μm to 1.5 μm.

According to an embodiment, FIG. 25 shows that each of the first to third grooves G1, G2, and G3 includes a portion that penetrates the inorganic insulating layer, such as the portion formed in the buffer layer 201 and the second inorganic layer 104, and a recess formed in the second base layer 103. The depths h1, h2 and h3 of each of recesses formed in the second base layer 103 are less than a thickness t of the second base layer 103. Bottom surfaces of the first to third grooves G1, G2 and G3 form a virtual surface between a top surface and a bottom surface of the second base layer 103.

In other embodiments, as shown in FIG. 26, each of the first to third grooves G1, G2 and G3 includes a portion that penetrates the inorganic insulating layer, such as a hole formed in the buffer layer 201 and the second inorganic layer 104, and a portion that penetrates the second base layer 103. The depths h1', h2' and h3' of each of holes formed in the second base layer 103 are substantially equal to the thickness t of the second base layer 103, and thus the bottom surfaces of the first to third grooves G1, G2 and G3 are coplanar to the bottom surface of the second base layer 103. Depths h1, h2, h3, h1', h2', and h3' of the recess or hole are at least about 2 μm.

Hereinafter, the structure of FIG. 25 in which the bottom surfaces of the first to third grooves G1, G2, and G3 form a virtual surface between the top surface and the bottom surface of the second base layer 103 is mainly described for convenience of description, it is to be understood that the second base layer 103 can have the structure described with reference to FIG. 26 in embodiments described below and embodiments derived therefrom.

Referring to FIG. 27, according to an embodiment, the intermediate layer 222 and the opposite electrode 223 are formed over the substrate 100 and the first to third grooves G1, G2 and G3. The intermediate layer 222 and the opposite electrode 223 can be formed by thermal deposition, etc.

According to an embodiment, portions of the intermediate layer 222, such as the first and second functional layers 222a and 222c, and the opposite electrode 223, are respectively formed as one body in the display area DA and the first non-display area NDA1. As shown in FIG. 28, the first and second functional layers 222a and 222c are separated in the first non-display area NDA1 by the undercut structure of the second groove G2. The first and second functional layers 222a and 222c are separated and the opposite electrode 223 is also separated by the pair of protruded tips PT that define the undercut structure of the second groove G2. Because of the undercut structures of the first and second grooves G1 and G2 as shown in FIG. 27, the first or/and second functional layers 222a or/and 222c, and the opposite electrode 223 are separated.

A layer over the substrate 100 that includes an organic material can serve as a moisture transmission path for foreign substances such as moisture or oxygen. Since the first and second functional layers 222a and 222c, which include an organic material, are separated by the first to third grooves G1, G2 and G3, propagation of moisture in a lateral (x) direction can be prevented and damage of an organic light-emitting diode may be prevented.

According to an embodiment, unlike the intermediate layer 222 and the opposite electrode 223, since the first inorganic encapsulation layer 310 of the thin-film encapsulation layer 300 has better step coverage than the first or second functional layers 222a or 222c, and the opposite electrode 223, the first inorganic encapsulation layer 310 can be continuously formed. The first inorganic encapsulation layer 310 entirely and continuously covers the inner surfaces of the first to third grooves G1, G2 and G3.

According to an embodiment, the organic encapsulation layer 320 is formed on the first inorganic encapsulation layer 310. The first groove G1 is covered by the organic encapsulation layer 320, and an interior space of the first groove G1 over the first inorganic encapsulation layer 310 is at least partially filled with the organic encapsulation layer 320. During a process of manufacturing the organic encapsulation layer 320, a flow of a monomer is controlled by the partition wall 500 between the first groove G1 and the second groove G2. The organic encapsulation layer 320 formed when the monomer hardens, and the flow of the monomer is blocked by the partition wall 500 so that the monomer does not flow beyond the partition wall 500.

In an embodiment, as shown in FIGS. 27 and 28, during the process of manufacturing the organic encapsulation layer 320, a portion of the organic material portion 320M is disposed in the second groove G2. For example, during a process of coating a monomer, a portion of the monomer may fall into the second groove G2 and harden to form the organic material portion 320M. In another embodiment, a process of hardening the monomer and a process of ashing are performed. In this case, the organic material portion 320M that is not removed by the ashing process remains in the second groove G2. The organic material portion 320M remains under the protruded tip structure of the second groove G2. The organic material portion 320M includes the same material as the organic encapsulation layer 320. The organic material portion 320M is separated from the organic encapsulation layer 320.

According to an embodiment, the second inorganic encapsulation layer 330 is formed on the organic encapsulation layer 320. In the first groove G1, the first inorganic encapsulation layer 310 does not directly contact the second inorganic encapsulation layer 330 due to the organic encapsulation layer 320. In contrast, in the second and third grooves G2 and G3, the first and second inorganic encapsulation layers 310 and 330 contact each other. As shown in FIG. 27, the first and second inorganic encapsulation layers 310 and 330 are formed in not only the first non-display area NDA1 but also the opening area OA.

Next, according to an embodiment, the lower barrier layer 700 is formed on the second inorganic encapsulation layer 330. The lower barrier layer 700 covers a portion of the first non-display area NDA1, such as the second groove G2. In an embodiment, as shown in FIG. 28, the lower barrier layer 700 includes a plurality of layers that include the first to fourth lower layers 701, 702, 703, and 704. A depth h2 in a vertical (z) direction, i.e. a direction perpendicular to the top surface of the substrate 100, of the second groove G2 under the protruded tips PT is greater than a sum of the thicknesses of the first and second functional layers 222a and 222c, the opposite electrode 223, the first and second inorganic encapsulation layers 310 and 330, and the lower barrier layer 700.

According to an embodiment, the first to fourth lower layers 701, 702, 703, and 704 are sequentially formed on the second inorganic encapsulation layer 330. Since an interior space of the second groove G2 under the protruded tips PT is at least partially filled with the organic material portion 320M, the layers of the lower barrier layer 700 are continuously formed around the protruded tips PT without being disconnected.

Referring to FIG. 29, according to an embodiment, the planarization layer 610 is formed on the lower barrier layer 700. The planarization layer 610 includes the same material as the organic material of at least one of the layers included in the input sensing layer 400 described with reference to FIGS. 18A to 20C. Alternatively, the planarization layer 610 may include a negative or positive photoresist, or include the same material as the organic encapsulation layer 320 of the thin-film encapsulation layer 300.

Referring to FIG. 30, according to an embodiment, the planarization layer 610 at least partially fills the second groove G2. For example, the planarization layer 610 at least partially fills an interior space of the second groove G2 over the lower barrier layer 700.

Next, According to an embodiment, when a laser cutting or scribing process is performed along the first line SCL1 that corresponds to the opening area OA, the opening 10H of the display panel is formed as shown in FIG. 31. The first opening 100H is formed in the substrate 100 through a cutting or scribing process. When a crack forms in the inorganic insulating layer during a process of cutting or scribing the substrate 100, the crack can propagate in the lateral (x) direction, but the crack stops near the protruded tips of the third groove G3 or the second groove G2. Therefore, the crack does not propagate toward the display area.

Although a laser cutting or scribing process has been described as a method that forms the first opening 100H in the substrate 100 in an above embodiment, various other methods such as mechanical polishing, etc., can be used in other embodiments.

Figure 32:
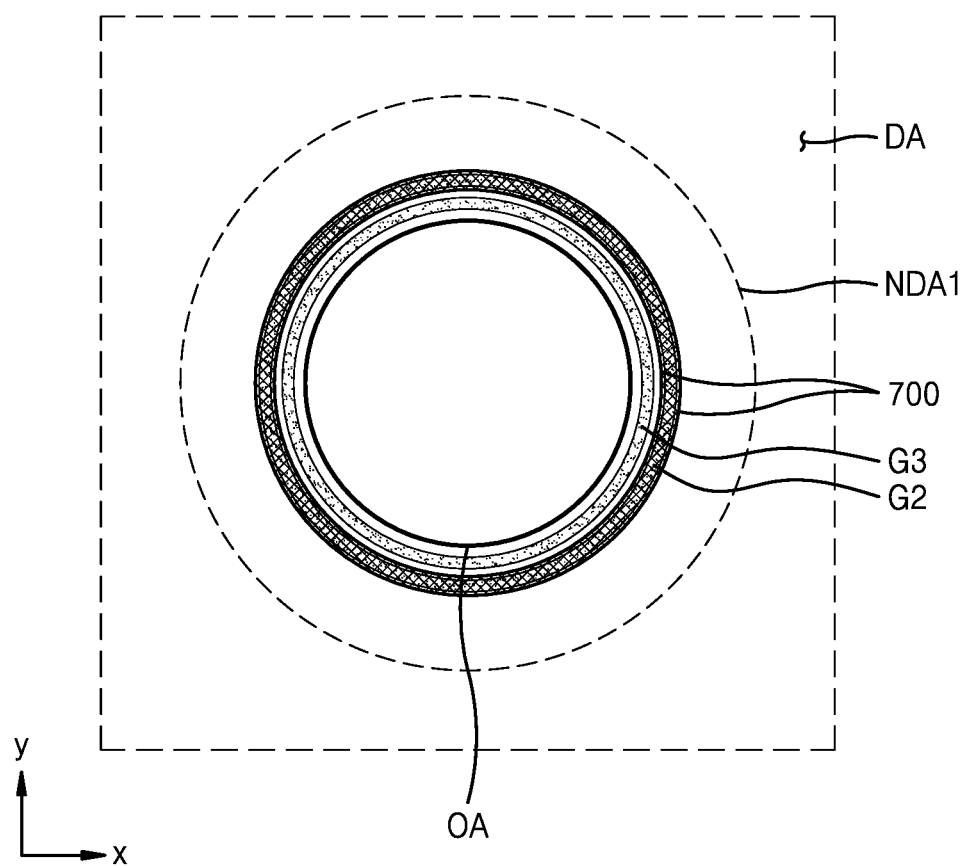
FIG. 32 is a plan view of a lower barrier layer in a display panel according to an embodiment.

FIG. 32 is a plan view of the lower barrier layer 700 in a display panel according to an embodiment. In FIG. 32, the first groove G1 is omitted, for convenience of description.

Referring to FIG. 32, according to an embodiment, the lower barrier layer 700 has a ring shape that surrounds the opening area OA. The lower barrier layer 700 covers the second groove G2 and has a width greater than a width of the second groove G2.

According to an embodiment, a cross-sectional structure of the first non-display area NDA1 shown in FIG. 32 is the same as a structure described with reference to FIGS. 24 to 31. That is, a structure described with reference to FIGS. 24 to 31 surrounds the opening 10H, that is, the opening area OA as shown in FIG. 32. For example, the lower barrier layer 700 between the opening area OA and the display area DA has a ring shape that surrounds the opening area OA in a plan view as shown in FIG. 32. In an embodiment, the planarization layer 610 described with reference to FIGS. 24 to 31 also has a ring shape that surrounds the opening area OA in a plan view. In addition, the partition wall 500 has a ring shape that surrounds the opening area OA in a plan view.

Figure 33:
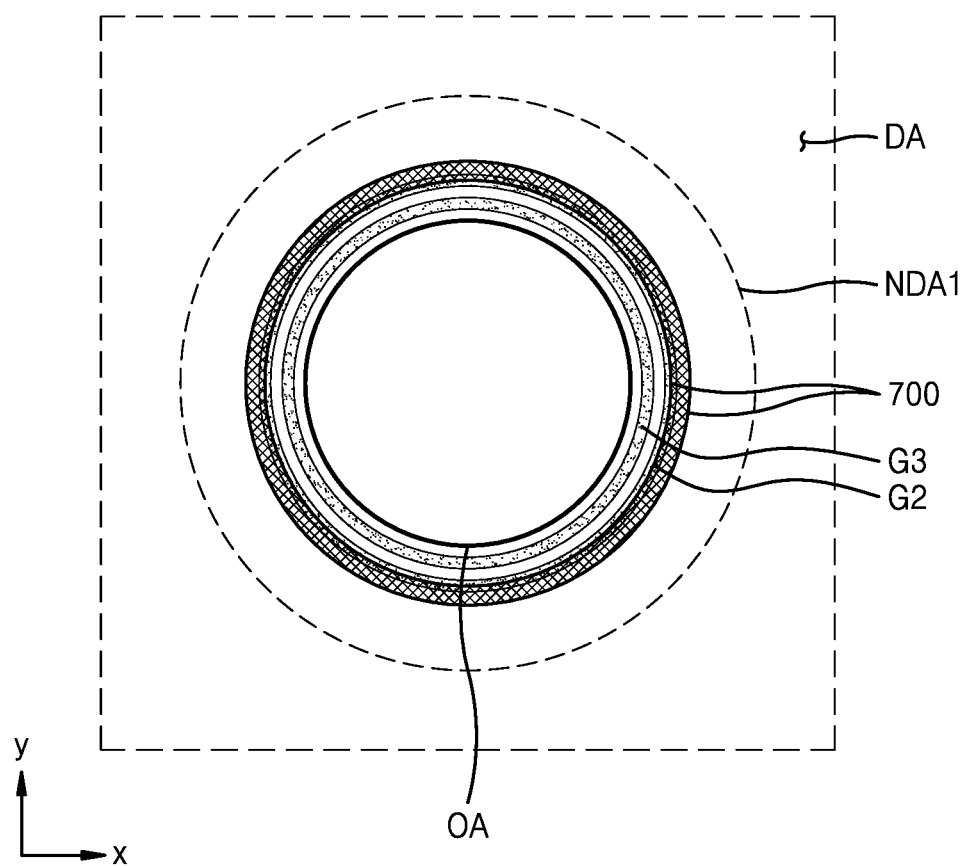
FIG. 33 is a plan view of a lower barrier layer in a display panel according to an embodiment.

FIG. 33 is a plan view of the lower barrier layer 700 in a display panel according to an embodiment. Like FIG. 32, FIG. 33 omits the first groove G1 for convenience of description.

Referring to FIG. 33, according to an embodiment, the lower barrier layer 700 has a ring shape that surrounds the opening area OA and covers a partial area of the second groove G2 in a plan view. For example, a width of the lower barrier layer 700 is less than a width of the second groove G2. The lower barrier layer 700 covers one side of the second groove G2, such as one of the pair of protruded tips that extend into the second groove G2 as described with reference to FIG. 28, such as the right protruded tip PT, shown in FIG. 31.

According to an embodiment, although FIGS. 32 and 33 show that the lower barrier layer 700 has a closed curved shape in a plan view, embodiments of the present disclosure are not limited thereto. In other embodiments, the lower barrier layer 700 has an open curved shape in a plan view.

Figure 34:
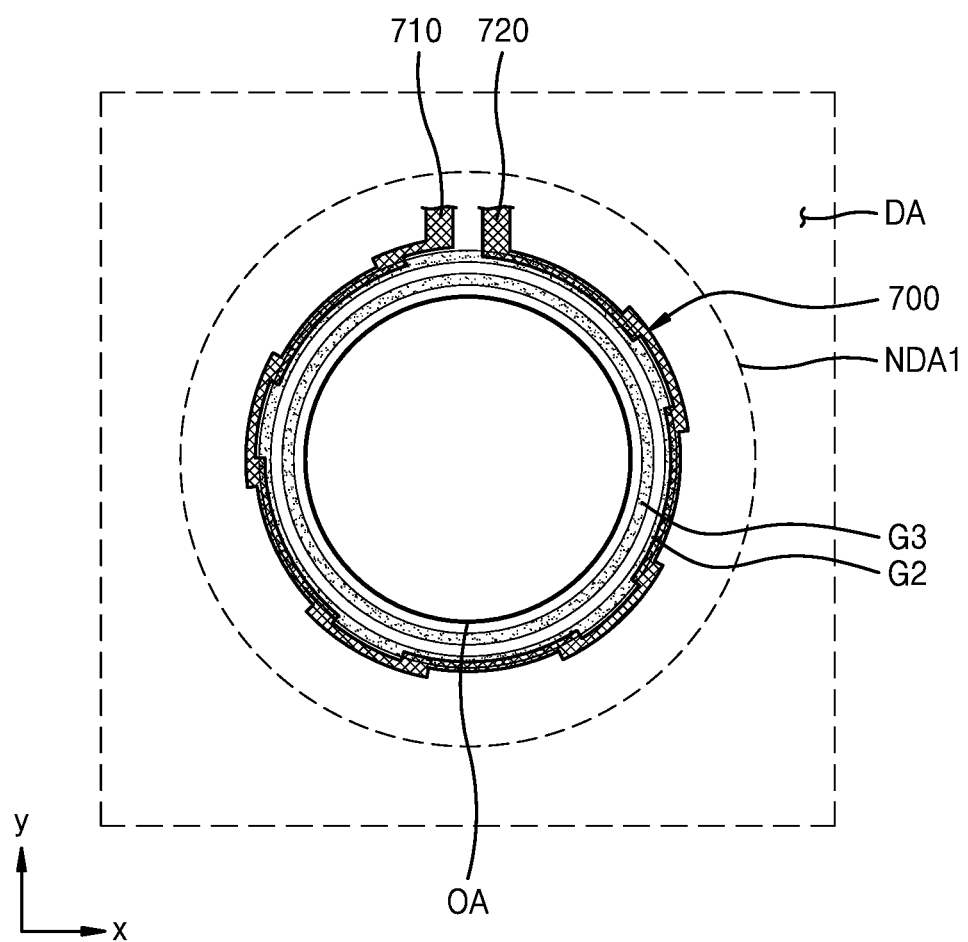
FIG. 34 is a plan view of a lower barrier layer in a display panel according to an embodiment.

FIG. 34 is a plan view of the lower barrier layer 700 in a display panel according to an embodiment. Like FIG. 32, FIG. 34 omits the first groove G1 for convenience of description.

Referring to FIG. 34, according to an embodiment, the lower barrier layer 700' has an open curved shape in the first non-display area NDA1. A first end portion 710 and a second end portion 720 of the lower barrier layer 700' are spaced from each other. In addition, the lower barrier layer 700' of FIG. 34 has a stacked structure that includes a plurality of layers as described with reference to FIG. 24.

According to an embodiment, at least one of layers of the lower barrier layer 700' includes a conductive material. For example, a second lower layer or a fourth lower layer in the lower barrier layer 700' can be used as a wiring. For example, a predetermined signal transmitted to the first end portion 710 can be received from the second end portion 720 by way of the conductive material layer. When a portion of the lower barrier layer 700' is cracked, a signal might not be received from the second end portion 720. As described above, the lower barrier layer 700' can be used for determining the occurrence of cracks that can occur during a process of manufacturing a display panel or after a display panel is manufactured.

According to an embodiment, a portion of the lower barrier layer 700', such as a portion between the first end portion 710 and the second end portion 720, has a shape of a square-wave wrapped around a circle as shown in FIG. 34. A first portion of the lower barrier layer 700' extends along an edge of the second groove G2 to surround a portion of the second groove G2, and a second portion of the lower barrier layer 700' extends over the second groove toward the center of the opening area OA by a predetermined interval. The first portion and the second portion are repeatedly arranged and have a square-wave shape in plan view.

Although an above embodiment has been described as having the lower barrier layer 700 located in the first non-display area NDA1 to cover the second groove G2, embodiments of the present disclosure are not limited thereto. In other embodiments, the lower barrier layer 700 covers the second and third grooves G2 and G3.

Figure 35:
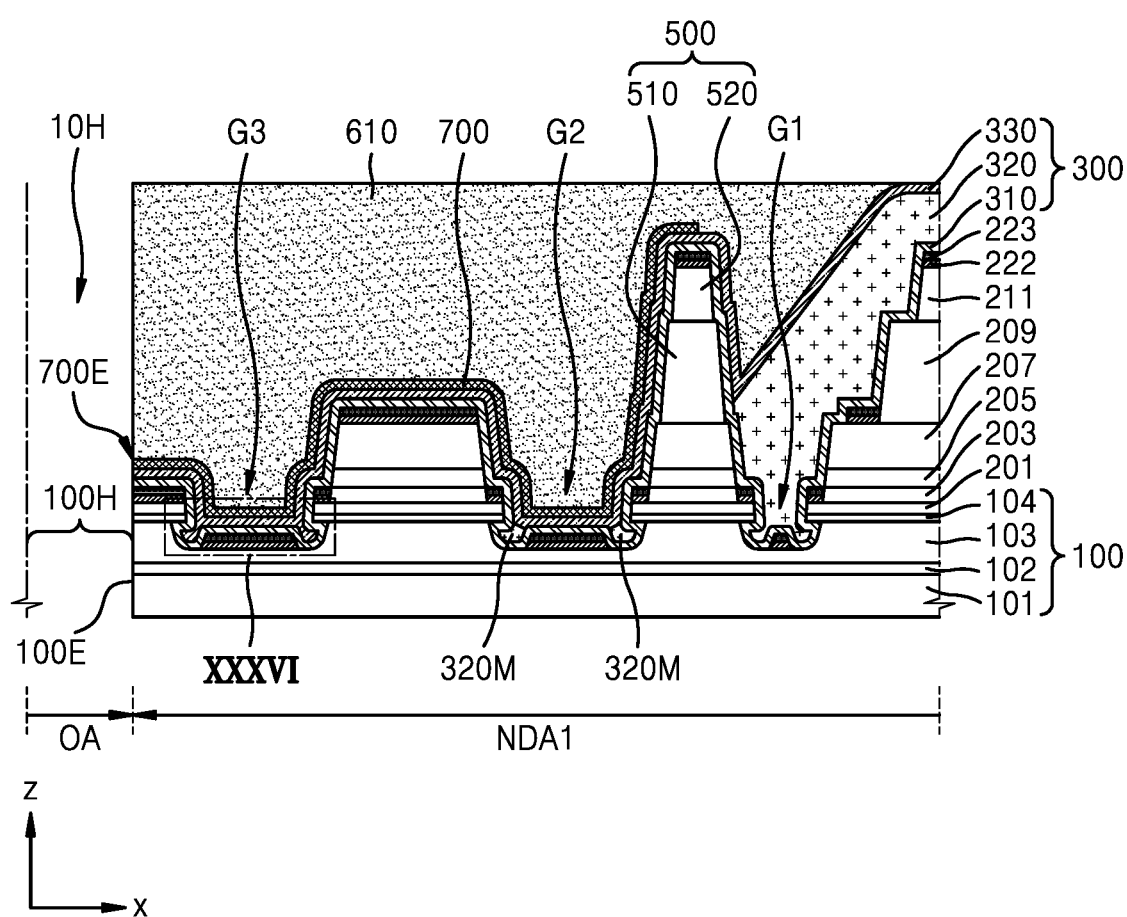
FIG. 35 is a cross-sectional view of a first non-display area of a display panel according to an embodiment.
Figure 36:
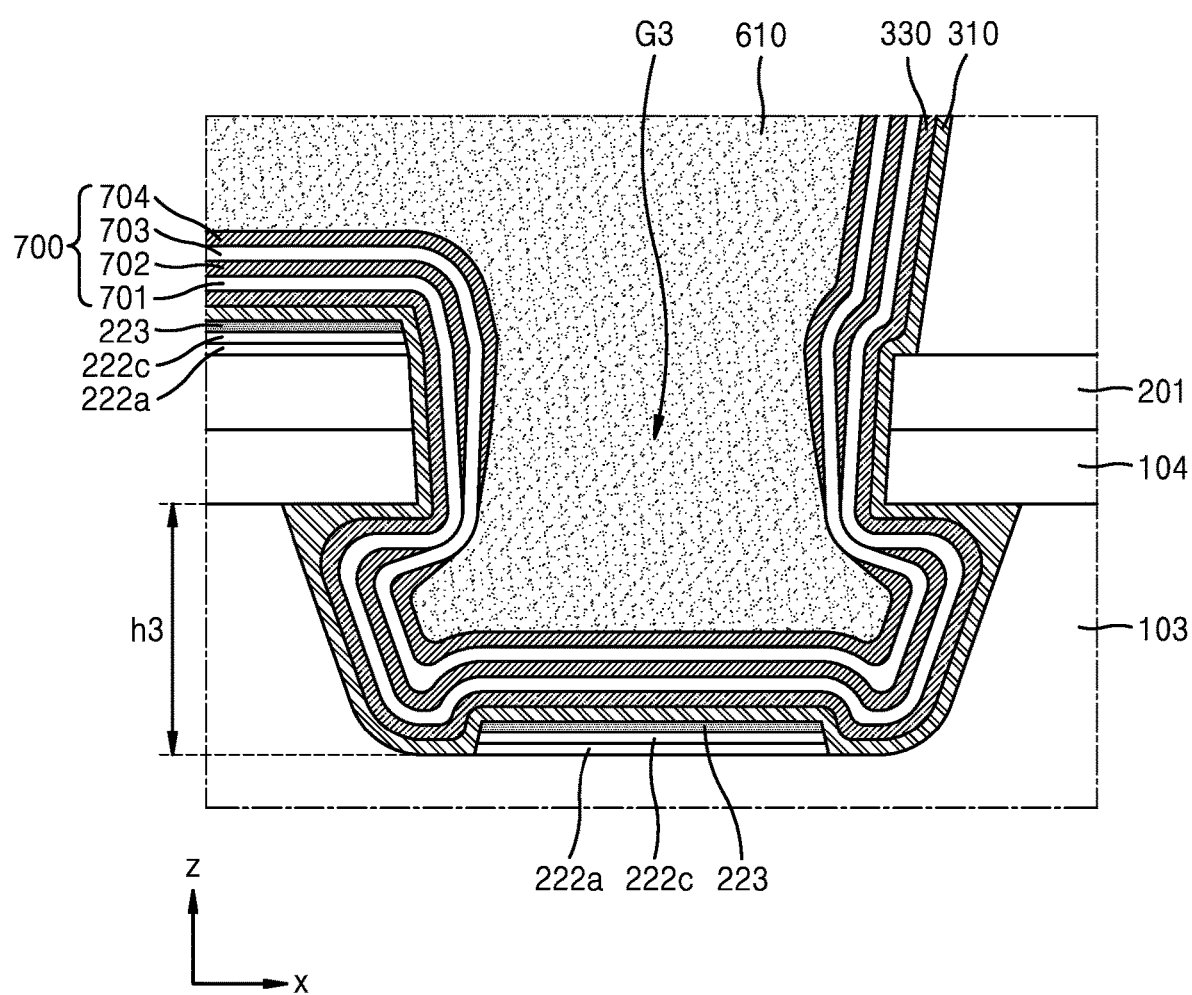
FIG. 36 is an enlarged view of portion XXXVI of FIG. 35.

FIG. 35 is a cross-sectional view of the first non-display area NDA1 of a display panel according to other embodiments and FIG. 36 is an enlarged view of a portion XXXVI of FIG. 35.

Referring to FIG. 35, according to an embodiment, since the lower barrier layer 700 cover the second and third grooves G2 and G3 in the first non-display area NDA1, and except for this structure, the other structures and characteristics are the same as those described above, differences are mainly described below.

According to an embodiment, referring to the first non-display area NDA1 of FIG. 35, the second and third grooves G2 and G3 are covered by the lower barrier layer 700. One edge 700E of the lower barrier layer 700 is located on the same vertical line as the edge 100E of the substrate 100. The stacked structure of the lower barrier layer 700 on the second groove G2 is the same as that described with reference to FIGS. 28 and 30.

According to an embodiment, the first and second inorganic encapsulation layers 310 and 330 and the lower barrier layer 700 are sequentially formed on the third groove G3. The second inorganic encapsulation layer 330 directly contacts a top surface of the first inorganic encapsulation layer 310, and the lower barrier layer 700 directly contacts a top surface of the second inorganic encapsulation layer 330.

Referring to FIG. 36, according to an embodiment, a depth h3 of a portion of the third groove G3 that penetrates into the second base layer 103 is greater than a sum of the thicknesses in a vertical (z) direction, the direction perpendicular to the top surface of the substrate 100, of the first and second functional layers 222a and 222c, the opposite electrode 223, the first and second inorganic encapsulation layers 310 and 330, and the lower barrier layer 700. The first and second inorganic encapsulation layers 310 and 330 and the first and third lower layers 701 and 703 can be formed by CVD, etc., and the second and fourth lower layers 702 and 704 can be formed by a process such as sputtering.

According to an embodiment, the first and second inorganic encapsulation layers 310 and 330 and the first and third lower layers 701 and 703 entirely cover an inner surface of the third groove G3. In contrast, the second and fourth lower layers 702 and 704 have a poorer lower step coverage than the inorganic insulating layer, depending on process conditions. In this case, as shown in FIG. 36, the second and fourth lower layers 702 and 704 are either discontinuous or very thin around the protruded tips.

Figure 37:
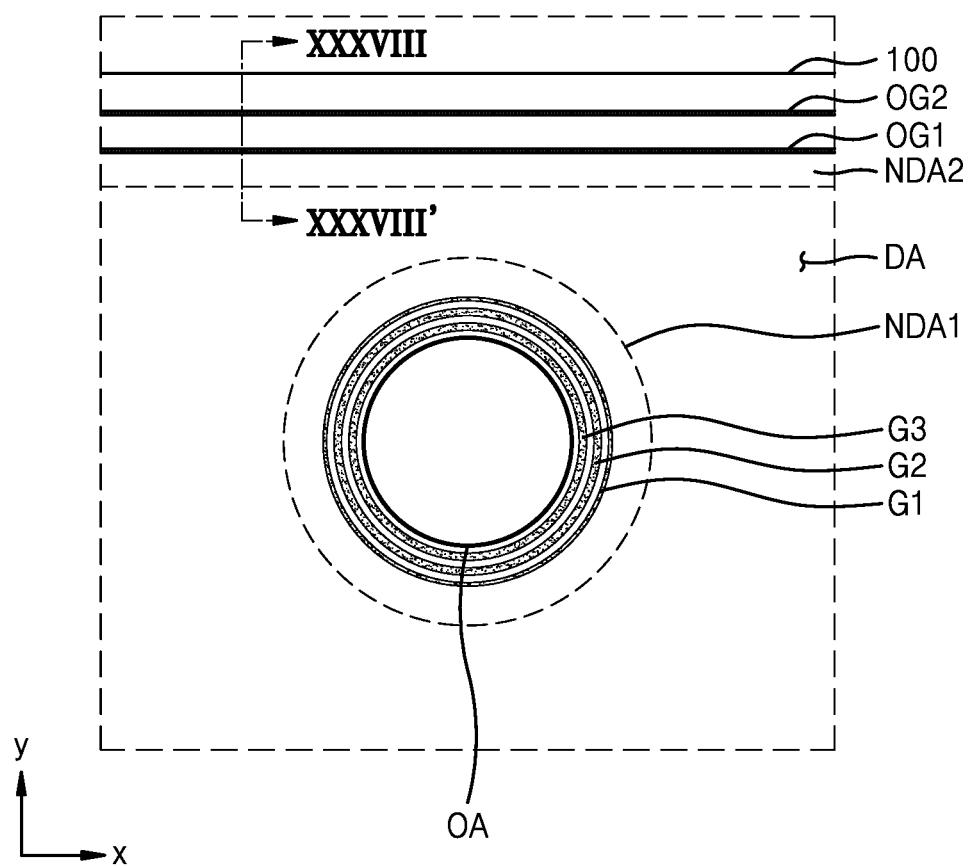
FIG. 37 is a plan view of a portion of a display panel according to an embodiment.
Figure 38:
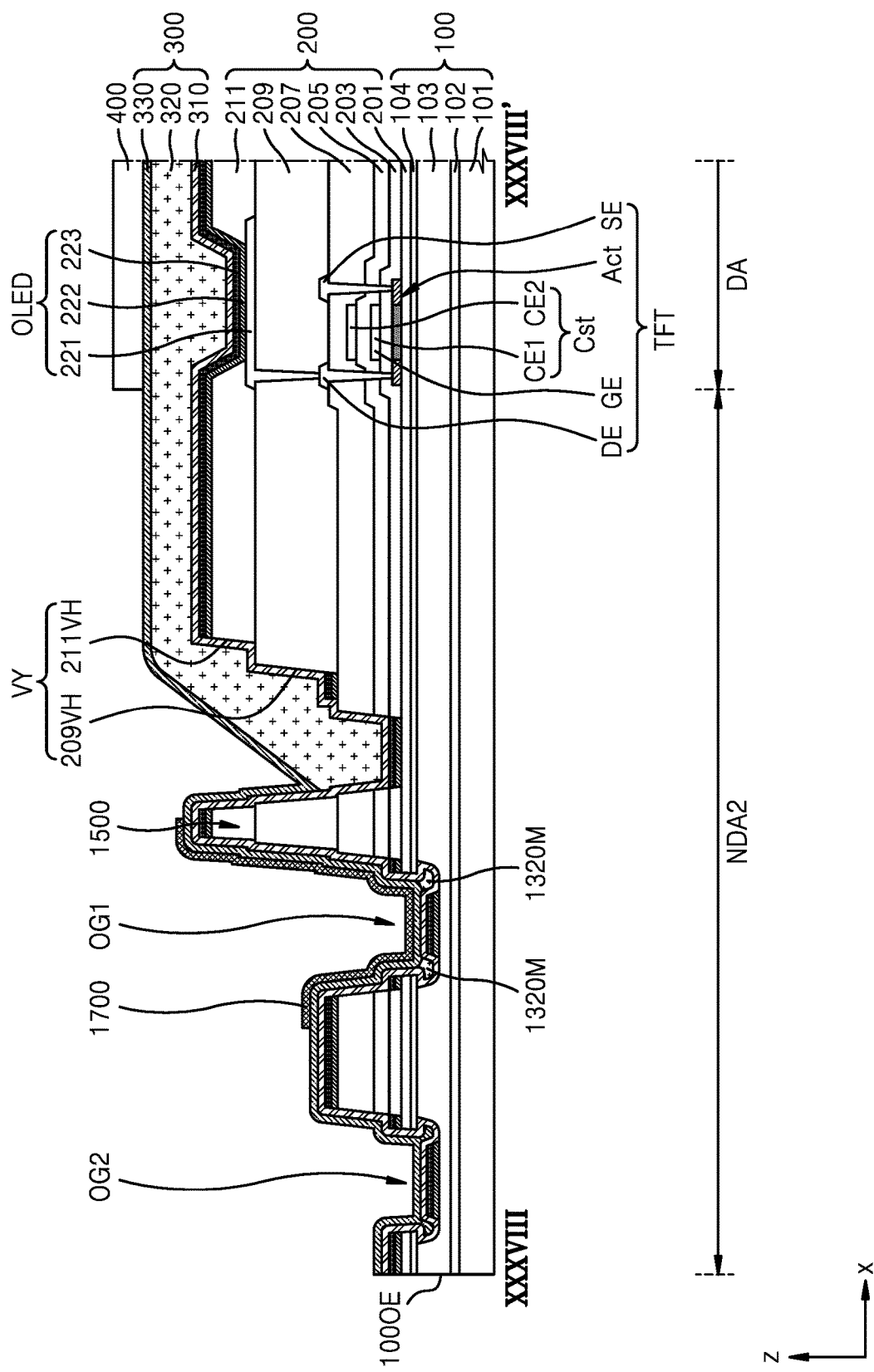
FIG. 38 is a cross-sectional view taken along line XXXVIII-XXXVIII' of FIG. 37.

FIG. 37 is a plan view of a portion of a display panel according to other embodiments, and FIG. 38 is a cross-sectional view taken along line XXXVIII-XXXVIII' of FIG. 37. The first to third grooves G1, G2, and G3 that surround the opening area OA are located in the first non-display area NDA1 of FIG. 38, and since a specific configuration thereof is the same as that described above and a structure of the display area DA is the same, differences are mainly described below.

Referring to FIGS. 37 and 38, according to an embodiment, at least one outer groove is provided in the second non-display area NDA2. In this regard, FIGS. 37 and 38 show first and second outer grooves OG1 and OG2. The first and second outer grooves OG1 and OG2 in the second non-display area NDA2 at least partially surround the display area DA.

Referring to the second non-display area NDA2 of FIG. 38, according to an embodiment, insulating layer(s) formed over the substrate 100 that include an organic material include a valley hole. For example, the organic insulating layer 209 and the pixel-defining layer 211 respectively include a first valley hole 209VH and a second valley hole 211VH. In an embodiment, an insulating layer below the organic insulating layer 209 that includes an inorganic material also includes a valley hole as shown in FIG. 38. As described above, the organic material can serve as a moisture transmission path, and since the display panel has a valley structure that includes the first valley hole 209VH and the second valley hole 211VH, moisture that penetrates in a (x) direction parallel to the top surface of the substrate 100 cannot move toward the display area DA.

According to an embodiment, a partition wall 1500 is disposed in the second non-display area NDA2, and is located in an inner side of the first outer groove OG1, that is, is closer to the display area DA than the first outer groove OG1. The partition wall 1500 surrounds the display area DA. The organic encapsulation layer 320 does not extend toward the first and second outer grooves OG1 and OG2 due to the partition wall 1500. Alternatively, an organic material 1320M remains in the first outer groove OG1 after a process of forming the organic encapsulation layer 320, but the organic material 1320M of the first outer groove OG1 is separated from an edge of the organic encapsulation layer 320 with the partition wall 1500 therebetween.

According to an embodiment, each of the first and second inorganic encapsulation layers 310 and 330 extends to an outer edge 1000E of the substrate 100 and covers the second non-display area NDA2. The first and second inorganic encapsulation layers 310 and 330 contact each other on the first and second outer grooves OG1 and OG2.

According to an embodiment, a barrier layer 1700 is disposed on the second inorganic encapsulation layer 330. The barrier layer 1700 is formed during a same process as that which forms the lower barrier layer 700 described above and has the same stacked structure.

According to an embodiment, the barrier layer 1700 covers at least one outer groove, such as the first outer groove OG1, and since the stacked structure around the first outer groove OG1 is substantially the same as that described with reference to FIG. 38, a repeated description is omitted. In other embodiments, since the barrier layer 1700 can cover both the first and second outer grooves OG1 and OG2, an edge of the barrier layer 1700 is located on the same line as the outer edge 100OE of the substrate 100.

Figure 39:
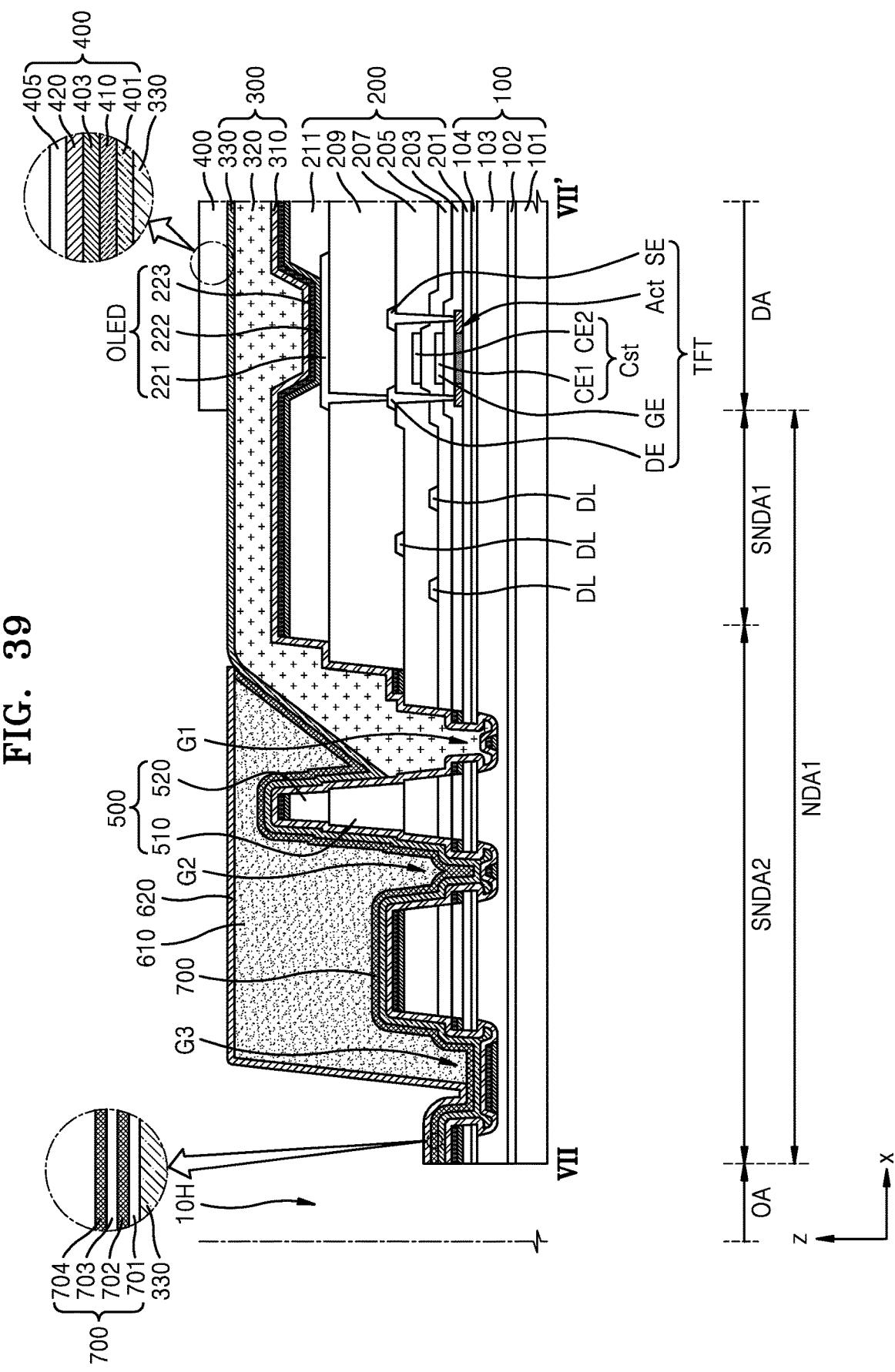
FIG. 39 is a cross-sectional view of a display panel according to an embodiment.

FIG. 39 is a cross-sectional view of a display panel according to other embodiments and corresponds to a cross-section taken along line VII-VII' of FIG. 6. In a display panel described with reference to FIG. 7, the planarization layer 610 is disposed directly on the thin-film encapsulation layer 300 in the first non-display area NDA1. Therefore, the planarization layer 610 of FIG. 7 directly contacts a top surface of the second inorganic encapsulation layer 330 in the first non-display area NDA1. However, in a display panel of FIG. 39, the lower barrier layer 700 is further disposed between the thin-film encapsulation layer 300 and the planarization layer 610, and thus the thin-film encapsulation layer 300 does not directly contact the planarization layer 610.

According to an embodiment, the lower barrier layer 700 includes an inorganic material. For example, the lower barrier layer 700 includes an inorganic insulating layer or a metal layer. In an embodiment, the lower barrier layer 700 includes some of the layers included in the input sensing layer 400.

Referring to an enlarged view of FIG. 39, according to an embodiment, the lower barrier layer 700 includes the plurality of layers that include the first to fourth lower layers 701, 702, 703, and 704. The lower barrier layer 700 includes at least one of the layers included in the input sensing layer 400 described with reference to FIGS. 18A to 20C. For example, the first and third lower layers 701 and 703 respectively include the same materials as those of the first insulating layer 401 and the second insulating layer 403 of the input sensing layer 400. The first insulating layer 401 and the second insulating layer 403 include inorganic insulating materials as described with reference to FIG. 18C or 19C. The second and fourth lower layers 702 and 704 respectively include the same materials as those of the first conductive layer 410 and the second conductive layer 420 of the input sensing layer 400. The planarization layer 610 on the lower barrier layer 700 include the same material as that of the third insulating layer 405 of the input sensing layer 400. The third insulating layer 405 includes an organic insulating material as described with reference to FIG. 18C or 19C. The lower barrier layer 700 and the planarization layer 610 are formed during a same process as a process of forming the input sensing layer 400.

According to an embodiment, although FIG. 39 shows that ends of the planarization layer 610 and the lower barrier layer 700 are spaced apart from the input sensing layer 400 by a predetermined interval, embodiments of the present disclosure are not limited thereto. In other embodiment, the first and third lower layers 701 and 703 of the lower barrier layer 700 are respectively connected, as one body, with the first insulating layer 401 and the second insulating layer 403 of the input sensing layer 400. The second and fourth lower layers 702 and 704 of the lower barrier layer 700 are respectively spaced apart from the first conductive layer 410 and the second conductive layer 420 of the input sensing layer 400 as shown in FIG. 39. The planarization layer 610 is connected, as one body, with the third insulating layer 405 of the input sensing layer 400.

According to an embodiment, the multi-layered structure of the lower barrier layer 700 can be incorporated into embodiment(s) described below and embodiments derived therefrom. Although FIG. 39 illustrates the lower barrier layer 700 as including four layers, embodiments are not limited thereto, and the lower barrier layer 700 may include one layer, two layers, three layers, or five or more layers in other embodiments. In other embodiments, when the lower barrier layer 700 includes three layers, the lower barrier layer 700 may include the same materials as those of the first conductive layer 410, the second insulating layer 403', or the second conductive layer 420 of the input sensing layer 400 described with reference to FIG. 20C. The planarization layer 610 on the lower barrier layer 700 includes the same material as the third insulating layer 405' of FIG. 20C.

Figure 40:
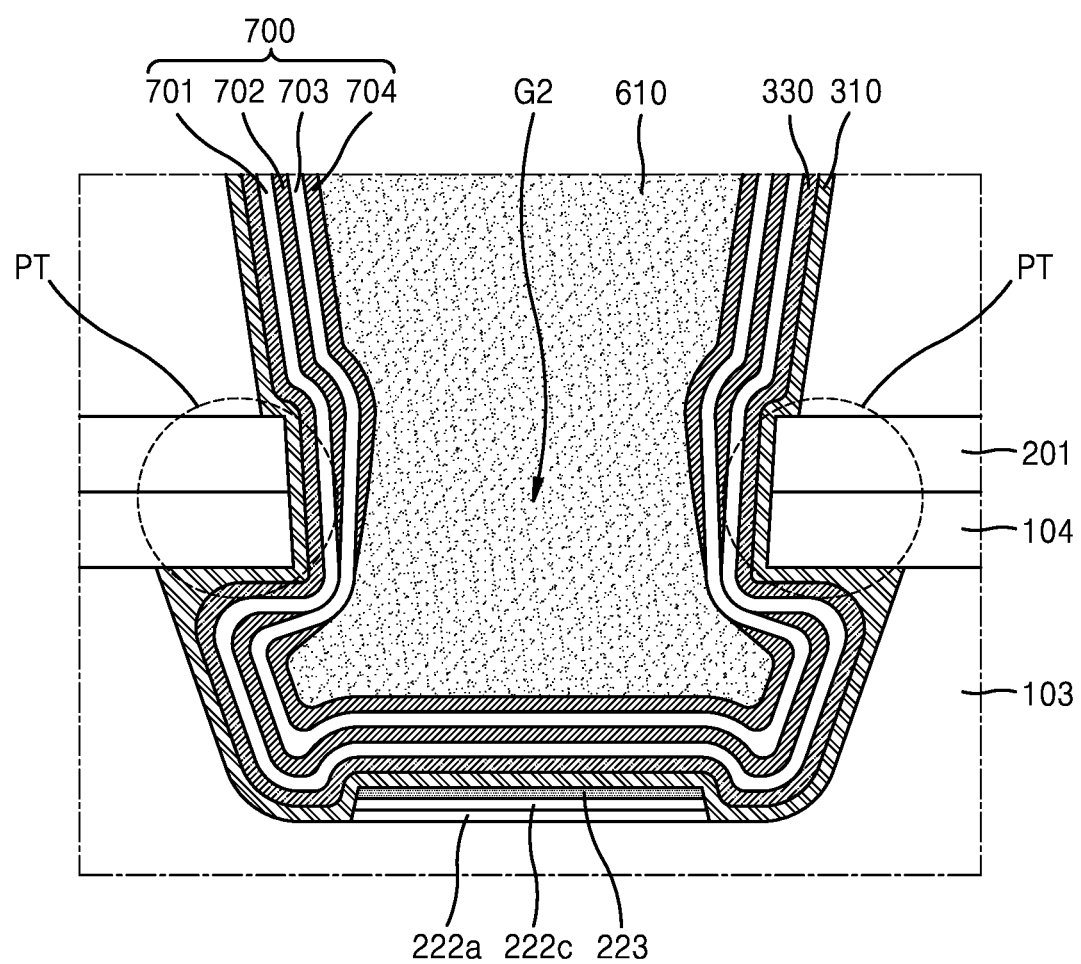
FIG. 40 is an enlarged cross-sectional view of a structure of a lower barrier layer in a second groove of a display device according to an embodiment.

FIG. 40 is an enlarged cross-sectional view of a structure of the lower barrier layer 700 in the second groove G2 of the display device according to an embodiment and corresponds to an enlarged view of the second groove G2 of FIG. 39. FIG. 40 illustrates, for convenience of description, a case when the lower barrier layer 700 includes the first to fourth lower layers 701, 702, 703, and 704.

Referring to FIG. 40, according to an embodiment, a depth of a portion of the second groove G2 that penetrates into the second base layer 103 may be greater than a sum of the thicknesses in a vertical (z) direction, i.e. the direction perpendicular to the top surface of the substrate 100, of the first and second functional layers 222a and 222c, the opposite electrode 223, the first and second inorganic encapsulation layers 310 and 330, and the lower barrier layer 700.

According to an embodiment, the lower barrier layer 700 has a stacked structure that includes an inorganic insulating layer and a metal layer. For example, the first and third lower layers 701 and 703 are inorganic insulating layers that include silicon nitride, and the second and fourth lower layers 702 and 704 are metallic layers that include Al and Ti. In an embodiment, the second and fourth lower layers 702 and 704 have a multi-layered structure that includes Ti/Al/Ti. The second inorganic encapsulation layer 330 and the first inorganic encapsulation layer 310 are disposed under the lower barrier layer 700.

According to an embodiment, the first and second inorganic encapsulation layers 310 and 330 and the first and third lower layers 701 and 703 can be formed by a process such as CVD, etc., and the second and fourth lower layers 702 and 704 can be formed by a process such as sputtering, etc.

Referring to FIG. 40, according to an embodiment, the first and second inorganic encapsulation layers 310 and 330 and the first and third lower layers 701 and 703 entirely and continuously cover an inner surface of the second groove G2. In contrast, the second and fourth lower layers 702 and 704 have a poorer step coverage than the inorganic insulating layer, depending on process conditions. In this case, as shown in FIG. 40, the second and fourth lower layers 702 and 704 may be thin or discontinuous around the protruded tips PT of the second groove G2.

According to an embodiment, although FIG. 40 illustrates a specific structure of the lower barrier layer 700 with reference to the second groove G2, embodiments of the present disclosure are not limited thereto. A structure of the lower barrier layer 700 in the third groove G3 may be similar to the structure shown in FIG. 40. The structure shown in FIG. 40 can be incorporated into not only an embodiment described with reference to FIG. 39, but also embodiments described with reference to FIGS. 41 to 43 and embodiments derived therefrom.

Figure 41:
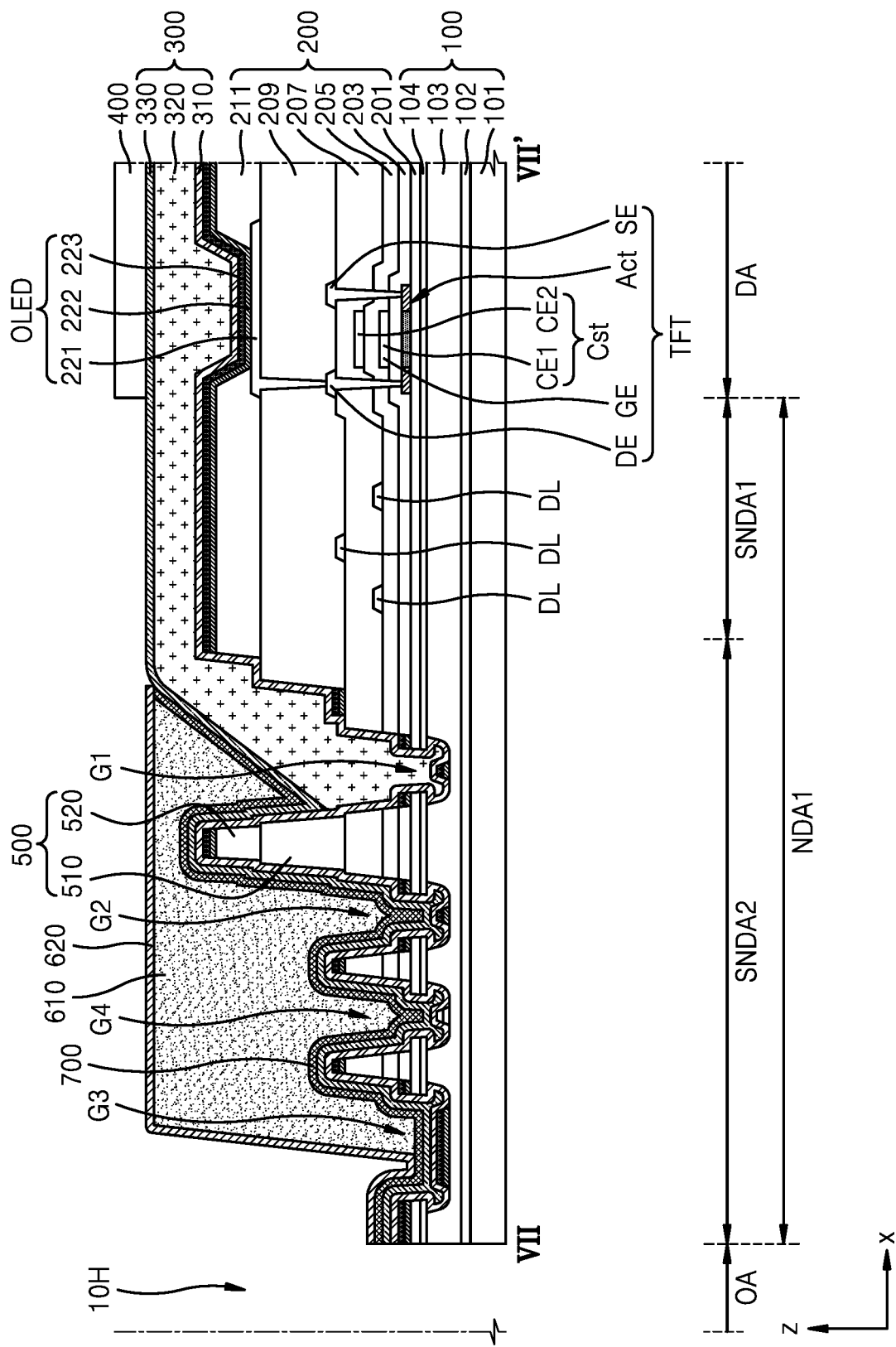
FIG. 41 is a cross-sectional view of a display panel according to an embodiment.
Figure 42:
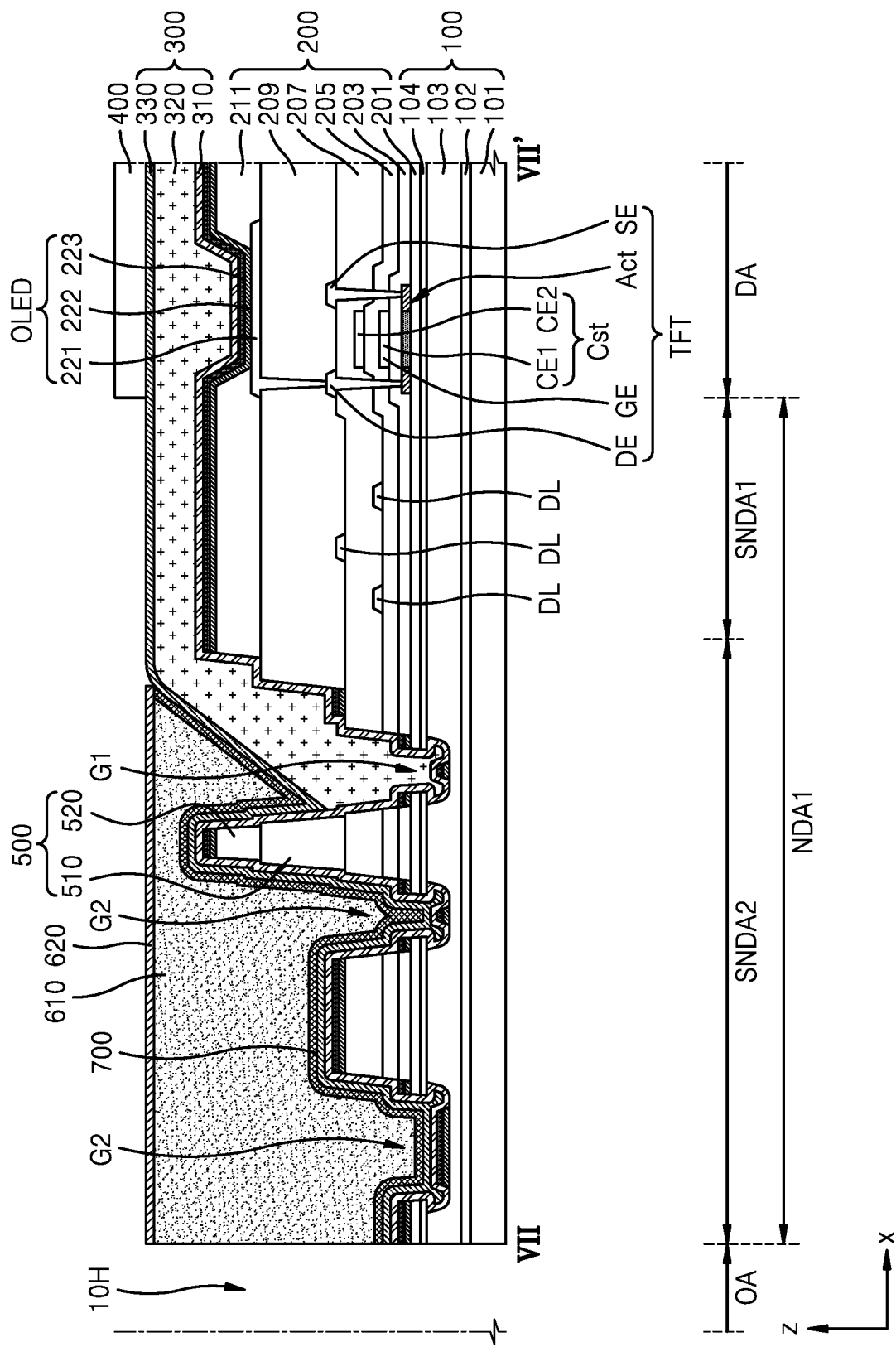
FIG. 42 is a cross-sectional view of a display panel according to an embodiment.
Figure 43:
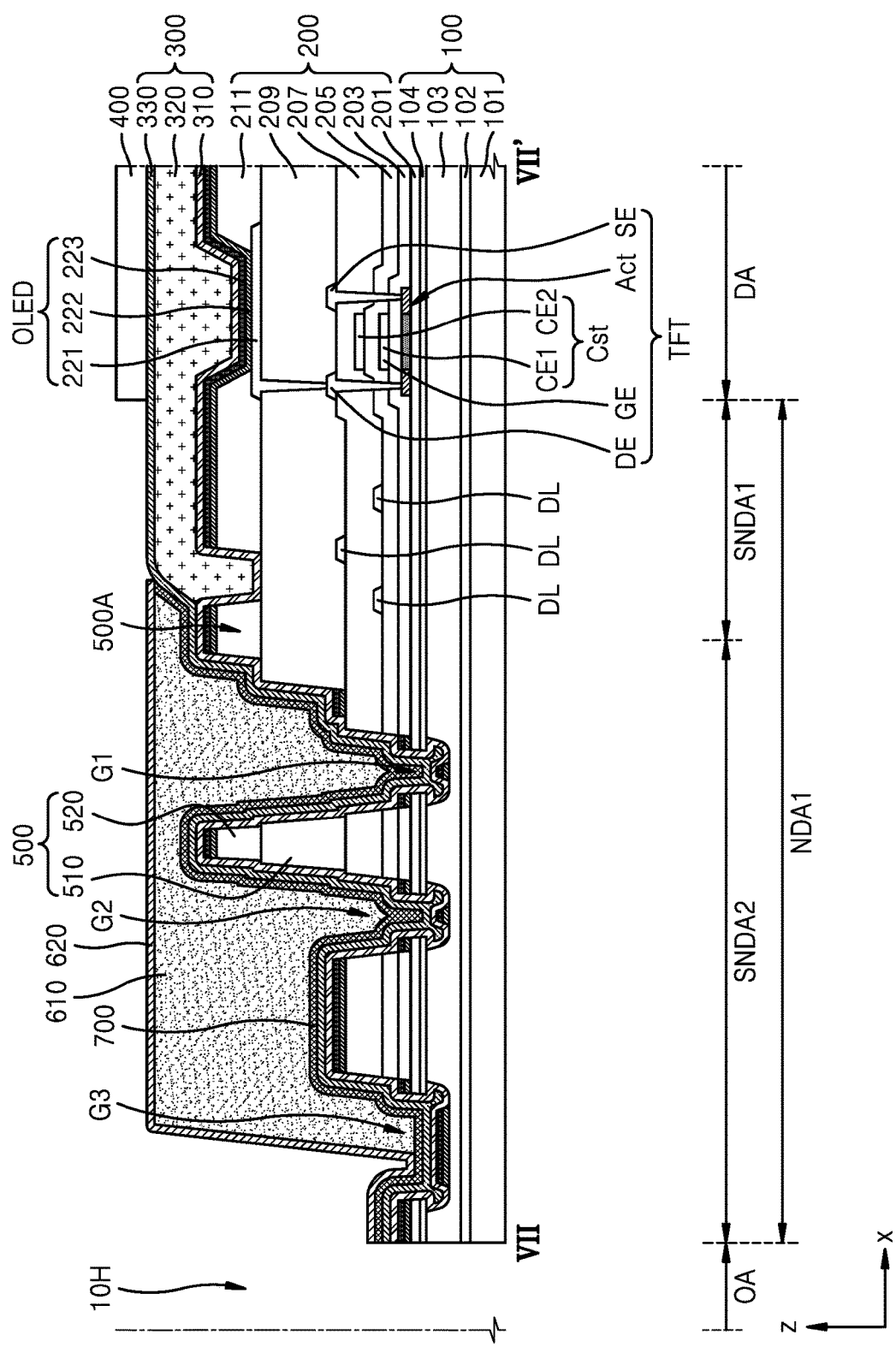
FIG. 43 is a cross-sectional view of a display panel according to an embodiment.

FIGS. 41 to 43 are cross-sectional views of a display panel according to other embodiments and correspond to a cross-section taken along line VII-VII' of FIG. 6.

As shown in FIG. 41, according to an embodiment, a display panel further includes at least one fourth groove G4 in the first non-display area NDA1, and the lower barrier layer 700 directly contacts the second inorganic encapsulation layer 330 in the second to fourth grooves G2, G3 and G4.

As shown in FIG. 42, according to an embodiment, the display panel includes the planarization layer 610 that has a lateral surface located on the same vertical line as the edge 100E of the substrate 100. In this case, moisture, etc., can be introduced through the planarization layer 610, but since moisture that has propagated in the lateral direction through the planarization layer 610 is blocked by a multi-layered structure that includes the lower barrier layer 700 and the second inorganic encapsulation layer 330, the moisture does not permeate into the organic encapsulation layer 320. Therefore, damage to the display area DA due to moisture, etc., can be prevented.

As shown in FIG. 43, according to an embodiment, the display panel further includes a second partition wall 500A, and the lower barrier layer 700 directly contacts the second inorganic encapsulation layer 330 in the first to third grooves G1, G2 and G3.

Although FIGS. 39 to 43 show a structure in which a top surface of the planarization layer 610 is covered by the barrier layer 620, the barrier layer 620 may be omitted in other embodiments.

Although FIGS. 39 to 43 show a structure in which the lower barrier layer 700 is disposed in the second sub-non-display area SNDA2, in other embodiments, the lower barrier layer 700 extends into the first sub-non-display area SNDA1 and the display area DA in an embodiment. For example, as described above, when the lower barrier layer 700 includes the first lower layer 701 and/or the third lower layer 703, which are inorganic insulating layers, these layers may extend into the first sub-non-display area SNDA1 and the display area DA.

Figure 44:
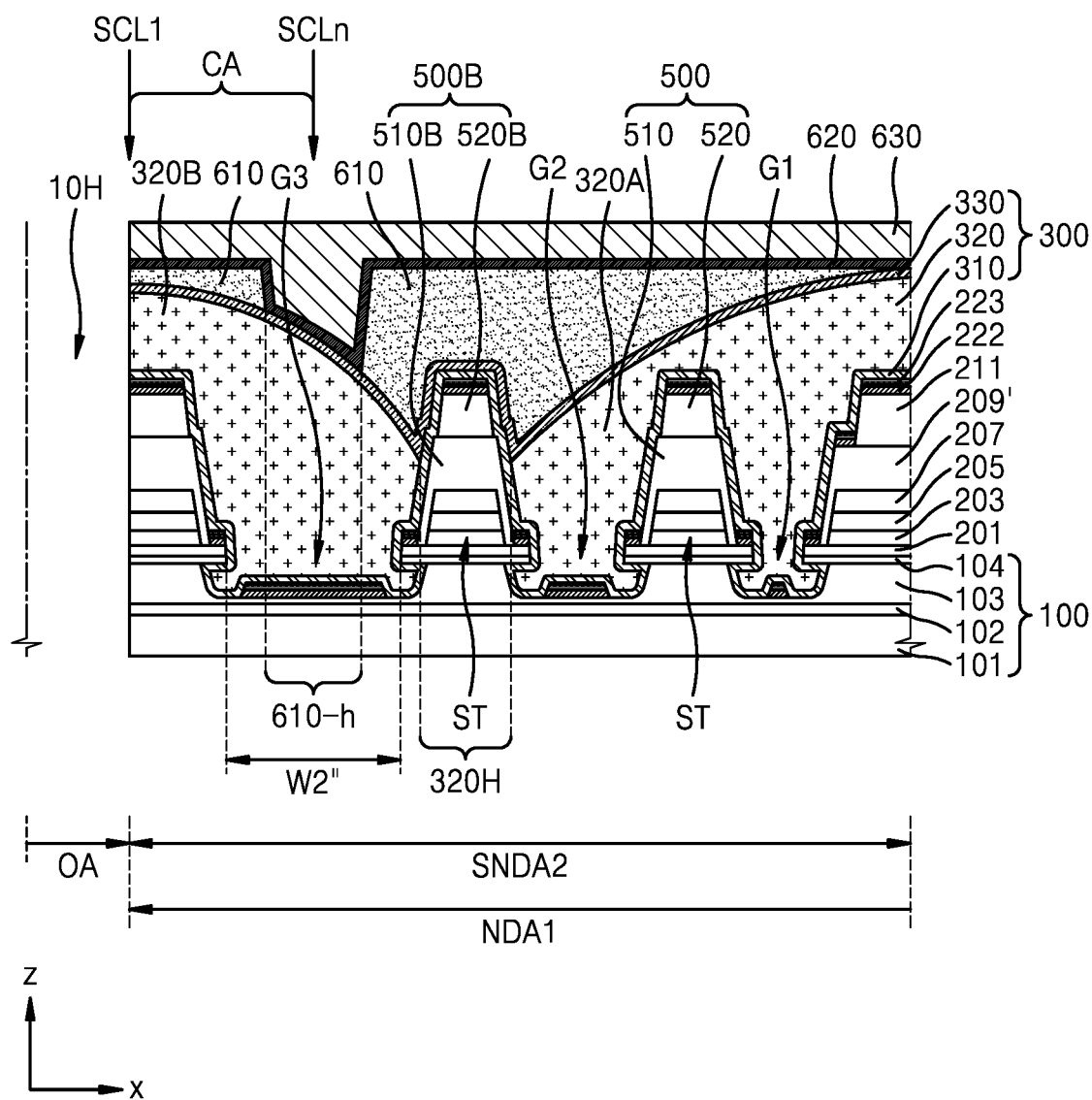
FIG. 44 is a cross-sectional view of an opening area and a first non-display area of a display panel according to an embodiment.

FIG. 44 is a cross-sectional view of the opening area OA and the first non-display area SNDA1 of a display panel according to other embodiments. Although FIG. 44 shows a portion of the first non-display area NDA1, such as the second sub-non-display area SNDA2, for convenience of description, a display panel of FIG. 44 also includes the first sub-non-display area SNDA1 and the display area DA, and a structure thereof is the same as that described with reference to FIG. 7.

Referring to FIG. 44, according to an embodiment, a plurality of grooves, such as the first to third grooves G1, G2 and G3, are formed in the second sub-non-display area SNDA2. A partition wall is disposed between adjacent grooves. In this regard, FIG. 44 shows the first partition wall 500 between the first and second grooves G1 and G2, and a partition wall 500B, hereinafter referred to as a third partition wall, between the second and third grooves G2 and G3.

According to an embodiment, the first and third partition walls 500 and 500B respectively include a first sub-wall portion 510 and a first sub-wall portion 510B, and respectively include a second sub-wall portion 520 and a second sub-wall portion 520B. Each of the first sub-wall portions 510 and 510S covers a stacked body ST that includes patterned inorganic insulating layer(s) thereunder, such as the gate insulating layer 203, and the first and second interlayer insulating layers 205 and 207. More specifically, a lateral surface of the stacked body ST is covered by the first sub-wall portions 510 and 510G, and each of the first sub-wall portions 510 and 510S contacts a top surface of the buffer layer 201 under the stacked body ST.

According to an embodiment, some of the intermediate layers 222, such as the first or second functional layers 222a and 222c, and the opposite electrode 223 are separated by the first to third grooves G1, G2 and G3 as described above, and the inner surfaces of the first to third grooves G1, G2 and G3 are covered by the first inorganic encapsulation layer 310 as described above.

According to an embodiment, the organic encapsulation layer 320 cover the first to third grooves G1, G2 and G3. For example, the organic material layer 320A covers the first and second grooves G1 and G2. A second portion 320B of the organic encapsulation layer 320 covers the third groove G3. The organic material layer 320A that covers the first and second grooves G1 and G2 extends to the display area DA and the first sub-non-display area SNDA1 and covers the display area DA and the first sub-non-display area SNDA1. The second portion 320B of the organic encapsulation layer 320 alleviates stress and can prevent floating or exfoliation of layers, such as layers that including an inorganic material, in a relevant area.

According to an embodiment, the organic encapsulation layer 320 is separated in the second sub-non-display area SNDA2. For example, the first portion 320A and the second portion 320B of the organic encapsulation layer 320 are spaced apart from each other with the third partition wall 500B therebetween, and a space between the first portion 320A the second portion 320B spaced apart from each other can be considered to be a hole 320H of the organic encapsulation layer 320. The hole 320H is located between the second and third grooves G2 and G3 as shown in FIG. 44. The second inorganic encapsulation layer 330 on the organic encapsulation layer 320 directly contacts the first inorganic encapsulation layer 310 through the hole 320H.

According to an embodiment, the planarization layer 610 is disposed on the second inorganic encapsulation layer 330 and covers at least one of the plurality of grooves. In an embodiment, the planarization layer 610 overlaps the first and second grooves G1 and G2 and a portion the third groove G3, and cover the first and second grooves G1 and G2 and the portion of the third groove G3 as shown in FIG. 44.

According to an embodiment, the planarization layer 610 includes a hole 610-h. The hole 610-h in the planarization layer 610 overlaps the third groove G3. The hole 610-h in the planarization layer 610 has a width that is less than a width W2" of the third groove G3. However, embodiments are not limited thereto, and in other embodiments, the hole 610-h of the planarization layer 610 may have a width equal to the width W2" of the third groove G3, or may have a width greater than the width W2" of the third groove G3. The hole 610-h of the planarization layer 610 is closer to the opening area OA than the hole 320H of the organic encapsulation layer 320. However, embodiments are not limited thereto, and in other embodiments, the hole 610-h of the planarization layer 610 may be further away from the opening area OA than the hole 320H of the organic encapsulation layer 320. Although FIG. 44 shows that the hole 610-h of the planarization layer 610 is spaced apart from the hole 320H of the organic encapsulation layer 320 by a predetermined interval, embodiments of the present disclosure are not limited thereto. In other embodiments, the hole 610-h of the planarization layer 610 at least partially overlaps the hole 320H of the organic encapsulation layer 320.

According to an embodiment, the barrier layer 620 is disposed on the planarization layer 610 and directly contacts the second inorganic encapsulation layer 330 through the hole 610-h in the planarization layer 610. The barrier layer 620 includes an inorganic material and may have a single layer or a multi-layered structure and a description thereof is the same as that of the embodiment described with reference to FIG. 7. An additional planarization layer 630 is further disposed on the barrier layer 620. The additional planarization layer 630 includes an organic material. For example, when the barrier layer 620 includes an inorganic insulating layer or a metallic layer, such as at least one of the first insulating layer, the first conductive layer, the second insulating layer, or the second conductive layer, formed on the input sensing layer as described with reference to FIG. 7, the additional planarization layer 630 includes the same material as the third insulating layer of the input sensing layer 400. In this case, the additional planarization layer 630 is connected, as one body, with the third insulating layer of the input sensing layer. That is, the additional planarization layer 630 is the third insulating layer of the input sensing layer 400.

According to an embodiment, the structure shown in FIG. 44 surrounds the opening 10H, that is, the opening area OA. For example, the planarization layer 610 has a ring shape that surrounds the opening area OA in a plan view. In addition, the second portion 320B of the organic encapsulation layer 320 that covers the third groove G3 has a ring shape that surrounds the opening area OA in a plan view. Likewise, the holes 320H and 610-h in the organic encapsulation layer 320 and the planarization layer 610, respectively, have ring shapes that surround the opening area OA in a plan view.

According to an embodiment, the hole 320H in the organic encapsulation layer 320 is an area in which the organic encapsulation layer 320 is not provided over the substrate 100. Therefore, in embodiments described with reference to FIGS. 7 to 43, an area between the edge 100E of the substrate 100 and the edge 320E in the organic encapsulation layer 320 may be considered to be the hole 320H described with reference to FIG. 44. Likewise, the hole 610-h in the planarization layer 610 is an area in which the planarization layer 610 is not provided over the substrate 100. Therefore, in the cross-sectional views described with reference to FIGS. 7 to 43, except for FIGS. 22, 24, 31, 35, and 42, an area between the edge 100E of the substrate 100 and the second edge 610E2 of the planarization layer 610 may be considered to be the hole 610-h in the planarization layer 610.

According to an embodiment, FIG. 44 corresponds to a cross-section of a display panel in which a cutting or scribing process has been performed along the first line SCL1. However, embodiments of the present disclosure are not limited thereto. In other embodiments, as shown in FIG. 44, during a process of manufacturing a display panel, an area extending from the first line SCL1 to an n-th line SCLn is a cutting area CA. That is, a cutting or scribing process is performed along one of the first line SCL1 to the n-th line SCLn, and a cross-sectional structure corresponding thereto corresponds to a structure of the display panel according to embodiment(s).

Figure 45:
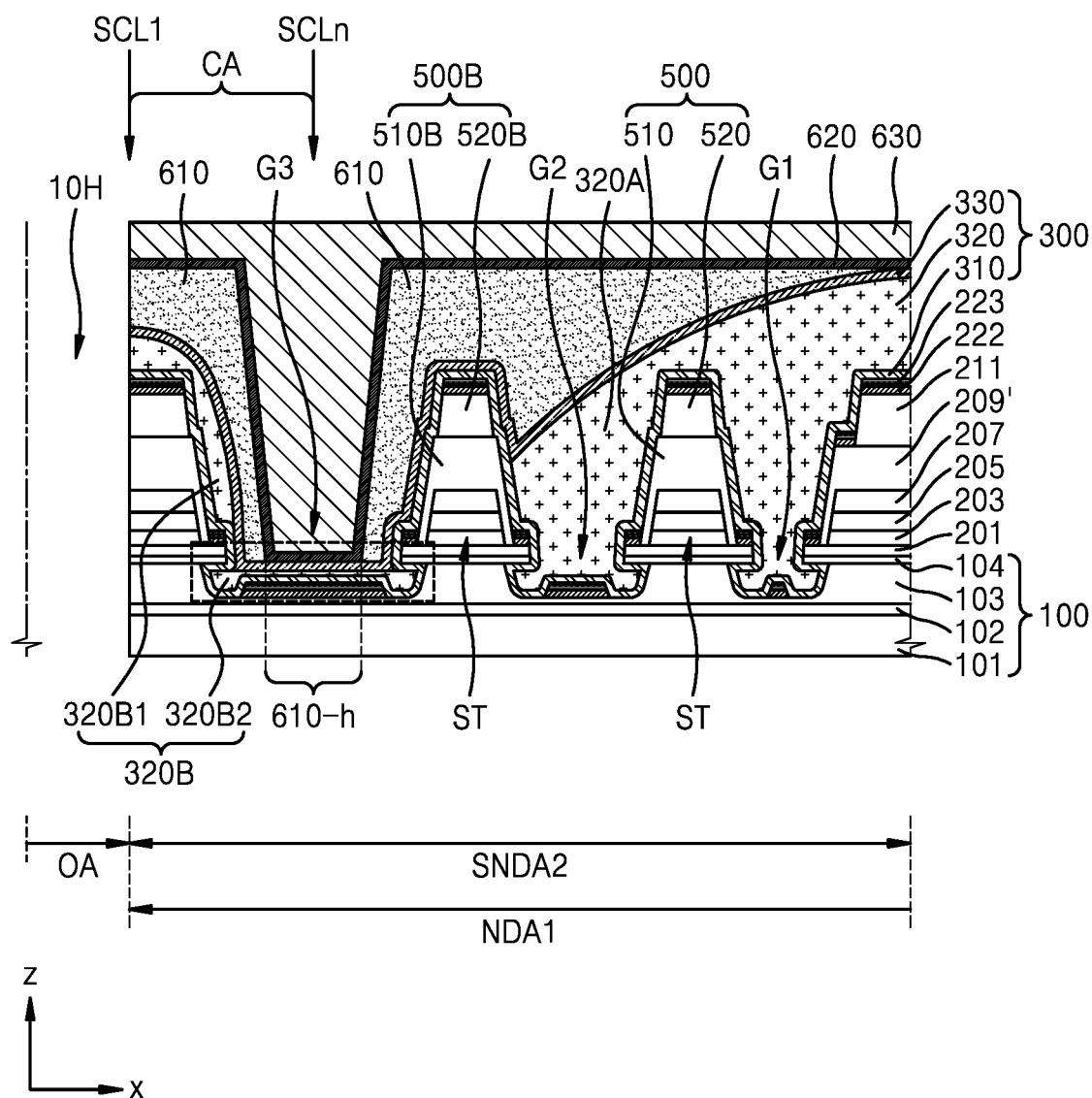
FIG. 45 is a cross-sectional view of an opening area and a first non-display area of a display panel according to an embodiment.
Figure 46A:
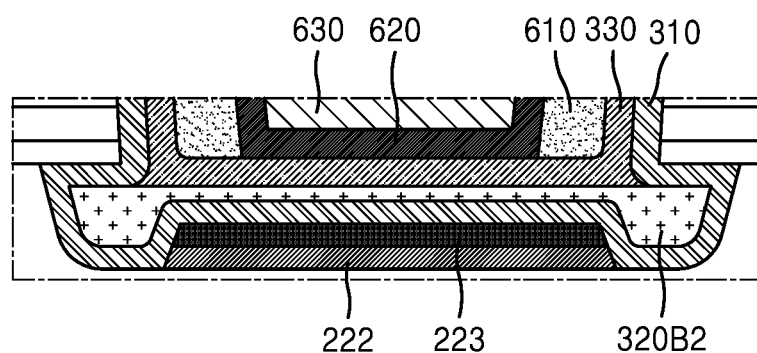
FIGS. 46A and 46B are enlarged views of a third groove of FIG. 45.
Figure 46B:
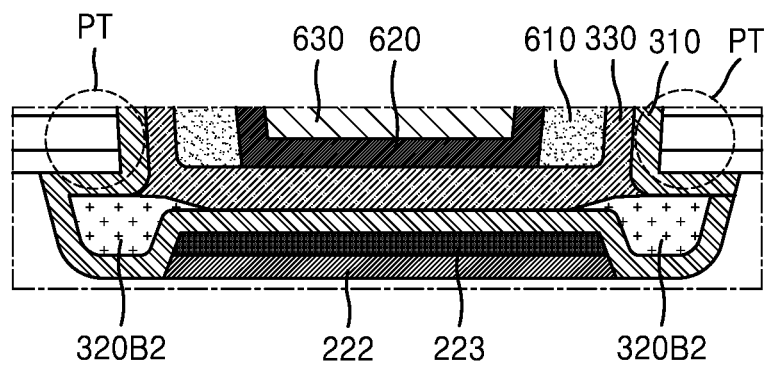

FIG. 45 is a cross-sectional view of the opening area OA and the first non-display area NDA1 of a display panel according to other embodiments, and FIGS. 46A and 46B are enlarged views of the third groove G3 of FIG. 45.

According to an embodiment, the display panel of FIG. 45 differs from the display panel described with reference to FIG. 44 in the second portion 320B of the organic encapsulation layer 320 over the third groove G3. As shown in FIG. 45, the second portion 320B of the organic encapsulation layer 320 is disposed over the third groove G3 and covers a portion of the third groove G3. The second portion 320B of the organic encapsulation layer 320 is separated around a protruded tip of the third groove G3, such as a left protruded tip in FIG. 45. For example, the second portion 320B of the organic encapsulation layer 320 includes a first-second portion 320B1 disposed in an upper portion of the third groove G3 and a second-second portion 320B2 disposed inside the third groove G3 under the protruded tip of the third groove G3.

Referring to FIG. 46A, according to an embodiment, the second-second portion 320B2 is located inside the third groove G3 and covers the intermediate layer 222, i.e., the first and second functional layers 222a and 222c, and the opposite electrode 223 disposed on a bottom surface of the third groove G3. However, in other embodiments, referring to FIG. 46B, the second-second portion 320B2 is disposed inside the third groove G3 and under the pair of protruded tips PT. A thickness of a portion of the second-second portion 320B2 at a central portion of the third groove G3 is very thin or non-existent.

According to an embodiment, FIG. 45 corresponds to a cross-section of a display panel on which a cutting or scribing process has been performed along the first line SCL1. In other embodiments, as shown in FIG. 45, an area extending from the first line SCL1 to the n-th line SCLn is a cutting area CA during a process of manufacturing a display panel. Therefore, a cross-sectional structure on which a cutting or scribing process has been performed along one of the first line SCL1 to the n-th line SCLn corresponds to a structure of a display panel according to embodiment(s).

Figure 47:
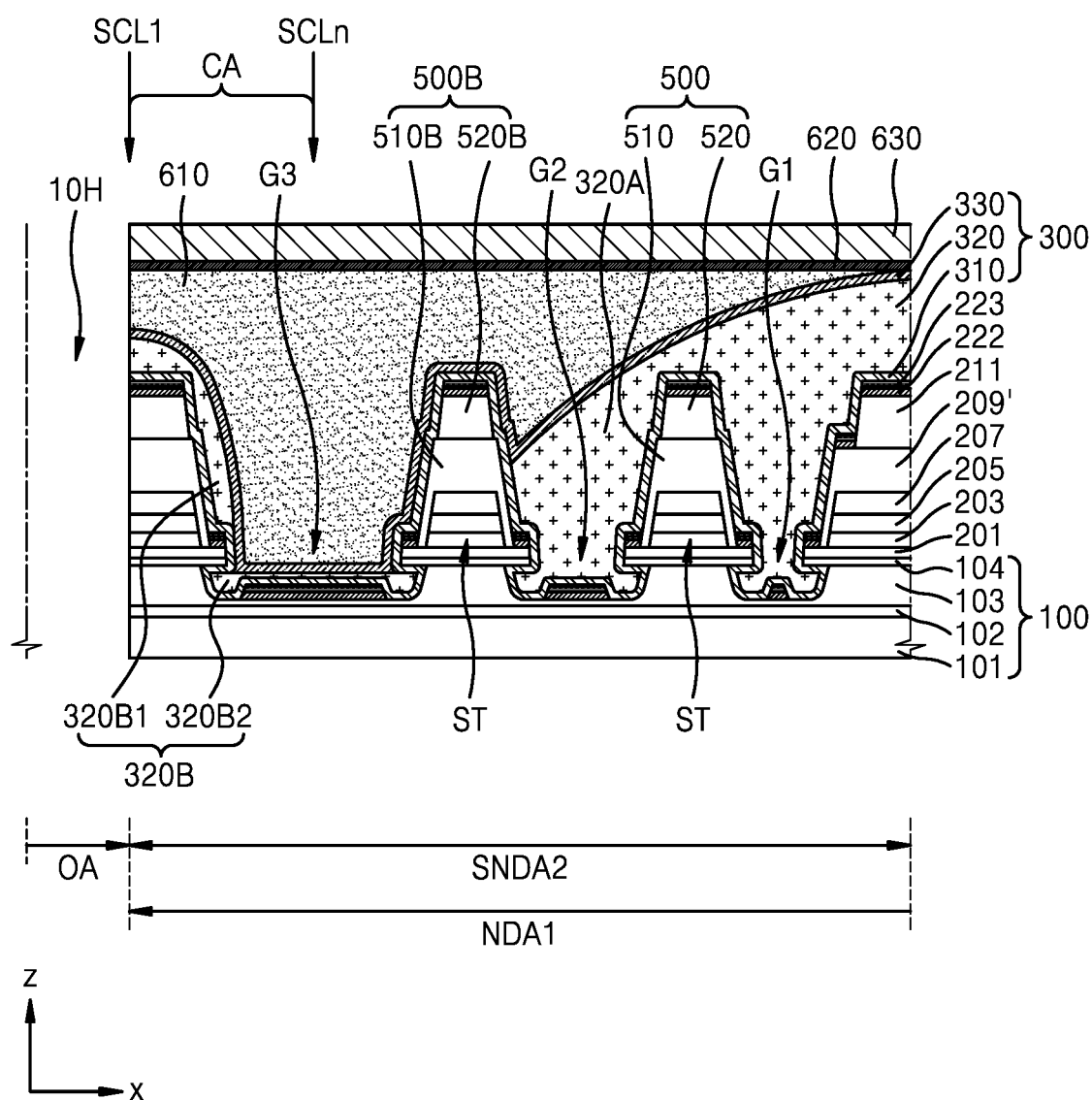
FIG. 47 is a cross-sectional view of an opening area and a first non-display area of a display panel according to an embodiment.

FIG. 47 is a cross-sectional view of the opening area OA and the first non-display area NDA1 of the display panel according to other embodiments.

Referring to FIG. 47, according to an embodiment, the organic encapsulation layer 320 over the first to third grooves G1, G2 and G3 is the same as that described with reference to FIGS. 45 to 46B. Unlike a display panel of FIGS. 44 and 45, the planarization layer 610 of a display panel of FIG. 47 does not include the hole 610-h. For example, the planarization layer 610 of FIG. 47 entirely covers the second sub-non-display area SNDA2. The barrier layer 620 does not directly contact the second inorganic encapsulation layer 330.

According to an embodiment, FIG. 47 corresponds to a cross-section of a display panel on which a cutting or scribing process has been performed along the first line SCL1. In other embodiments, a cross-sectional structure on which a cutting or scribing process has been performed along one of the first line SCL1 to the n-th line SCLn in the cutting area CA also corresponds to the structure of a display panel according to embodiment(s).

Figure 48:
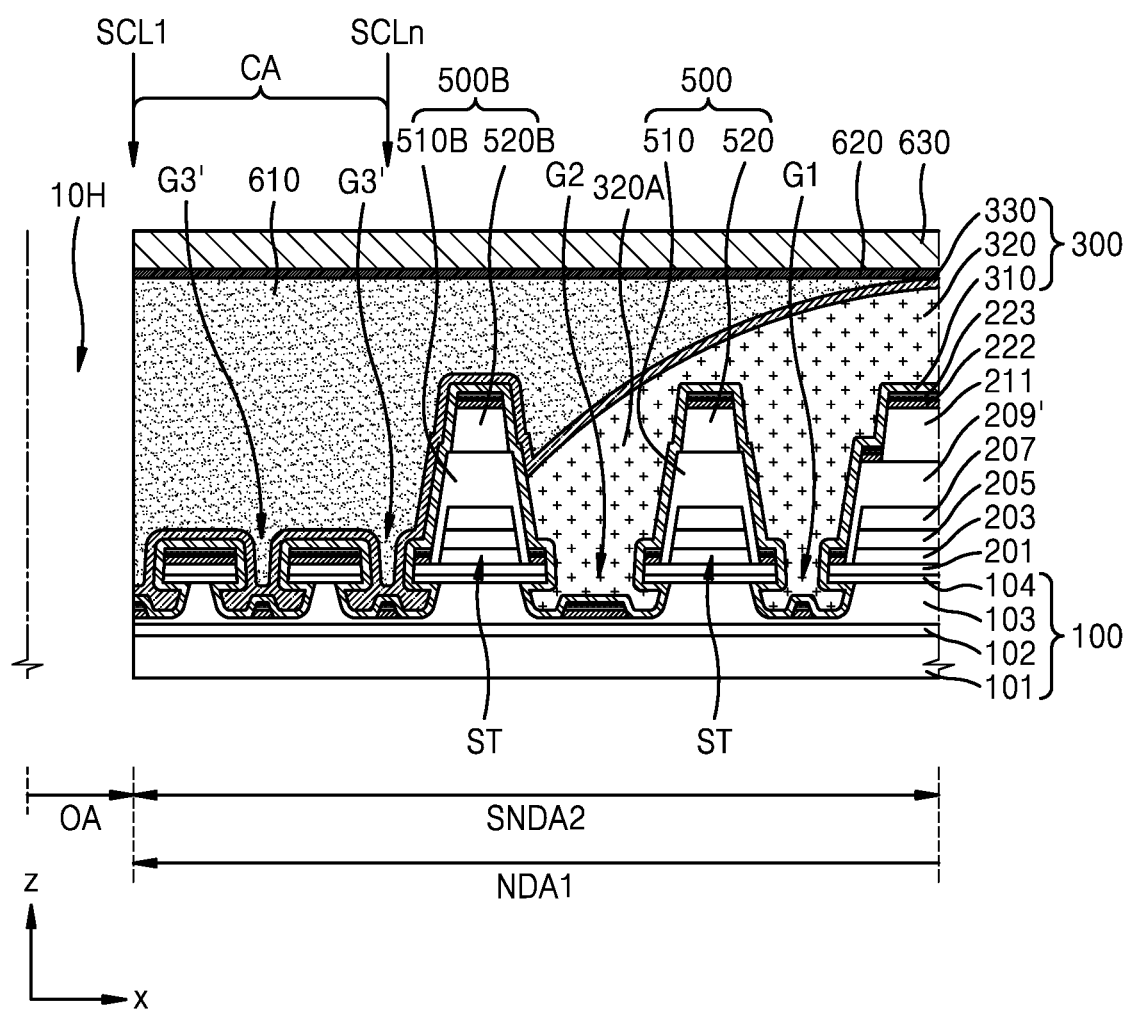
FIG. 48 is a cross-sectional view of an opening area and a first non-display area of a display panel according to an embodiment.

FIG. 48 is a cross-sectional view of the opening area OA and the first non-display area NDA1 of a display panel according to other embodiments.

Referring to FIG. 48, according to an embodiment, a plurality of third grooves G3' are formed between the opening area OA and the second groove G2. Each of the third grooves G3' has a width that is substantially the same as or less than that of the first groove G1 or the second groove G2.

According to an embodiment, the planarization layer 610 is disposed over the second and third grooves G2 and G3', and an interior space of the second and third grooves G2 and G3' over the second inorganic encapsulation layer 330 is filled with the planarization layer 610. An arrangement of the plurality of third grooves G3' shown in FIG. 48 can be incorporated into embodiments described with reference to FIGS. 7 to 47 and embodiments derived therefrom.

According to an embodiment, FIG. 48 corresponds to a cross-section of a display panel on which a cutting or scribing process has been performed along the first line SCL1. In other embodiments, a cutting or scribing process can be performed along one of the first line SCL1 to the n-th line SCLn in the cutting area CA, and a cross-sectional structure that corresponds thereto corresponds to a structure of a display panel according to embodiment(s).

Embodiments of the present disclosure are not limited to the number of third grooves G3' described with reference to FIG. 48. In other embodiments, a greater number of third grooves G3' than the number shown in FIG. 48 may be formed. in addition, a structure of the plurality of third grooves G3' described in FIG. 48 can be incorporated into embodiments described with reference to FIGS. 7 to 48 and embodiments derived therefrom.

According to an embodiment, since an organic material layer, such as at least one of the organic encapsulation layer 320, the planarization layer 610, or the additional planarization layer 630, is disposed in the cutting area CA shown in FIGS. 44, 45, 47, and 48, unlike the case where the above organic material layer is not provided, stress can be alleviated and a floating phenomenon of the inorganic layers can be prevented or minimized.

According to an embodiment, the first and third partition walls 500 and 500B shown in FIGS. 44, 45, 47, and 48 can be incorporated into the embodiments of a display panel described with reference to FIGS. 7 to 43. In addition, the additional planarization layer 630 shown in FIGS. 44, 45, 47, and 48 can be incorporated into embodiments described with reference to FIGS. 7 to 43 and embodiments derived therefrom.

Figure 49B:
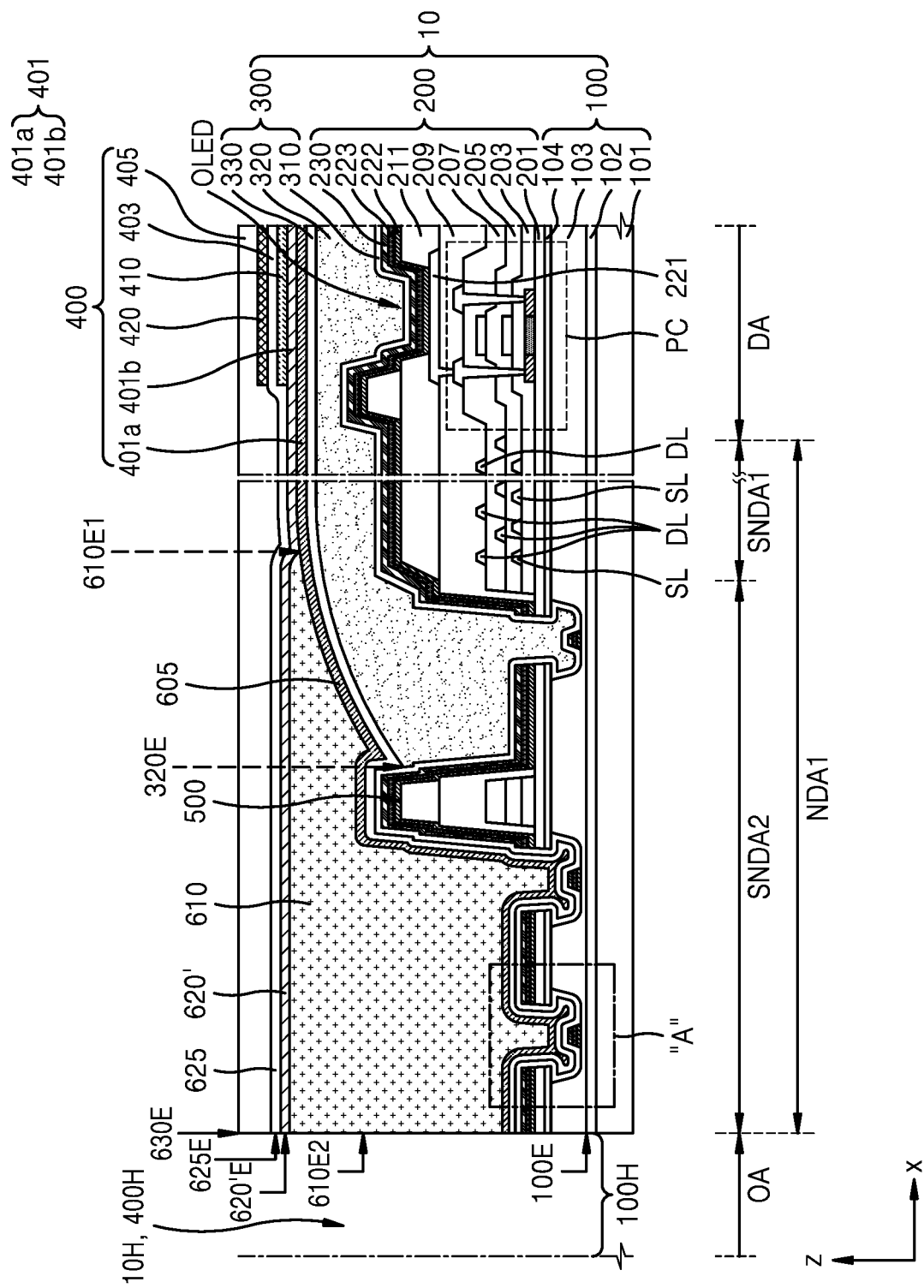
FIG. 49B is a cross-sectional view of a display panel according to an embodiment.
Figure 50:
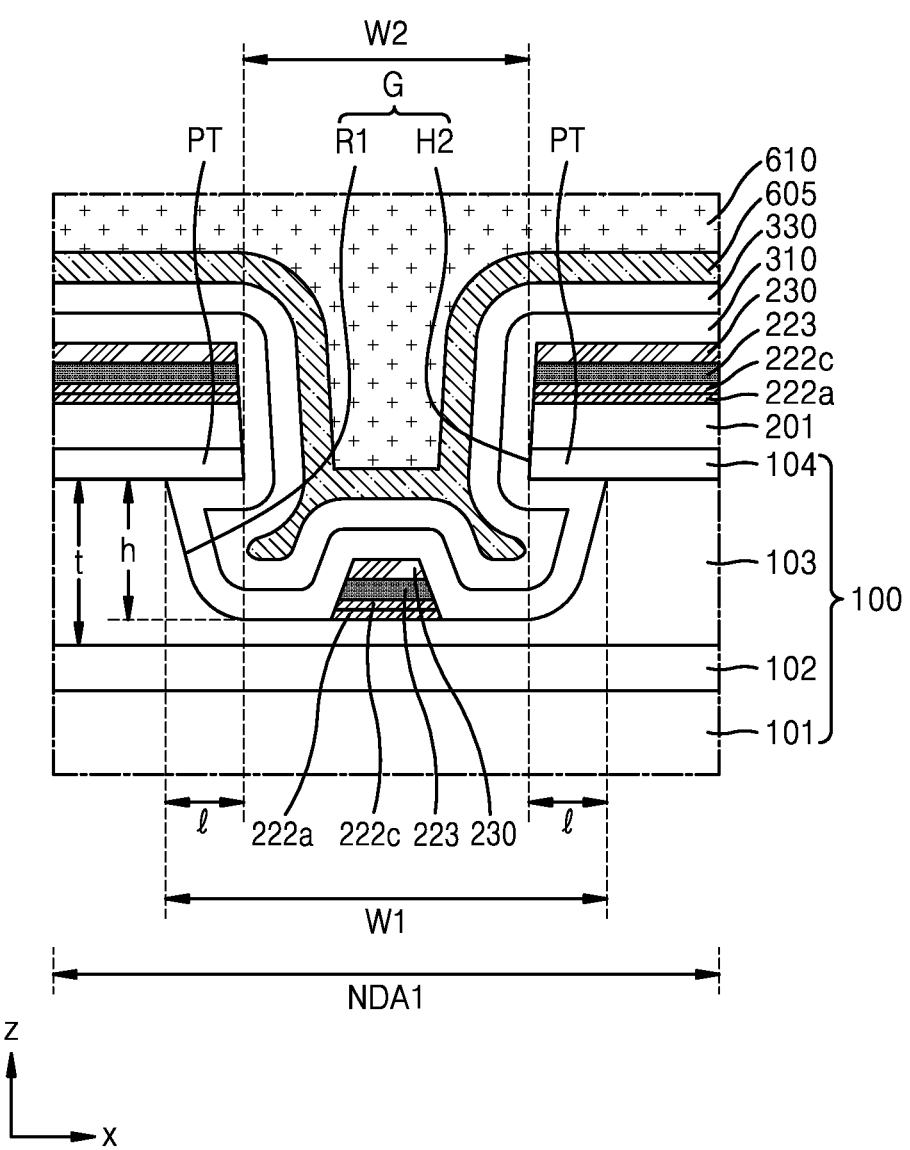
FIG. 50 is an enlarged view of portion "A" of FIGS. 49A and 49B.

FIGS. 49A and 49B are cross-sectional views of a display panel according to an embodiment, respectively, and FIG. 50 is an enlarged cross-sectional view of portion "A" of FIGS. 49A and 49B.

Referring to FIG. 49A, according to an embodiment, the display panel 10 includes the opening 10H corresponding to the opening area OA. The opening 10H of the display panel 10 corresponds to a hole or a through hole that penetrates the display panel 10. The pixel circuit PC and the display element layer 200 are disposed in the display area DA, the pixel circuit PC being disposed over the substrate 100, and the display element layer 200 that includes the organic light-emitting diode OLED are connected to the pixel circuit PC. As described with reference to FIG. 7, the organic light-emitting diode OLED includes the pixel electrode 221, and the intermediate layer 222 and the opposite electrode 223 that are sequentially stacked.

According to an embodiment, the substrate 100 has a multi-layered structure. For example, the substrate 100 includes a first base layer 101, a first barrier layer 102, a second base layer 103, and a second inorganic layer 104 that are sequentially stacked. A polymer resin included in the first base layer 101 and the second base layer 103, and an inorganic insulating material included in the first barrier layer 102 and the second inorganic layer 104 are the same as those described above.

According to an embodiment, the pixel circuit PC is disposed over the substrate 100 and includes a thin film transistor and a storage capacitor. The display element layer 200 includes display elements provided in a plurality of pixels. The display element layer 200 includes the pixel electrode 221, the intermediate layer 222 on the pixel electrode 22, and the opposite electrode 223, each being provided in each of the plurality of pixels. Each display element emits one of red, green, or blue light. The display element layer 200 is covered by the thin-film encapsulation layer 300. Since specific characteristics of the elements disposed in the display area DA are the same as those described with reference to FIG. 7, a repeated description thereof is omitted.

Referring to the first non-display area NDA1 of FIG. 49A, according to an embodiment, the first non-display area NDA1 includes the first sub-non-display area SNDA1 and the second sub-non-display area SNDA2, the first sub-non-display area SNDA1 being adjacent to the display area DA, and the second sub-non-display area SNDA2 being adjacent to the opening area OA or the opening 10H. The first sub-non-display area SNDA1 includes a region, such as a detour region, across which signal lines, such as the data lines DL or the scan lines SL described with reference to FIG. 5 extend. A width of the first sub-non-display area SNDA1 may be less than, equal to, or greater than a width of the second sub-non-display area SNDA2.

As shown in FIG. 49A, according to an embodiment, the data lines DL are alternately disposed with an insulating layer therebetween. When neighboring data lines DL are disposed over and under with an insulating layer, such as the second interlayer insulating layer 207, therebetween, a gap (a pitch) between the neighboring data lines DL can be reduced, and thus a width of the first non-display area NDA1 can be reduced. In another embodiment, the data lines DL are disposed on the same insulating layer, such as the second interlayer insulating layer 207.

According to an embodiment, the second sub-non-display area SNDA2 is groove area in which grooves are formed. Although FIG. 49A shows five grooves formed in the second sub-non-display area SNDA2, embodiments are not limited thereto, and the number of grooves may vary.

According to an embodiment, each of the grooves G is formed in multiple layers that include a first layer and a second layer that respectively include different materials. For example, the first layer includes a polymer resin layer and the second layer includes an inorganic insulating layer. In an embodiment, FIG. 12 shows that the groove G is formed in sub-layers disposed on the substrate 100, such as the second base layer 103 and the second inorganic layer 104 of the substrate 100.

According to an embodiment, a specific structure of the groove G is the same as that described above with reference to FIG. 9 or 10. For example, as described with reference to FIG. 9 and as shown in FIG. 50, a depth h of the groove G is less than a thickness t of the second base layer 103, and the groove G includes a hole H2 formed in the second inorganic layer 104 and a recess R1 formed in the second base layer 103. In another embodiment, as described with reference to FIG. 10, a depth h of the groove G is substantially the same as the thickness t of the second base layer 103, and the groove G includes the hole formed in the second inorganic layer 104 and a hole formed in the second base layer 103.

As shown in FIG. 50, according to an embodiment, a lateral surface of the second inorganic layer 104 that bounds the second hole H2 protrudes further toward a center of the groove G than a lateral surface of the second base layer 103 that bounds the recess R1 or the hole. Lateral portions of the second inorganic layer 104 that protrude toward the center of the groove G constitute a pair of protruding tips PT. In addition to the second inorganic layer 104, the buffer layer 201 is patterned to constitute a pair of protruding tips PT. The groove G has an undercut cross-section in which a width W1 of the recess R1 or the hole of the second base layer 103 is greater than a width W2 of the hole H2 of the second inorganic layer 104. A length l of each tip of a pair of tips PT is less than 2.0 µm. In an embodiment, the length l ranges from about 1.0 µm to about 1.8 µm.

According to an embodiment, the groove G is formed before at least one organic material layer of the organic light-emitting diode OLED is formed, such as the intermediate layer 222. At least one organic material layer included in the intermediate layer 222, such as the first functional layer 222a or the second functional layer 222c shown in FIG. 50, are disconnected by the groove G in the first non-display area NDA1. Likewise, the opposite electrode 223 is disconnected by the groove G. A capping layer 230 that includes LiF is disposed on the opposite electrode 223. Like the first functional layer 222a, the second functional layer 222c, and the opposite electrode 223, the capping layer 230 includes a common layer that is formed over an entire surface of the substrate 100 and is disconnected by the groove G. In another embodiment, the capping layer 230 is omitted.

According to an embodiment, the first and second inorganic encapsulation layers 310 and 330 cover the organic light-emitting diode OLED and extend into the first non-display area NDA1. The first and second inorganic encapsulation layers 310 and 330 can be formed by CVD, etc. and have improved step coverage as compared to the first functional layer 222a, the second functional layer 222c, and the opposite electrode 223. For example, the first and second inorganic encapsulation layers 310 and 330 are successively formed to have a relatively uniform thickness or to minimize thickness deviations as compared to the first functional layer 222a, the second functional layer 222c, and the opposite electrode 223. Therefore, each of the first and second inorganic encapsulation layers 310 and 330 can be continuously formed without being disconnected by the groove G. The first inorganic encapsulation layer 310 covers an inner surface of the groove G. The first and second inorganic encapsulation layers 310 and 330 have different thicknesses. For example, the first inorganic encapsulation layer 310 has a thickness of about 1 µm, and the second inorganic encapsulation layer 330 has a thickness of about 0.7 µm. That is, the thickness of the first inorganic encapsulation layer 310 is greater than the thickness of the second inorganic encapsulation layer 330. Alternatively, the thickness of the first inorganic encapsulation layer 310 and the thickness of the second inorganic encapsulation layer 330 may be the same or the thickness of the first inorganic encapsulation layer 310 may be less than the thickness of the second inorganic encapsulation layer 330.

According to an embodiment, the organic encapsulation layer 320 covers the display area DA with the edge 320E located on one side of the partition wall 500. The organic encapsulation layer 320 includes a polymer formed by coating a monomer and hardening the monomer. The monomer flow can be controlled by the partition wall 500 and a thickness of the organic encapsulation layer 320 can be controlled by the partition wall 500. Alternatively, the organic encapsulation layer 320 can be formed by coating a polymer. The edge 320E of the organic encapsulation layer 320 is spaced apart from the opening 10H. Since a region in which the first and second inorganic encapsulation layers 310 and 330 directly contact each other is located between the opening 10H and the organic encapsulation layer 320, moisture can be prevented from penetrating through the opening 10H into the display area DA through the organic encapsulation layer 320.

According to an embodiment, the organic material layer 320A is disposed in a portion of the first non-display area NDA1 that is adjacent to the opening 10H. The organic material layer 320A is spaced apart from the organic encapsulation layer 320 by a predetermined distance. The organic material layer 320A is formed during a process of forming the organic encapsulation layer 320 and includes the same material as that of the organic encapsulation layer 320. When the organic encapsulation layer 320 is formed by hardening a monomer, similar to controlling monomer flow by using the partition wall 500, a material that constitutes the organic material layer 320A can be controlled by using a partition wall 500C, hereinafter referred to as a fourth partition wall, and an edge 320AE of the organic material layer 320A is located on one side of the fourth partition wall 500C. As described above, the first and second inorganic encapsulation layers 310 and 330 make contact with each other in the first non-display area NDA1. When a contact area of the first and second inorganic encapsulation layers 310 and 330 is equal to or greater than a specific value, the first and second inorganic encapsulation layers 310 and 330 or a neighboring layer, such as the planarization layer 610, can float due to stress on the first and second inorganic encapsulation layers 310 and 330. In contrast, in an embodiment, when the organic material layer 320A is disposed, the contact area of the first and second inorganic encapsulation layers 310 and 330 can be slightly reduced and thus the floating issue can be prevented or minimized. When the organic material layer 320A is spaced apart from the organic encapsulation layer 320, the first and second inorganic encapsulation layers 310 and 330 make contact with each other between the edge 320E of the organic encapsulation layer 320 and the edge 320AE of the organic material layer 320A.

According to an embodiment, the planarization layer 610 is disposed in the first non-display area NDA1. The planarization layer 610 is disposed in an area adjacent to the opening area OA. For example, the planarization layer 610 is disposed only in the first non-display area NDA1. The planarization layer 610 includes an organic insulating layer. The planarization layer 610 includes a polymer-based material. For example, the planarization layer 610 may include a silicon-based resin, an acrylic-based resin, an epoxy-based resin, polyimide, or polyethylene, etc. The polymer-based material is transparent. In an embodiment, the planarization layer 610 includes a material that differs from that of the organic encapsulation layer 320. For example, one of the organic encapsulation layer 320 or the planarization layer 610 includes a silicon-based resin, and the other includes an acrylic-based resin. In another embodiment, the organic encapsulation layer 320 and the planarization layer 610 include the same material.

According to an embodiment, the planarization layer 610 covers at least one groove G formed in the first non-display area NDA1. The planarization layer 610 increases flatness of the display panel 10 around the opening area OA by covering a region of the first non-display area NDA1 that is not covered by the organic encapsulation layer 320. Therefore, separation of the input sensing layer 400 (see FIG. 2A) disposed on the display panel 10 can be prevented. A portion of the planarization layer 610 overlaps a portion of the organic encapsulation layer 320. A first edge 610E1 of the planarization layer 610 that is adjacent to the display area DA is located over the organic encapsulation layer 320, and a second edge 610E2 opposite to the first edge 610E1 is located on the same vertical line as the edge 100E of the substrate 100 that bounds the opening 10H of the display panel 10 or the first opening 100H of the substrate 100.

According to an embodiment, an area from the first line SCL1 to the n-th line SCLn in FIG. 49A includes an area on which a cutting or scribing process of a process of manufacturing the display panel 10 is performed. For example, the area from the first line SCL1 to the n-th line SCLn includes a cutting area CA across which a laser may pass. A cutting or scribing process can be performed along one of the first line SCL1 to the n-th line SCLn, and a corresponding cross-sectional structure corresponds to a structure of the display device 1 according to embodiments. With regard to this, FIG. 49A shows a cross-sectional structure of the display panel on which a cutting or scribing process has been performed along the first line SCL1, and FIG. 49B shows a cross-sectional structure of the display panel on which a cutting or scribing process has been performed along the n-th line SCLn.

According to an embodiment, barrier layers 605 and 620' are respectively disposed under and on the planarization layer 610. Hereinafter, for convenience of description, a barrier layer under the planarization layer 610 is referred to as a first barrier layer 605, and a barrier layer on the planarization layer 610 is referred to as a second barrier layer 620'.

According to an embodiment, the planarization layer 610 is formed in the first non-display area NDA1 through exposure and development processes, etc. When external foreign substances, such as moisture, propagate in a lateral direction parallel to an xy-plane of the display panel 10 during some processes, such as a washing process, that form the planarization layer 610, the organic light-emitting diode of the display area DA can be damaged. In contrast, according to embodiments, since the first barrier layer 605 and the second barrier layer 620', which are inorganic insulating layers, are respectively disposed under and on the planarization layer 610, moisture penetration or floating of a neighboring layer can be prevented during or after the process of forming the planarization layer 610. The first barrier layer 605 and the second barrier layer 620' directly contact the planarization layer 610.

According to an embodiment, each of the first barrier layer 605 and the second barrier layer 620' includes an inorganic insulating material, such as silicon oxide (SiOx), silicon nitride (SiNx), or silicon oxynitride (SiON), and may have a single-layered or multi-layered structure. The first barrier layer 605 and the second barrier layer 620' may include the same material or different materials.

According to an embodiment, the first barrier layer 605 directly contacts the thin-film encapsulation layer 300 disposed thereunder, such as the second inorganic encapsulation layer 330. The first barrier layer 605 may include the same material as that of the second inorganic encapsulation layer 330 or include a different material from that of the second inorganic encapsulation layer 330. Even if the first barrier layer 605 and the second inorganic encapsulation layer 330 include the same material, such as silicon nitride, a specific composition ratio, such as a content ratio of silicon and nitrogen, may be different, and an interface between the first barrier layer 605 and the second inorganic encapsulation layer 330 may be identified on a cross-sectional image with the naked eye. A thickness of the first barrier layer 605 is less than a thickness of the second inorganic encapsulation layer 330. Alternatively, the thickness of the first barrier layer 605 may be the same as or greater than the thickness of the second inorganic encapsulation layer 330.

According to an embodiment, a thickness of the second barrier layer 620' is greater than a thickness of the first barrier layer 605. Alternatively, the thickness of the second barrier layer 620' may be less than or equal to the thickness of the first barrier layer 605.

According to an embodiment, an additional barrier layer, hereinafter referred to as a third barrier layer 625, is disposed on the second barrier layer 620', and the additional planarization layer 630 is disposed on the third barrier layer 625. The third barrier layer 625 includes an inorganic insulating material. The additional planarization layer 630 includes an organic insulating material.

According to an embodiment, the first barrier layer 605, the second barrier layer 620', the third barrier layer 625, and the additional planarization layer 630 are formed over the entire surface of the substrate 100. For example, each of the first barrier layer 605, the second barrier layer 620', the third barrier layer 625, and the additional planarization layer 630 is integrally formed with the insulating layer included in the input sensing layer 400.

For example, according to an embodiment, the input sensing layer 400 includes the first insulating layer 401, the first conductive layer 410, the second insulating layer 403, the second conductive layer 420, and the third insulating layer 405, and the first insulating layer 401 includes a first sub-insulating layer 401a and a second sub-insulating layer 401b. The first barrier layer 605 is integrally formed with the first sub-insulating layer 401a, the second barrier layer 620' is integrally formed with the second sub-insulating layer 401b, the third barrier layer 625 is integrally formed with the second insulating layer 403, and the additional planarization layer 630 is integrally formed with the third insulating layer 405. In other words, the insulating layers included in the input sensing layer 400 are respectively disposed on and under the planarization layer 610.

According to an embodiment, the scribing or cutting process is performed after the input sensing layer 400 is formed. Therefore, the fourth opening 400H of the input sensing layer 400 is simultaneously formed with the opening 10H of the display panel 10 and has substantially the same shape and the same size as the opening 10H. Like the second edge 610E2 of the planarization layer 610, each of an edge 605E of the first barrier layer 605, an edge 620'E of the second barrier layer 620', an edge 625E of the third barrier layer 625, and an edge 630E of the additional planarization layer 630 that are adjacent to the opening area OA or the opening 10H of the display panel 10 are located on the same vertical line as the edge 100E of the substrate 100 that bounds the first opening 100H of the substrate 100.

Figure 51:
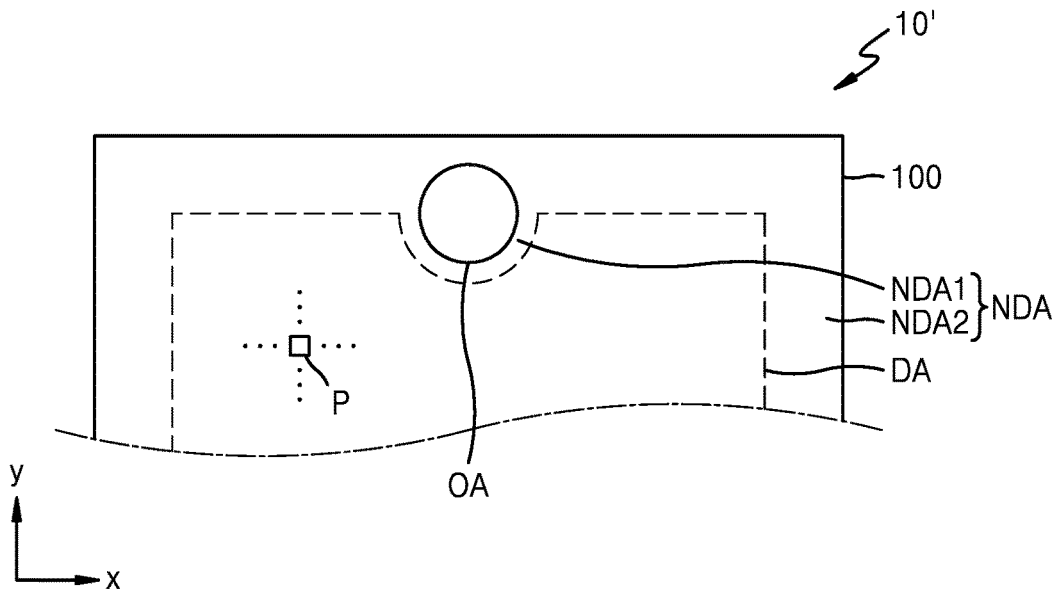
FIG. 51 is a plan view of a display panel according to an embodiment.
Figure 52:
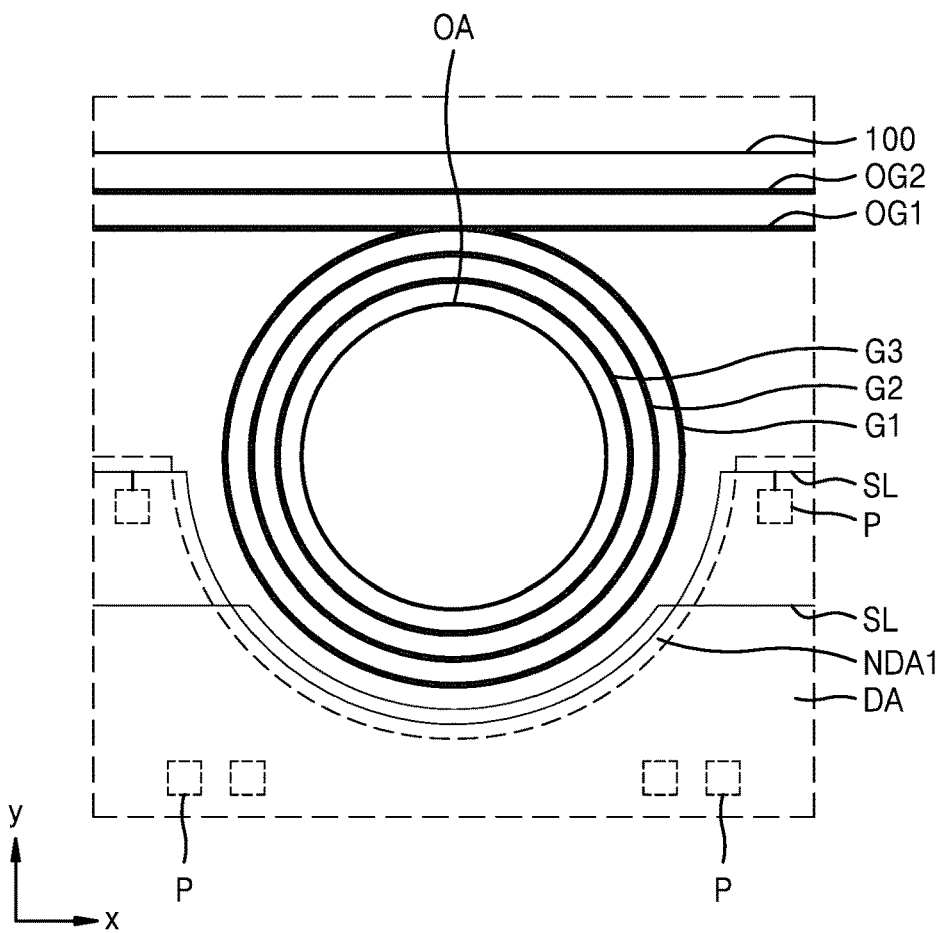
FIG. 52 is an enlarged plan view of an opening area of FIG. 51.

FIG. 51 is a plan view of a display panel according to other embodiments, and FIG. 52 is an enlarged plan view of the opening area OA of FIG. 51.

Referring to FIGS. 51 and 52, according to an embodiment, the opening area OA of the display panel 10' is partially surrounded by the display area DA. Pixels P are horizontally spaced apart around the opening area OA. Scan lines SL that transmit scan signals to pixels P on the left of the opening area OA and pixels P on the right of the opening area OA detour around the opening area OA in the first non-display area NDA1.

According to an embodiment, the opening area OA is surrounded by the first to third grooves G1, G2 and G3, and at least one outer groove is disposed in the second non-display area NDA2. In this regard, FIG. 51 shows that the first and second outer grooves OG1 and OG2 are disposed in the second non-display area NDA2.

According to an embodiment, at least one of the grooves surrounding the opening area OA is connected with an outer groove. As shown in FIG. 52, one of the grooves that surround the opening area OA, such as the first groove G1, is connected with the first outer groove OG1 disposed in the second non-display area NDA2. However, in other embodiments, the grooves that surround the opening area OA are spaced apart from each other without being connected to an outer groove.

According to an embodiment, since the structure of the first non-display area NDA1 is the same as those of embodiments described with reference to FIGS. 7 to 49 and embodiments derived therefrom, a repeated description thereof is omitted.

Figure 53:
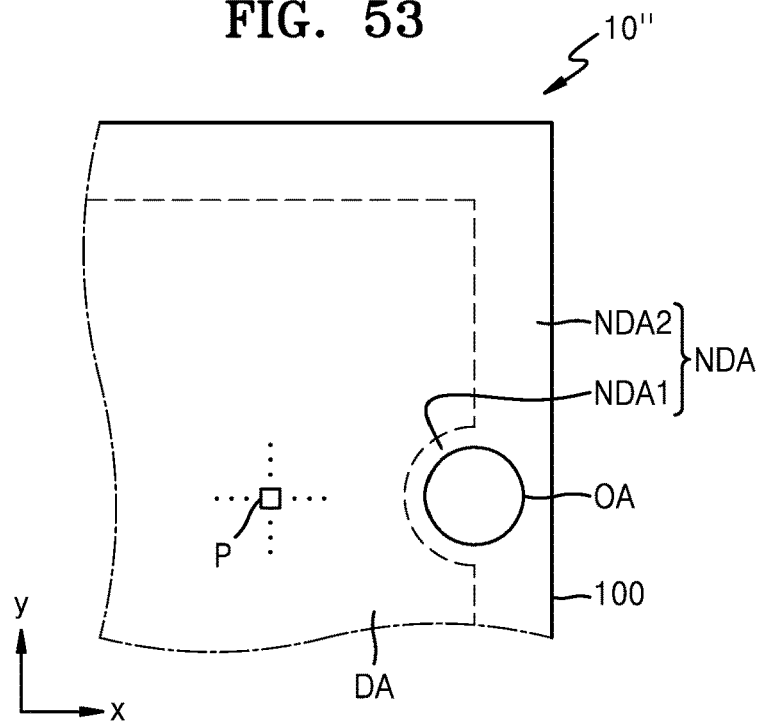
FIG. 53 is a plan view of a display panel according to an embodiment.
Figure 54:
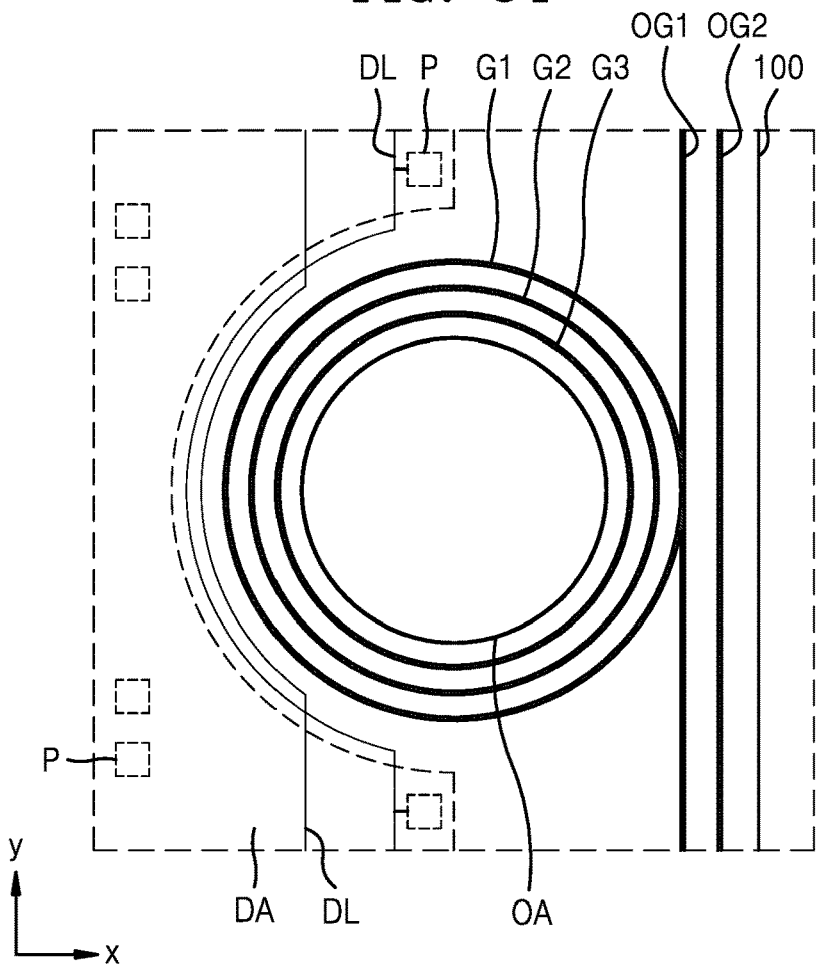
FIG. 54 is an enlarged plan view of an opening area of FIG. 53.

FIG. 53 is a plan view of a display panel according to other embodiments and FIG. 54 is an enlarged plan view of the opening area OA of FIG. 53.

Referring to FIGS. 53 and 54, according to an embodiment, the opening area OA of the display panel 10″ is partially surrounded by the display area DA. Pixels P are vertically spaced apart around the opening area OA. Data lines DL that transmit data signals to pixels P above the opening area OA and pixels P below the opening area OA detour around the opening area OA in the first non-display area NDA1.

According to an embodiment, the opening area OA is surrounded by the first to third grooves G1, G2, and G3, and at least one outer groove is located in the second non-display area NDA2. In this regard, FIG. 53 shows that the first and second outer grooves OG1 and OG2 are disposed in the second non-display area NDA2.

According to an embodiment, at least one of the grooves that surrounds the opening area OA is connected with an outer groove. As shown in FIG. 54, one of the grooves that surrounds the opening area OA, such as the first groove G1, is connected with the first outer groove OG1 disposed in the second non-display area NDA2. However, in other embodiments, the grooves that surround the opening area OA are spaced apart from each other without being connected to the outer an groove.

According to an embodiment, since the structure of the first non-display area NDA1 is the same as those of embodiments described with reference to FIGS. 7 to 49 and embodiments derived therefrom, a repeated description thereof is omitted.

A display device according to embodiments can prevent penetration of moisture, etc., permeating toward a display element by providing a groove in a non-display area, and can prevent or minimize the floating of a layer or the occurrence of cracks around the groove by having insulating layers, such as a portion of an organic encapsulation layer, a planarization layer and/or a lower barrier layer, etc., disposed in the groove. Therefore, damage to a display element due to moisture, etc., that seeps in through a crack can be prevented.

Although embodiments of the disclosure have been described with reference to exemplary embodiments illustrated in the drawings, these are merely provided as examples and it will be understood by those of ordinary skill in the art that various changes in form and details and equivalents thereof may be made therein without departing from the spirit and scope of embodiments of the disclosure as defined by the following claims.

What is claimed is:

1. A display panel, comprising:
   a substrate that includes an opening in an opening area and a display area that surrounds the opening area;
   a display element layer disposed in the display area and that includes a plurality of display elements;
   a thin-film encapsulation layer that covers the display element layer and includes an organic encapsulation layer and an inorganic encapsulation layer;
   a first groove, a second groove, and a third groove disposed in a non-display area between the opening area and the display area, wherein the first, second, and third grooves are spaced apart from each other in the non-display area;
   an input sensing layer disposed in the display area over the thin-film encapsulation layer, wherein the input sensing layer comprises a plurality of touch electrodes that each include a metal mesh pattern, wherein the metal mesh pattern includes a plurality of holes that each correspond to emission areas of the plurality of display elements; and
   a crack detecting wiring disposed in the non-display area and that includes a metal material, wherein, in a plan view, the crack detecting wiring has an open curved shape and a part of the crack detecting wiring extends along a periphery of the opening of the substrate.

2. The display panel of claim 1, wherein a first end portion of the crack detecting; wiring and a second end portion of the crack detecting wiring are spaced apart from each other.

3. The display panel of claim 2, wherein the first end portion of the crack detecting wiring and the second end portion of the crack detecting each extend in a radial direction away from the opening area.

4. The display panel of claim 1, wherein the metal material of the crack detecting wiring is a same as a material of the metal mesh pattern.

5. The display panel of claim 1, wherein each of the first groove, the second groove, and the third groove has an under structure.

6. The display panel of claim 5, wherein each of the first groove, the second groove, and the third groove comprises:
   a pair of tips that each protrude toward each other with a gap therebetween; and
   a recess under the pair of tips, wherein the gap of the pair of tips overlaps the recess, and a width of the gap between the pair of tips is less than a width of an upper portion of the recess.

7. The display panel of claim 6, wherein, a length of each of the pair of tips is from about 1.0 μm to about 1.8 μm.

8. The display panel of claim 6 wherein the display element ayer comprises an organic layer and a cathode electrode layer, and
   each of the organic layer and the cathode electrode layer comprises portions that are separated from each other, wherein one of the portions is disposed in the first groove and another of the portions is disposed over one of the pair of tips.

9. The display panel of claim 1, wherein the inotganic encapsulation layer comprises:
   a first inorganic encapsulation layer under the organic encapsulation layer; and
   a second inorganic encapsulation layer over the organic encapsulation layer, wherein the first inorganic encapsulation layer continuously overlaps bottom surfaces of the pair of tips and an inner surface of the recess.

10. The display panel of claim 9, further comprising:
    a planarization layer over the encapsulation layer in the non-display area, wherein the planarization layer comprises an organic insulating material.

11. The display panel of claim 10, wherein a portion of the planarization layer overlaps the organic encapsulation layer with a portion of the second inorganic encapsulation layer therebetween.

12. The display panel of claim 1, further comprising:
a scan line and a data line, wherein one of the scan line or the data line comprises a bypassing portion that detours around the opening area in the non-display area.

13. The display panel of claim 1, fUrther comprising:
a partition wall disposed in the non-display area, wherein the first groove is disposed between the partition wall and the display area, and the second and third grooves are disposed between the partition wall and the opening area.

14. A display device comprising a display panel, wherein display panel comprises:
a substrate that includes an opening and a display area that surrounds the opening;
a display element layer disposed in the display area and that includes a plurality of display elements;
a thin-film encapsulation layer that covers the display element layer and includes a first inorganic encapsulation layer, a second inorganic encapsulation layer, and an organic encapsulation layer between the first inorganic encapsulation layer and second inorganic encapsulation layer;
a plurality of grooves disposed in a non-display area between the opening and the display area, wherein the plurality of grooves are spaced apart from each other in the non-display area;
an input sensing layer disposed in the display area over the thin-film encapsulation layer, wherein the input sensing layer comprises a plurality of touch electrodes that each include a metal mesh pattern, wherein the metal mesh pattern includes a plurality of holes that respectively correspond to emission areas of the plurality of display elements; and
a crack detecting wiring disposed in the non-display area, wherein the crack detecting wiring has an open curved shape in a plan view, and comprises a metal material.

15. The display device of claim 14, further comprising a component disposed under the display panel and that corresponds to the opening, wherein the component comprises a sensor, a camera, a lamp, microphone, or a speaker.

16. The display device of claim 14, wherein a first end portion of the crack detecting wiring and a second end portion of the crack detecting wiring are spaced apart from each other, and a body portion of the crack detecting wiring between the first and second end portions extends along a periphery of the opening of the substrate in a plan view, and wherein the first end portion of the crack detecting wiring and the second end portion of the crack detecting each extend in a radial direction away from the opening area.

17. The display device of claim 14, wherein the metal material of the crack detecting wiring is a same as a material of the metal mesh pattern.

18. The display device of claim 14, wherein each of the plurality of grooves comprises:
a pair of tips that each protrude toward each other with a gap therebetween; and
a recess under the pair of tips, wherein the gap of the pair of tips overlaps the recess, and a width of the gap between the pair of tips is less than a width of an upper portion of the recess.

19. The display device of claim 18, wherein a length of each of the pair of tips is from about 1.0 μm to about 1.8 μm.

20. The display device of claim 18, wherein the display element layer comprises an organic layer and a cathode electrode layer, and
each of the organic layer and the cathode electrode layer comprises portions that are separated from each other, wherein one of the portions is disposed in a groove that corresponds to the gap and another of the portions is disposed over one of the pair of tips.

21. The display device of claim 14, wherein the first inorganic encapsulation layer continuously overlaps bottom surfaces of the pair of tips and an inner surface of the recess.

22. The display device of claim 14, wherein the display panel further comprises:
a planarization layer over the encapsulation layer in the non-display area, wherein the planarization layer comprises an organic insulating material.

23. The display device of claim 22, wherein a portion of the planarization layer overlaps the organic encapsulation layer with a portion of the second inorganic encapsulation layer therebetween.

24. The display device of claim 14, wherein the display panel further comprises:
a scan line and a data line, wherein one of the scan line or the data line comprises a bypassing portion that detours around the opening area in the non-display area.

25. The display panel of claim 14, further comprising:
a partition wall disposed in the non-display area, wherein one of the plurality of grooves is disposed between the partition wall and the display area, and another of the plurality of grooves is disposed between the partition wall and the opening area.

* * * * *